US012255226B2

(12) United States Patent
Fukae

(10) Patent No.: US 12,255,226 B2
(45) Date of Patent: Mar. 18, 2025

(54) CHIP PARTS

(71) Applicant: ROHM CO., LTD., Kyoto (JP)

(72) Inventor: Keisuke Fukae, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 379 days.

(21) Appl. No.: 17/950,523

(22) Filed: Sep. 22, 2022

(65) Prior Publication Data

US 2023/0100252 A1 Mar. 30, 2023

(30) Foreign Application Priority Data

Sep. 29, 2021 (JP) ................................ 2021-160039

(51) Int. Cl.

| | |
|---|---|
| ***H01L 27/06*** | (2006.01) |
| ***H01L 23/522*** | (2006.01) |
| ***H01L 29/06*** | (2006.01) |
| ***H01L 29/866*** | (2006.01) |
| ***H01L 49/02*** | (2006.01) |

(52) U.S. Cl.
CPC .......... *H01L 28/90* (2013.01); *H01L 27/0676* (2013.01); *H01L 28/86* (2013.01)

(58) Field of Classification Search
CPC ..... H01L 27/0676; H01L 28/86; H01L 28/90; H01L 29/0692; H01L 29/866; H01L 23/5223; H01L 23/5226
See application file for complete search history.

(56) References Cited

U.S. PATENT DOCUMENTS

2009/0244808 A1* 10/2009 Ohtsuka .................. H01G 4/06 361/311
2009/0310278 A1* 12/2009 Tani ...................... H01G 4/005 29/25.42
2010/0127316 A1* 5/2010 Tu .......................... H01L 28/60 257/296
2010/0230787 A1* 9/2010 Guiraud ................. H01L 28/87 257/532
2016/0268273 A1* 9/2016 Nakao ..................... H01L 28/60
2017/0104057 A1* 4/2017 Voiron .................... H01L 28/87
2017/0309404 A1* 10/2017 Watanabe ............. H01G 4/232
2017/0330688 A1* 11/2017 Lim ....................... H01G 4/306

FOREIGN PATENT DOCUMENTS

JP 2017-195322 A 10/2017

* cited by examiner

*Primary Examiner* — Omar F Mojaddedi
(74) *Attorney, Agent, or Firm* — Rabin & Berdo, P.C.

(57) ABSTRACT

The present disclosure provides a chip part. The chip part includes: a substrate, a first external electrode and a second external electrode, a capacitor portion disposed on a first main surface of the substrate, a lower electrode including a drawer portion drawn out to the first main surface, a capacitive film disposed on the lower electrode, an upper electrode disposed on the capacitive film, a first electrode film electrically connecting the first external electrode to the lower electrode, and a second electrode film electrically connecting the second external electrode to the upper electrode. The drawer portion includes a first portion disposed in a region between the first external electrode and the second external electrode, and the first electrode film includes a first lower contact portion connected to the first portion.

20 Claims, 61 Drawing Sheets

1

1

1

1

1

1

1

1

1

1

1

1

1

1

CHIP PARTS

TECHNICAL FIELD

The present disclosure relates to chip parts.

BACKGROUND

Patent document 1 discloses a chip capacitor including a substrate, a first conductive film and a first pad film formed on the substrate, a dielectric layer formed on the first conductive film and the first pad film, and a second conductive film formed on the dielectric film and including a second connection region and a second capacitor forming region. The first conductive film includes a first connection region and a first capacitor forming region. A first external electrode is bonded to the first connection region of the first conductive film, and a second external electrode is bonded to the second connection region of the second conductive film.

PRIOR ART DOCUMENT

Patent Publication

[Patent document 1] Japan Patent Publication No. 2017-195322

SUMMARY

Technical Means for Solving the Problem

A chip part according to an embodiment of the present disclosure includes: a substrate, having a first main surface and a second main surface opposite to the first main surface; a first external electrode and a second external electrode, disposed on the first main surface of the substrate and separated from each other; a capacitor portion, disposed on the first main surface of the substrate when viewed from a plan view and along a normal direction of the first main surface, wherein the capacitor portion includes a plurality of wall portions having a lengthwise direction and separated from each other by a trench formed on the first main surface, and the capacitor portion is disposed at least between the first external electrode and the second external electrode; a frame portion, disposed around the capacitor portion by a portion of the substrate, wherein the frame portion surrounds the capacitor portion; a lower electrode, disposed along top and side surfaces of the plurality of wall portions and including a drawer portion drawn out to the first main surface in the frame portion; a capacitive film, disposed on the lower electrode along the top and side surfaces of the plurality of wall portions; an upper electrode, disposed on the capacitive film; a first electrode film, electrically connecting the first external electrode to the lower electrode; and a second electrode film, electrically connecting the second external electrode to the upper electrode; wherein the drawer portion includes a first portion disposed in a region between the first external electrode and the second external electrode, the first electrode film includes a first lower contact portion connected to the first portion, the plurality of wall portions are formed of a plurality by pillar units, each of the plurality of pillar units includes a central portion and three protruding portions extending from the central portion to three different directions in the plan view, and the plurality of wall portions are formed by connecting the three protruding portions of adjacent pillar units.

BRIEF DESCRIPTION OF THE DRAWINGS

FIG. 11I is a diagram of a next step of FIG. 11H

DETAILED DESCRIPTION OF THE EMBODIMENTS

Details of the embodiments of the present disclosure are given with the accompanying drawings below.

[Appearance of Chip Part 1 (Horizontal)]

Figure 1:
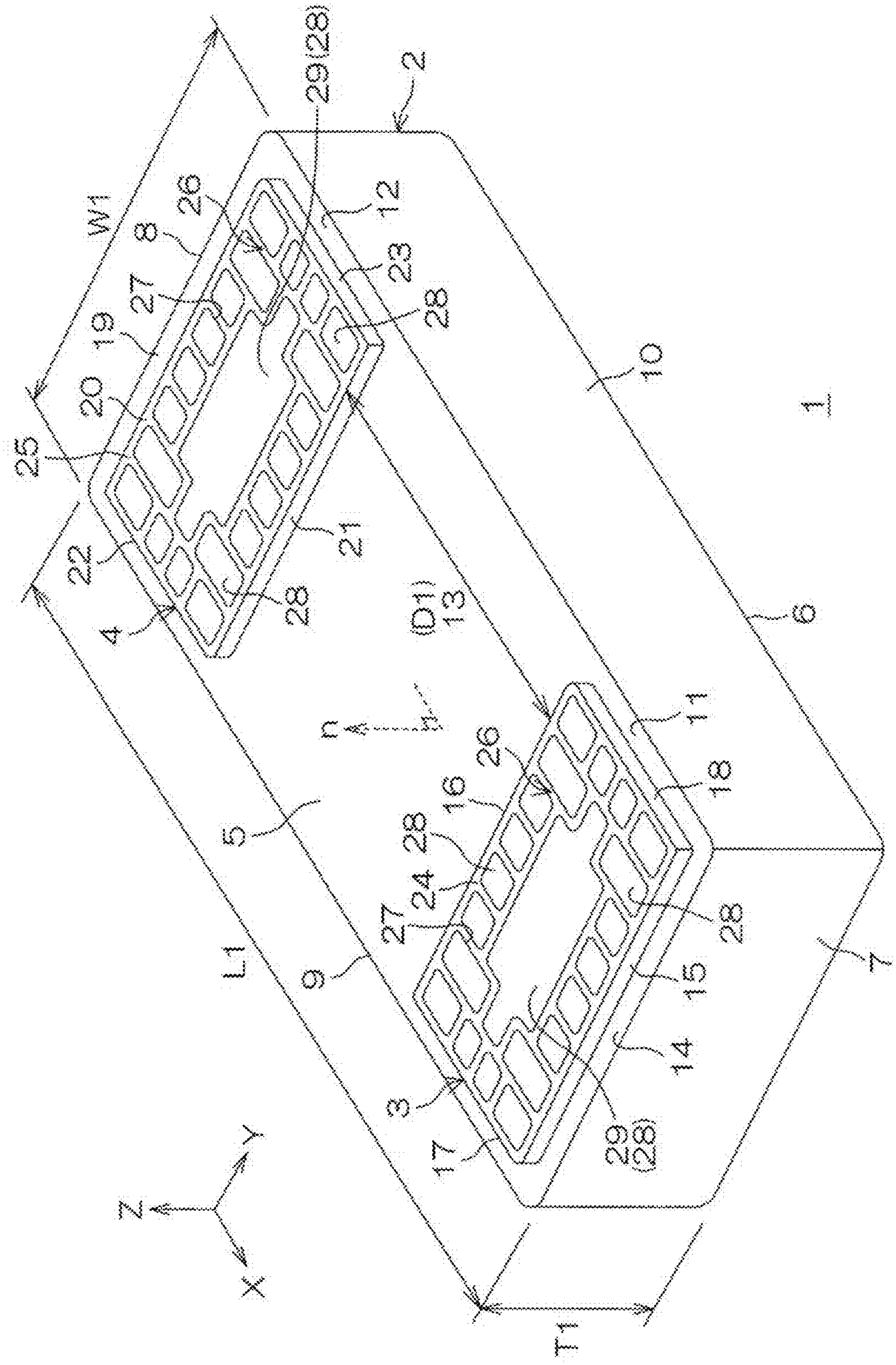
FIG. 1 is a perspective schematic diagram of a chip part according to an embodiment of the present disclosure
Figure 2:
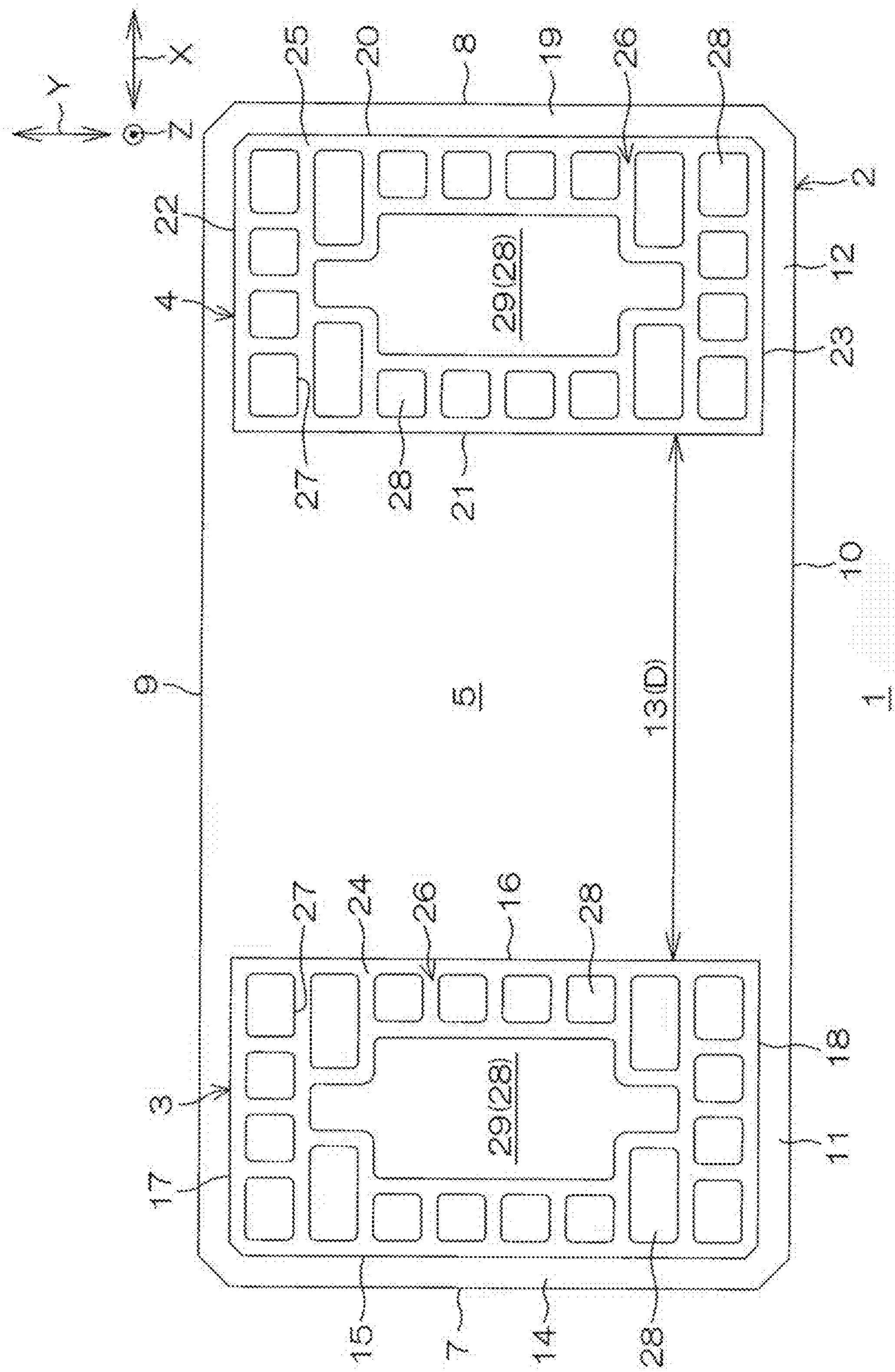
FIG. 2 is a schematic top view of the chip part

FIG. 1 shows a perspective schematic diagram of a chip part 1 according to an embodiment of the present disclosure. FIG. 2 shows a schematic top view of the chip part 1. In FIG. 1 and FIG. 2, the lengthwise direction of the chip part 1 having a cuboid shape is defined as a first direction X, the widthwise direction of the chip part 1 is defined as a second direction Y, and a thickness direction of the chip part 1 is defined as a third direction Z.

The chip part 1 is formed in a cuboid shape, and has a length L1 in the first direction X, a width W1 in the second direction Y and a thickness T1 in the third direction Z. The length L1 may be, for example, 0.4 mm or more and 2 mm or less. The width W1 may be, for example, 0.2 mm or more and 2 mm or less. The thickness T1 may be, for example, 0.1 mm or more and 0.5 mm or less.

The chip part 1 may also be a small-size electronic component using a chip designation (length L1 (mm)× width W1 (mm)), for example, referred to as a 1608 (1.6 mm×0.8 mm) chip, a 1005 (1.0 mm×0.5 mm) chip, 0603 (0.6 mm×0.3 mm) chip, 0402 (0.4 mm×0.2 mm) chip, or 03015 (0.3 mm×0.15 mm) chip.

The chip part 1 includes a substrate 2, a first external electrode 3 and a second external electrode 4.

The substrate 2 forms a base substrate of the chip part 1. The chip part 1 is formed by supporting a plurality of insulating films and metal films layered on each other on the substrate 2. The substrate 2 exhibits a cuboid shape having substantially the same dimensions as the chip part 1. The substrate 2 has a first main surface 5, a second main surface 6 and four side surfaces 7 to 10. The first main surface 5 is the so-called front side of the chip part 1, and the second main surface 6 is the obverse side of the chip part 1. The four side surfaces 7 to 10 surround the first main surface 5 when observed in a plan view and along a normal direction n of the first main surface 5 (to be referred to as the plan view). The four side surfaces 7 to 10 may also include a pair of a first side surface 7 and a second side surface 8 opposite to each other in the first direction X, and a pair of a third side surface 9 and a fourth side surface 10 opposite to each other in the second direction Y. In other words, the side surfaces extending in parallel to each other in the second direction Y may be the first side surface 7 and the second side surface 8, and the side surfaces extending in parallel to each other in the first direction X may be the third side surface 9 and the fourth side surface 10. The first side surface 7, the second side surface 8, the third side surface 9 and the fourth side surface 10 may also be referred to as a first end surface, a second end surface, a third end surface and a fourth end surface, respectively.

The first external electrode 3 and the second external electrode 4 are disposed on the first main surface 5. The first external electrode 3 and the second external electrode 4 are separated from each other in the first direction X. In this embodiment, the first external electrode 3 and the second external electrode 4 form two terminals of the chip part 1, and a current flows horizontally along the first main surface 5 of the substrate 2 between the first external electrode 3 and the second external electrode 4. Thus, the chip part 1 may also be referred to as a horizontal chip part. The horizontal chip part 1 may be, for example, mounted on a substrate by flip chip bonding for use. Moreover, the first external electrode 3 and the second external electrode 4 may also be referred to as a first terminal electrode and a second terminal electrode, respectively, or be referred to as a first external terminal and a second external terminal.

In this embodiment, in the plan view, the first main surface 5 has a first end portion 11 close to the first side surface 7 and a second end portion 12 close to the second side surface 8 in the first direction X. The first external electrode 3 is disposed to cover the first end portion 11, and the second external electrode 4 is disposed to cover the second end portion 12. Between the first external electrode 3 and the second external electrode 4 is an insulative space 13 that exposes an insulative portion on the first main surface 5 of the substrate 2. The insulative space 13 is quadrilateral in the plan view, and is formed from the first external electrode 3 across the entire widthwise direction of the first main surface 5 to the second external electrode 4 in the first direction X. The length of the insulative space 13 in the first direction X (a distance D of the first external electrode 3 and the second external electrode 4) may be, for example, 0.1 mm or more and 0.5 mm or less.

The first external electrode 3 is disposed in a region on the first main surface 5 of the substrate 2 and in a region spaced inward with respect to the four side surfaces 7 to 10. Thus, the first external electrode 3 is surrounded by a first insulative portion 14 of the exposed insulative portion on the first main surface 5 of the substrate 2 in the plan view. The first external electrode 3 forms a rectangle having a lengthwise direction along the direction of the first side surface 7 in the plan view. The first external electrode 3 has a first long side 15 close to the first side surface 7, a second long side 16 on an opposite side, a first short side 17 close to the third side surface 9 and a second short side 18 on an opposite side. The first long side 15, the second long side 16, the first short side 17 and the second short side 18 are sides extending in parallel to and spaced from the first side surface 7, the second side surface 8, the third side surface 9 and the fourth side surface 10 of the substrate 2, respectively. Moreover, the first external electrode 3 may also partially cover the first side surface 7, the third side surface 9 and the fourth side surface 10 of the substrate 2 by overlapping the side surfaces 7, 9 and 10 of the substrate 2.

The second external electrode 4 is disposed in a region on the first main surface 5 of the substrate 2 and in a region spaced inward with respect to the four side surfaces 7 to 10. Thus, the second external electrode 4 is surrounded by a second insulative portion 19 of the exposed insulative portion on the first main surface 5 of the substrate 2 in the plan view. The second external electrode 4 forms a rectangle having a lengthwise direction along the direction of the second side surface 8 in the plan view. The second external electrode 4 has a third long side 20 close to the second side surface 8, a fourth long side 21 on an opposite side, a third short side 22 close to the third side surface 9 and a fourth short side 23 on an opposite side. The third long side 20, the fourth long side 21, the third short side 22 and the fourth short side 23 are sides extending in parallel to and spaced from the second side surface 8, the first side surface 7, the third side surface 9 and the fourth side surface 10 of the substrate 2, respectively. Moreover, the second external electrode 4 may also partially cover the second side surface 8, the third side surface 9 and the fourth side surface 10 of the substrate 2 by overlapping the side surfaces 8, 9 and 10 of the substrate 2.

A concave-convex structure 26 is formed on a front surface (a first electrode surface 24) of the first external electrode 3 and a front surface (a second electrode surface 25) of the second external electrode 4. The concave-convex structure 26 includes recesses 27 recessed toward the first main surface 5, and protruding portions 28 protruding with respect to the recesses 27. The recesses 27 may be grids, a mesh, lines or dots. In this embodiment, the recesses 27 form a mesh.

The protruding portions 28 includes a plurality of protruding portions 28 divided by the recesses 27. The plurality of protruding portions 28 are respectively formed at centers and peripheral portions of the electrode surfaces 24 and 25. Each protruding portion 28 preferably has a flat outer surface. The outer surface of each protruding portion 28 is preferably formed to be parallel to the first main surface 5. The plane shape of each protruding portion 28 is not limited to a specific shape. Each protruding portion 28 may appear as a polygon including a triangle, a quadrilateral, a pentagon or a hexagon in the plan view. Each protruding portion 28 may also appear as a circle or an ellipsoid. In this embodiment, a check protruding portion 29 having larger plane area is formed on each of the electrode surfaces 24 and 25. The check protruding portions 29 are preferably formed at centers of the electrode surfaces 24 and 25. Each check protruding portion 29 at the center has a plane area greater than the plane area of the protruding portion 28 at the periphery portion. The check protruding portions 29 are used as abutting portions for abutting against a front end of a probe during checking of electrical characteristics of the chip part 1. The check protruding portions 29 may also be formed at the peripheral portions of the electrode surface 24 and 25 instead of being formed at the centers of the electrode surfaces 24 and 25.

[Exploded Structure of Chip Part 1]

Figure 3:
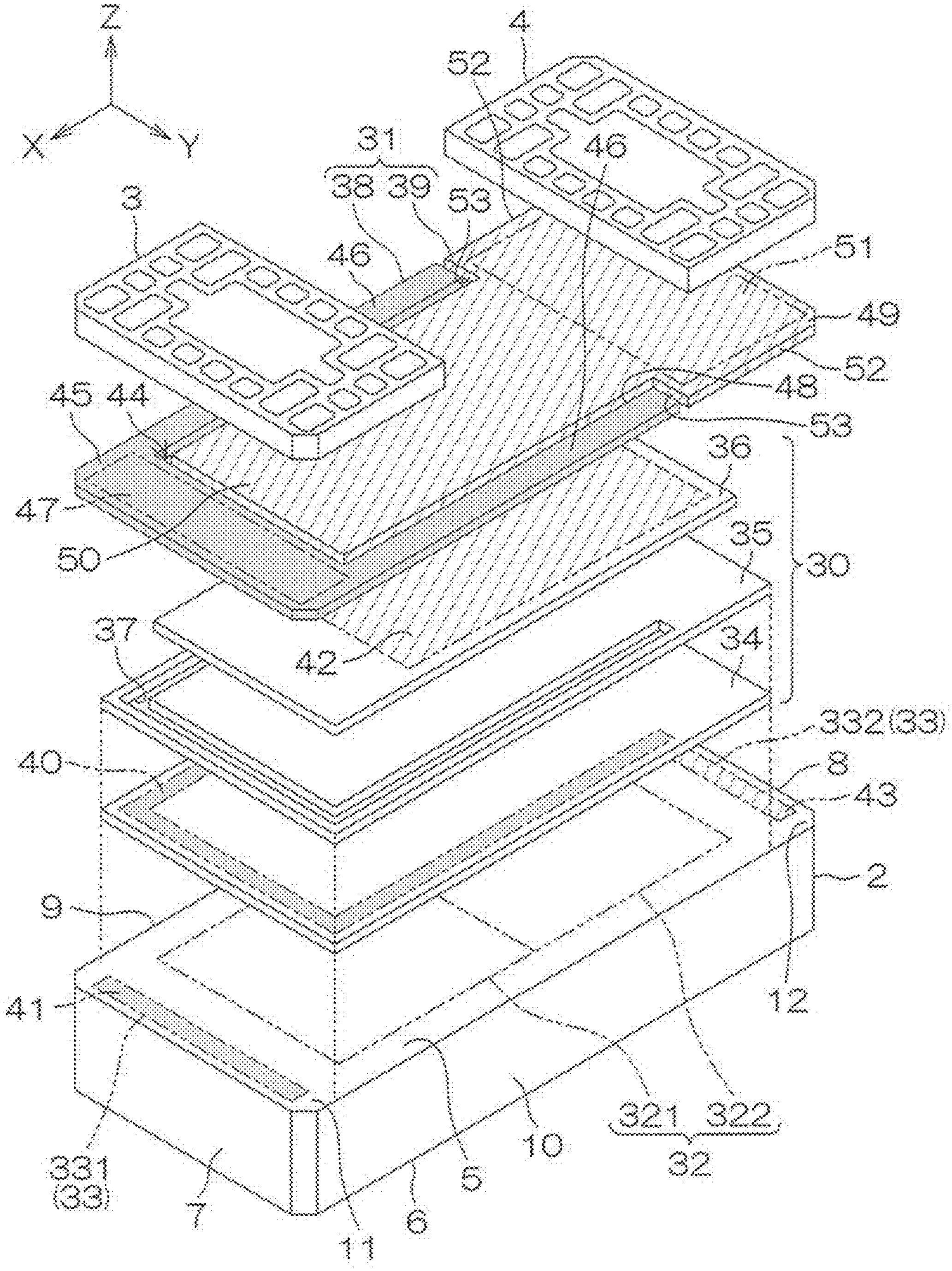
FIG. 3 is an exploded schematic diagram of the chip part

FIG. 3 shows a schematic exploded view of the chip part 1. In FIG. 3, only main elements constituting the chip part 1 are depicted. Thus, the chip part 1 may also include elements other than the constituting elements shown in FIG. 3.

As shown in FIG. 3, the chip part 1 includes the substrate 2, a capacitor structure 30, an electrode film 31, the first external electrode 3 and the second external electrode 4.

The capacitor portion 32 is disposed on the first main surface 5 of the substrate 2. The capacitor portion 32 is a region in which a main portion (a portion with a three-layer structure of electrode-capacitive film-electrode that functions as a passive element) of the capacitor structure 30 is disposed in the substrate 2, and may also be referred to as a capacitor region. In FIG. 3, the capacitor portion 32 is represented as a closed region enclosed by double-dotted lines, and can be clearly distinguished from portions other than the capacitor portion on the first main surface 5. However, the capacitor portion 32 may also be defined as, for example, a portion where the main portion of the capacitor structure 30 is arranged without being clearly defined on the first main surface 5 in the plan view.

The capacitor portion 32 is disposed at substantially the center of the first main surface 5; for example, in a region separated by a distance from the first end portion 11 and the second end portion 12 of the substrate 2 toward an inner side in the first direction X. As shown in FIG. 3, the capacitor portion 32 may also be defined as a rectangular region having a lengthwise direction along the first direction X. The capacitor portion 32 may also include a plurality of capacitor portions 32. The plurality of capacitor portions 32 may also be separated from each other. In this embodiment, the capacitor portion 32 includes a first capacitor portion 321 and a second capacitor portion 322 adjacent to each other in the first direction X.

In addition to the capacitor portion 32, a functional component portion 33 including functional components other than a capacitor is further disposed on the first main surface 5 of the substrate 2. The functional component portion 33 is a region in which functional components such as diodes, resistors and inductors are disposed in the substrate 2, and is also referred to as a functional element region. In this embodiment, the functional component portion 33 is also referred to as a diode portion 33, as a portion primarily including diodes. The functional component portion is described as the diode portion 33 in the description below.

In FIG. 3, the diode portion 33 is represented as a closed region enclosed by double-dotted lines, and can be clearly distinguished from portions other than the diode portion 33 on the first main surface 5. However, the diode portion 33 may also be defined as, for example, a portion where a diode is arranged without being clearly defined on the first main surface 5 in the plan view.

The diode portion 33 is disposed on two end portions of the first main surface 5 to be interposed by the capacitor portion 32 in the plan view. As shown in FIG. 3, the diode portion 33 may be disposed at the first end portion 11 and the second end portion 12 of the substrate 2, or may be disposed at two end portions of the substrate 2 in the second direction Y (end portions respectively close to the third side surface 9 and the fourth side surface 10). As shown in FIG. 3, the diode portion 33 may also be defined as a rectangular region having a lengthwise direction along the second direction Y. The diode portion 33 may also include a plurality of diode portions 33. The plurality of diode portions 33 may also be separated from each other and interposed by the capacitor portion 32. In this embodiment, the diode portion 33 includes a first diode portion 331 (first functional component portion) and a second diode portion 332 (second functional component portion). The first diode portion 331 is disposed in a region between the capacitor portion 32 and the first side surface 7 of the substrate 2. The second diode portion 332 is disposed in a region between the capacitor portion 32 and the second side surface 8 of the substrate 2. The first diode portion 331 and the second diode portion 332 respectively extend along the first side surface 7 and the second side surface 8, and for example, have lengths substantially the same as the length of the capacitor portion 32 in the second direction Y.

The capacitor structure 30 is disposed on the first main surface 5 of the substrate 2 and covers the capacitor portion 32. The capacitor structure 30 includes a lower electrode 34, a capacitive film 35 and an upper electrode 36, and has a structure with the capacitive film 35 sandwiched by the upper electrode 36 and the lower electrode 34 in the up-down direction. The lower electrode 34, the capacitive film 35 and the upper electrode 36 may each be formed as films or plates. The lower electrode 34 and the capacitive film 35 have dimensions (plane size) smaller than those of the substrate 2 and dimensions (plane size) greater than those of the upper electrode 36. A first capacitor contact hole 37 is formed in a peripheral portion of the capacitive film 35 to contact with the lower electrode 34.

The electrode film 31 is disposed on the capacitor structure 30 and covers the capacitor structure 30. The electrode film 31 may be formed as a conductive film. The electrode film 31 includes a first electrode film 38 and a second electrode film 39.

The first electrode film 38 has a contact portion with respect to the lower electrode 34 and the first diode portion 331. The first electrode film 38 electrically connects the first external electrode 3 to the lower electrode 34 and the first diode portion 331. In FIG. 3, a lower contact portion 40 and a first diode contact portion 41 are depicted as the contact portion of the first electrode film 38 with respect to the lower electrode 34 and the first diode portion 331. For clarity, in FIG. 3, the entire first electrode film 38 is shaded in gray, and the lower contact portion 40 and the first diode contact portion 41 as the contact portion of the first electrode film 38 are similarly depicted as regions shaded in gray.

The second electrode film 39 has a contact portion with respect to the upper electrode 36 and the second diode portion 332. The second electrode film 39 electrically connects the second external electrode 4 to the upper electrode 36 and the second diode portion 332. In FIG. 3, an upper contact portion 42 and a second diode contact portion 43 are depicted as the contact portion of the second electrode film 39 with respect to the upper electrode 36 and the second diode portion 332. For clarity, in FIG. 3, the entire second electrode film 39 is shaded by lines, and the upper contact portion 42 and the second diode contact portion 43 as the contact portion of the second electrode film 39 are similarly depicted as regions shaded by lines.

The first electrode film 38 and the second electrode film 39 are formed by, for example, dividing the electrode film 31 having a shape substantially the same as the first main surface 5 of the substrate 2 in the plan view by a partitioning line 44 having a predetermined pattern. Thus, by combining the first electrode film 38 and the second electrode film 39 opposite to each other and separated by the partitioning line 44, the first electrode film 38 and the second electrode film 39 in overall form a substantially rectangle in the plan view.

The first electrode film 38 integrally includes a first base portion 43 and a pair of first extending portions 46.

The first base portion 45 is a portion in the first electrode film 38 connected to the first external electrode 3. In FIG. 3, a first external contact portion 47 (a region surrounded by a double-dotted line) is depicted as the contact portion of the first external electrode 3 with respect to the first electrode film 38. The first base portion 45 forms a substantially rectangle having a lengthwise direction along the second direction Y.

The pair of first extending portions 46 may be branched and extended from the first base portion 45. For example, the pair of first extending portions 46 may respectively extend from one end portion and another end portion of the first base portion 45 in the lengthwise direction along the first direction X (along the third side surface 9 and the fourth side surface 10). The pair of first extending portions 46 may extend from the first base portion 45 toward the same direction in the first direction X, and appear as strip shapes or a rectangles parallel to each other. Accordingly, the first electrode film 38 forms a substantially U shape. In this embodiment, the first base portion 45 and the pair of first extending portions 46 form the lower contact portion 40. Thus, the lower contact portion 40, similar to the first electrode film 38, forms a substantially U shape.

In the first electrode film 38, a region surrounded on three sides by the first base portion 45 and the pair of first extending portions 46 may also be referred to as a receiving region 48 that receives a portion of the second electrode film 39 in the first direction X. Moreover, the first base portion 45 and the first extending portions 46 of the first electrode film 38 may also be represented in serial numbers and be alternatively referred to a first portion and a second portion of the first electrode film 38.

The second electrode film 39 integrally includes a second base portion 43 and a second extending portion 50.

The second base portion 49 is a portion in the second electrode film 39 connected to the second external electrode 4. In FIG. 3, a second external contact portion 51 (a region surrounded by a double-dotted line) is depicted as the contact portion of the second external electrode 4 with respect to the second electrode film 39. The second base portion 49 forms a substantially rectangle having a lengthwise direction along the second direction Y.

The second extending portion 50 has a step 53 with respect to a pair of peripheries 52 of the second base portion 49 in the first direction X, and extends from the second base portion 49 toward the first base portion 45 of the first electrode film 38. One step 53 is formed on each of both sides of the second extending portion 50 in the second direction Y. The second extending portion 50, for example, has a rectangle, and is accommodated in the receiving region 48 with the partitioning line 44 interposed in between. Accordingly, the second extending portion 50 is surrounded by the first base portion 45 and the pair of first extending portions 46 of the first electrode film 38 on three sides. Moreover, the second base portion 49 and the second extending portions 50 of the second electrode film 39 may also be represented in serial numbers and be alternatively referred to a third portion and a fourth portion of the second electrode film 39.

On the other hand, by focusing on one pair of first extending portions 46, one pair of first extending portions 46 extend from the first base portion 45 into one pair of steps 53, and are spaced by the second extending portion 50 in a space in the second direction Y. Front ends of the pair of first extending portions 46 are opposite to the second base portion 49 with the partitioning line 44 interposed in between.

The first external electrode 3 and the second external electrode 4 are disposed on the electrode film 31. The first external electrode 3 has a first external contact portion 47, and is connected to the first electrode film 38 via the first external contact portion 47. The second external electrode 4 has a second external contact portion 51, and is connected to the second electrode film 39 via the second external contact portion 51. [Planar structure of chip part 1]

Figure 4:
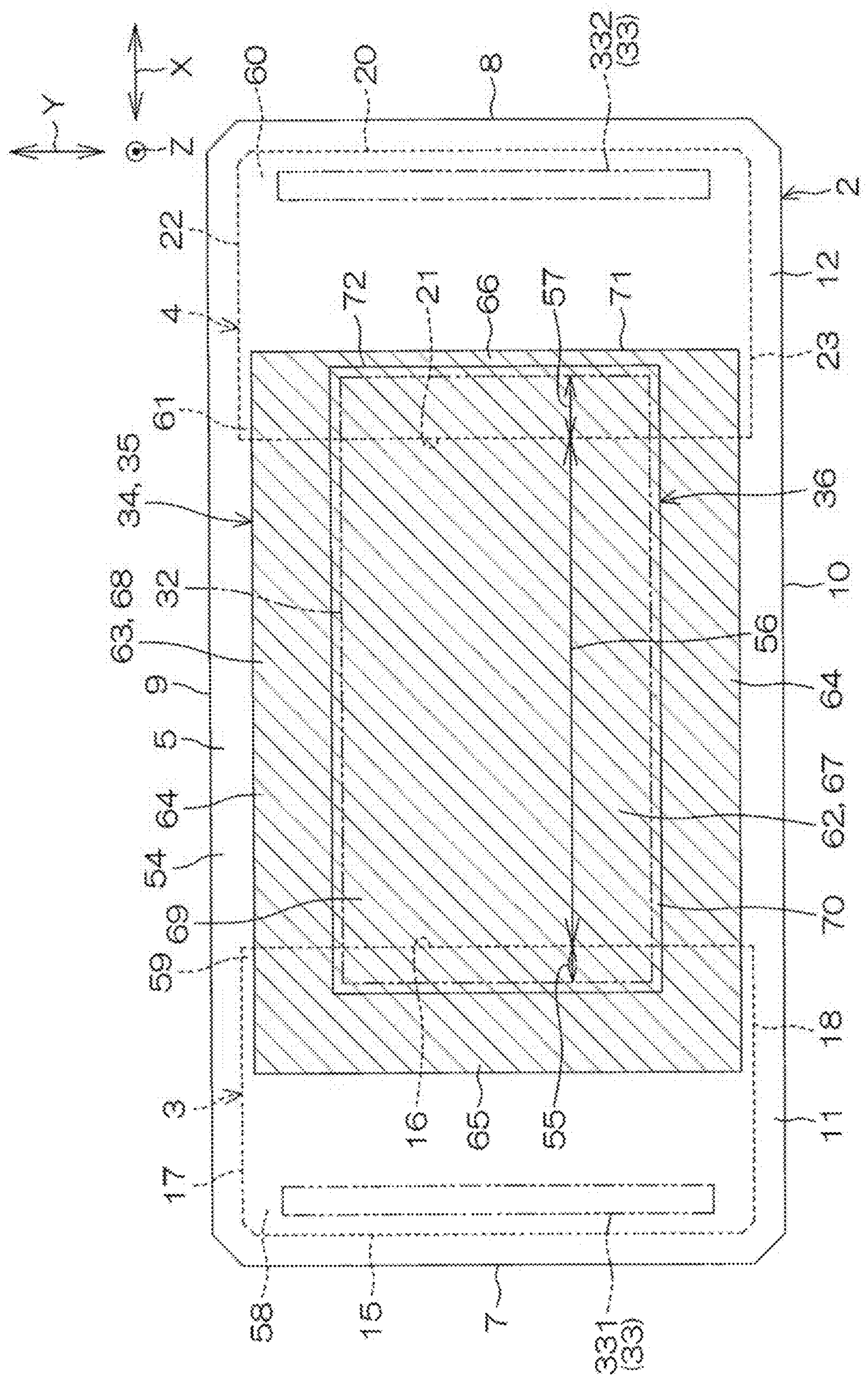
FIG. 4 is a schematic top view of the chip part
Figure 5:
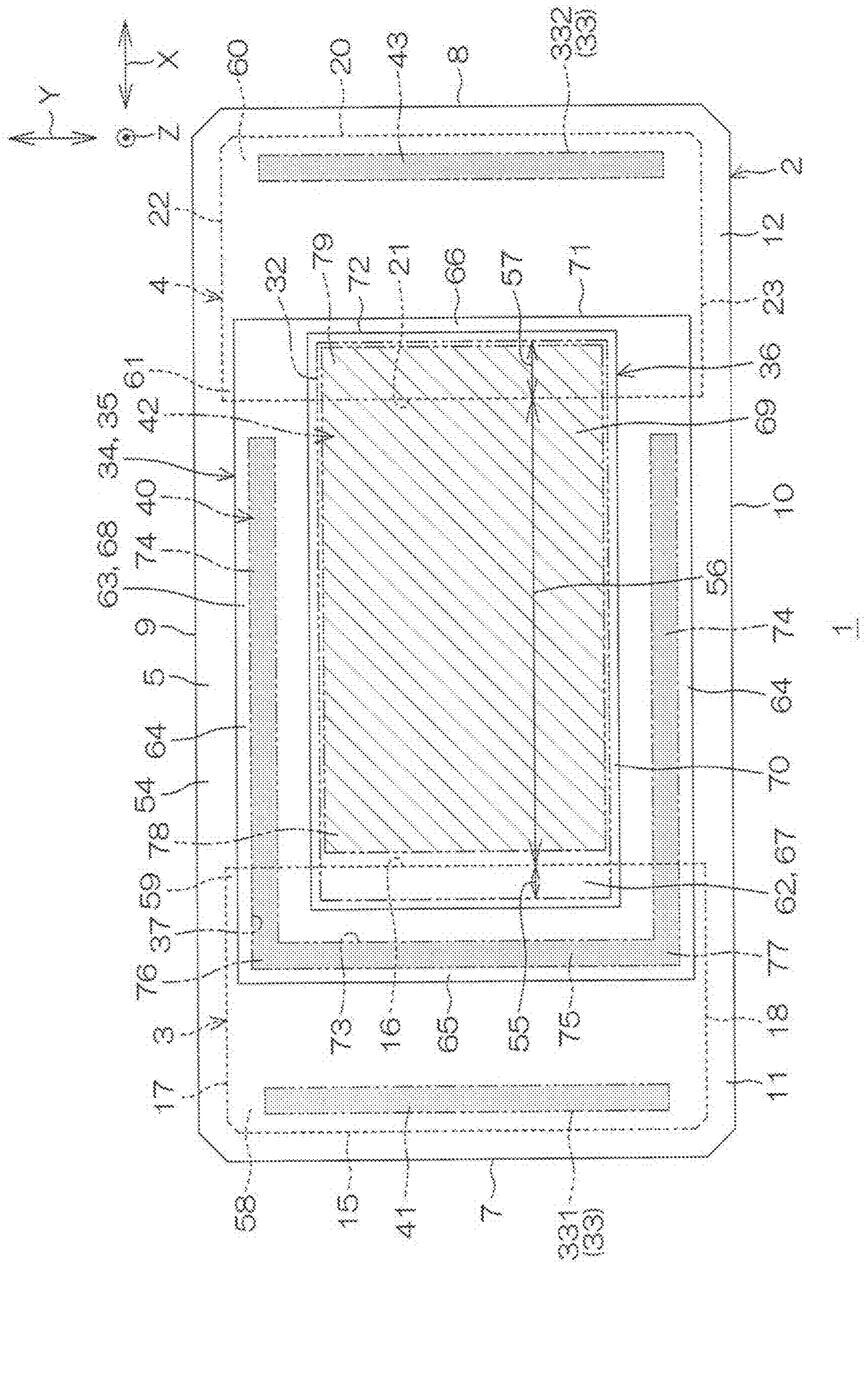
FIG. 5 is a schematic top view of the chip part
Figure 6:
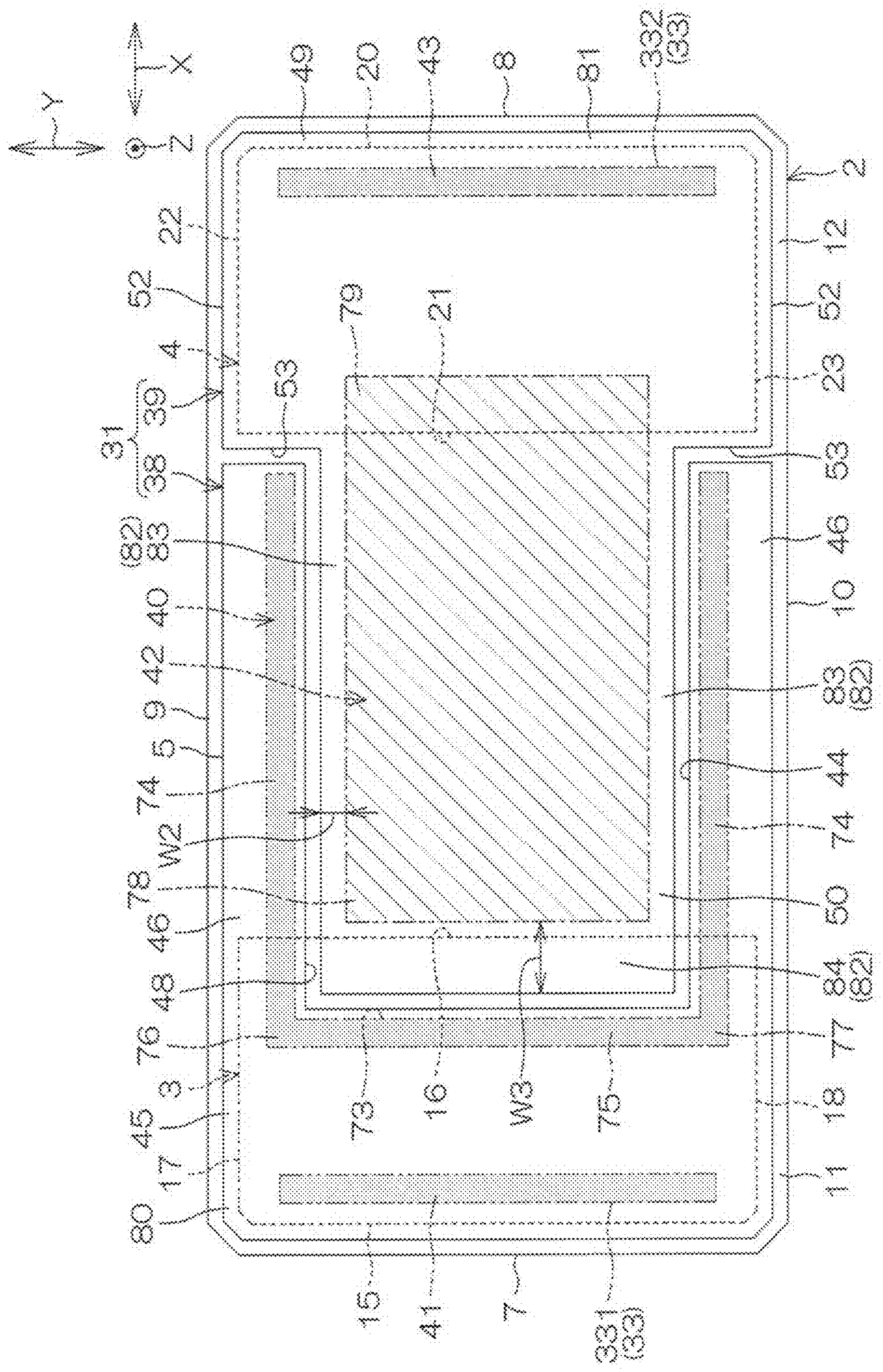
FIG. 6 is a schematic top view of the chip part

Next, referring to FIG. 4 to FIG. 6, planar structures of the substrate 2, the capacitor portion 32, the diode portion 33, the lower electrode 34, the capacitive film 35, the upper electrode 36, the first electrode film 38, the second electrode film 39, the lower contact portion 40, the first diode contact portion 41, the upper contact portion 42, the second diode contact portion 43, the first external electrode 3 and the second external electrode 4 in FIG. 3 are described below. The planar structures of these constituting elements are described by taking into account position relations and overlapping relations thereof in the plan view.

FIG. 4 shows a schematic top view of the chip part 1. First of all, referring to FIG. 4, the planar structures of the lower electrode 34, the capacitive film 35 and the upper electrode 36 are primarily described in detail below. For clarity, in FIG. 4, the first external electrode 3 and the second external electrode 4 are depicted in a perspective manner by dotted lines. Moreover, in FIG. 4, the required constituting elements and the reference symbols and numerals are extracted and shown.

The capacitor portion 32 is disposed at substantially the center of the first main surface 5 of the substrate 2. Portions in the substrate 2 except for the capacitor portion 32 may also be defined as a substrate body portion 54. In this embodiment, the substrate body portion 54 is a portion that is a substantially (enclosed) quadrilateral surrounding the capacitor portion 32 in the plan view. The substrate body portion 54 appears as a frame surrounding the capacitor portion 32, and may also be referred to as a frame portion of the substrate 2.

The capacitor portion 32 includes a first overlapping portion 55 overlapping the first external electrode 3 in the plan view, a second overlapping portion 56 overlapping the second external electrode 4 in the plan view, and a center portion 57 between the first external electrode 3 and the second external electrode 4. For example, when the first external electrode 3 has a first outer peripheral portion 58 along the first long side 15 and a first inner peripheral portion 59 along the second long side 16, the first overlapping portion 55 may also overlap with the first inner peripheral portion 59. The first overlapping portion 55 has an edge in the first direction X below the first inner peripheral portion 59. Thus, the first overlapping portion 55 may be alternatively referred to as a first peripheral portion of the capacitor portion 32 in the first direction X.

For example, when the second external electrode 4 has a second outer peripheral portion 60 along the third long side 20 and a second inner peripheral portion 61 along the fourth long side 21, the second overlapping portion 56 may also overlap with the second inner peripheral portion 61. The second overlapping portion 56 has an edge in the first direction X below the second inner peripheral portion 61. Thus, the second overlapping portion 56 may be alternatively referred to as a second peripheral portion of the capacitor portion 32 in the first direction X.

One diode portion 33 may be disposed on each of the first end portion 11 and the second end portion 12 of the substrate body portion 54. The diode portion 33 may also be disposed on positions away from the capacitor portion 32 in a direction opposite to the first external electrode 3 and the second external electrode 4 (in this embodiment, in the first direction X). More specifically, the first diode portion 331 is disposed overlapping the first outer peripheral portion 58 of the first external electrode 3, and the second diode portion 332 is disposed overlapping the second outer peripheral portion 60 of the second external electrode 4. The first diode portion 331 and the second diode portion 332 respectively form strip shapes extending along the first outer peripheral portion 58 and the second outer peripheral portion 60.

The lower electrode 34 and the capacitive film 35 have the same shape as each other in the plan view. In FIG. 4, a line-shaded rectangular region covering the capacitor portion 32 and including a portion surrounding the capacitor portion 32 is the lower electrode 34 and the capacitive film 35. In FIG. 4, a layered structure of the lower electrode 34 and the capacitive film 35 is represented as one shaded region. Thus, in FIG. 4, a portion represented by combined reference numerals of the constituting elements of the lower electrode 34 and the capacitive film 35 are a portion of the constituting element of the capacitive film 35 on which the constituting element of the lower electrode 34 is layered.

The lower electrode 34 includes a first body portion 62 and a first peripheral portion 63. The first body portion 62 is disposed in the capacitor portion 32. The first peripheral portion 63 is integrally formed with the first body portion 52 on the substrate body portion 54 (the frame of the substrate 2) around the capacitor 32. The first peripheral portion 63 is a portion drawn out around the capacitor portion 32 from the first body portion 62, or may be alternatively referred to as a drawer portion of the lower electrode 34.

The first peripheral portion 63 may also include a plurality of individually defined portions based on a relative position relation with respect to the capacitor portion 32. For example, the first peripheral portion 63 may also include a first portion 64, which is drawn out from the first body portion 62 with respect to the capacitor portion 32 towards both sides in the second direction Y, and is formed in a region between the first external electrode 3 and the second external electrode 4. The first peripheral portion 63 may also include a second portion 65, which is drawn out from the first body portion 62 with respect to the capacitor portion 32 towards the first external electrode 3 in the first direction X, and is formed in a lower region of the first external electrode 3 (a region overlapping the first external electrode 3). The first peripheral portion 63 may also include a third portion 66, which is drawn out from the first body portion 62 with respect to the capacitor portion 32 towards the second external electrode 4 in the first direction X, and is disposed in a lower region of the second external electrode 4 (a region overlapping the second external electrode 4). The capacitor portion 32 is sandwiched between a pair of first portions 64 in the second direction Y, and is sandwiched between the second portion 65 and the third portion 66 in the first direction X. The pair of first portions 64, the second portion 65 and the third portion 66 are continuously with each other along a circumferential direction of the capacitor portion 32. Accordingly, the capacitor portion 32 is enclosed by the first peripheral portion 63 into a closed region.

The capacitive film 35 includes a second body portion 67 and a second peripheral portion 68. The second body portion 67 is formed in the capacitor portion 32. The second peripheral portion 68 is integrally formed with the second body portion 67 on the first peripheral portion 63 around the capacitor portion 32. The second peripheral portion 68 is a portion drawn out around the capacitor portion 32 from the first body portion 67, or may be alternatively referred to as a drawer portion of the capacitive film 35. The second peripheral portion 68 of the capacitive film 35 covers an entirety of the pair of first portions 64, the second portion 65 and the third portion 66 of the first peripheral portion 63 of the lower electrode 34. Thus, the second peripheral portion 68 of the capacitive film 35 may also include a pair of first portions, a second portion and a third portion respectively corresponding to the first pair of first portions 64, the second portion 65 and the third portion 66 of the first peripheral portion 63 of the lower electrode 34. Moreover, the second periphery portion 68 of the capacitive film 35 covers the first peripheral portion 63 of the lower electrode 34 at the periphery of the capacitor portion 32, and thus may also be referred to as a covering portion.

The upper electrode 36 is formed in a shape to cover the capacitor portion 32. In this embodiment, the upper electrode 36 is formed as a rectangle covering an entirety of the capacitor portion 32. The upper electrode 36 integrally includes a body portion 69 and a peripheral portion 70. The body portion 69 may also be a portion opposite to the capacitor portion 32 in the third direction Z.

The peripheral portion 70 may also be a portion drawn out to the periphery of the capacitor portion 32 from the body portion 69 and surrounding the capacitor portion 32. In this embodiment, the first peripheral portion 63 and the second peripheral portion 68 are disposed outside the peripheral portion 70 of the upper electrode 36 in the plan view, and further appear in a shape surrounding the peripheral portion 70. The peripheral portion 70 surrounds the capacitor portion 32. Accordingly, the lower electrode 34 and the capacitive film 35 have a common edge 71 located outside an edge 72 of the upper electrode 36. As shown in FIG. 4, the edge 72 is an outer peripheral of the peripheral portion 70 of the upper electrode 36, and is formed as a quadrilateral loop. The edge 71 is an outer edge of the first peripheral portion 63 of the lower electrode 34 and the second peripheral portion 68 of the capacitive film 35, and is formed as a quadrilateral loop surrounding the edge 72. The edge 71 and the edge 72 may also be respectively referred to as an end surface of the lower electrode 34 (the capacitive film 35) and an end surface of the upper electrode 36.

FIG. 5 shows a schematic top view of the chip part 1. Next, referring to FIG. 5, planar structures of the lower contact portion 40, the first diode contact portion 41, the upper contact portion 42 and the second diode contact portion 43 are described in detail below. For clarity, in FIG. 5, the required constituting elements and the reference symbols and numerals are extracted and shown.

The lower contact portion 40 is a contact portion of the first electrode film 38 with respect to the lower electrode 34, and is disposed at the first peripheral portion 63 of the lower electrode 34. The lower contact portion 40 may be disposed as an open loop that is open on one side of the capacitor portion 32 in the first direction X and closed on another side, and surrounds the capacitor portion 32. Herein, in addition to a shape as a closed loop having an internal closed region that accommodates the entirety of the capacitor portion 32, "the shape surrounding the capacitor portion 32" may also be, as shown in FIG. 5, a shape as a partially opening loop having an accommodating region 73 that accommodates most (for example, more than 50% in terms of area ratio) of the capacitor portion 32. In this embodiment, the lower contact portion 40 is formed as a substantially U shape in which a side on the second external electrode 4 is opened with respect to the capacitor portion 32 in the first direction X. Moreover, when a surrounded object (the capacitor portion 32 in FIG. 5) is a quadrilateral in the plan view, provided that the lower contact portion 40 is disposed in an adjacent manner on at least three surfaces of the target, the lower contact portion 40 may also be defined as surrounding the capacitor portion 32. Such definition is generally applicable to the term "surround" in the present disclosure.

In FIG. 5, the lower contact portion 40 may also include a first lower contact portion 74 and a second lower contact portion 75.

One first lower contact portion 74 is disposed on each of a pair of first portions 64 of the first peripheral portion 63. The pair of first lower contact portions 74 respectively form strip shapes extending in parallel to the third side surface 9 and the fourth side surface 10 of the substrate 2 in the first direction X. The pair of first lower contact portions 74 are spaced by the capacitor portion 32 in the second direction Y.

The second lower contact portion 75 is disposed at the second portion 65 of the first peripheral portion 63 in a lower region of the first external electrode 3. The second lower contact portion 75 forms a strip shape extending in parallel to the first side surface 7 of the substrate 2 in the second direction Y. Moreover, in this embodiment, the pair of first lower contact portions 74 are integrally formed with the second lower contact portion 75, and continuously extend from one end portion 76 and one other end portion 77 in a lengthwise direction of the second lower contact portion 75 toward the second external electrode 4. Accordingly, the lower contact portion 40 in FIG. 5 forms a substantially U shape. As such, the first peripheral portion 63 of the lower electrode 34 is a portion disposed with the lower contact portion 40, and thus may be alternatively referred to as a first contact region (a lower contact region) in the capacitor structure 30. Moreover, the lower contact portion 40 may be alternatively referred to as a first capacitor contact portion connected to the first contact region.

The upper contact portion 42 is a contact portion of the second electrode film 39 with respect to the upper electrode 36, and is disposed at the body portion 69 of the upper electrode 36. As such, the body portion 69 of the upper electrode 36 is a portion disposed with the upper contact portion 42, and thus may be alternatively referred to as a second contact region (an upper contact region) in the capacitor structure 30. Moreover, the upper contact portion 42 may be alternatively referred to as a second capacitor contact portion connected to the second contact region. The upper contact portion 42 is sandwiched between the pair of first lower contact portions 74 in the second direction Y. The upper electrode 42 is formed as a rectangle substantially covering the entirety of the capacitor portion 32. Herein, the expression "substantially covering the entirety of the capacitor portion 32" may referred to, for example, a quadrilateral formed by the upper contact portion 42. The quadrilateral has four sides extending in parallel along four sides of the contact portion 42 that is a quadrilateral in the plan view and has a plane size slightly smaller than that of the capacitor portion 32, and most of the capacitor portion 32 (for example, more than 70% in terms of area ratio) is covered by the upper contact portion 42.

In this embodiment, the upper contact portion 42, similar to the capacitor portion 32, forms a rectangle having a lengthwise direction along the first direction X. The upper contact portion 42 extends across inside and outside the accommodating region 73 of the lower contact portion 40 along the second direction Y. The upper contact portion 42 covers the entirety of the capacitor portion 32 exposed at the center portion 57, and covers the capacitor portion 32 at the second overlapping portion 56. On the other hand, the upper contact portion 42 is disposed to avoid the capacitor portion 32 at the first overlapping portion 55. Accordingly, the upper contact portion 42 is opposite to the second inner peripheral portion 61 of the second external electrode 4 in the third direction Z, and on the other hand, is not opposite to the first external electrode 3. Moreover, the upper contact portion 42 has a first end portion 78 on the side of the first external electrode 3 and a second end portion 79 on the side of the second external electrode 4 in the first direction X. The second end portion 79 overlaps the second external electrode 4. The first end portion 78 of the upper contact portion 42 is disposed on a position on the side of the second external electrode 4 away from the first external electrode 3 in the first direction X.

The first diode contact portion 41 is a contact portion of the first electrode film 38 with respect to the first diode portion 331. The first diode contact portion 41 overlaps the first external electrode 3. The first diode contact portion 41 may also be disposed in a lower region of the first external electrode 3 (in this embodiment, at the first outer peripheral portion 58). The first diode contact portion 41 extends along the first side surface 7 of the substrate 2 in the first direction X, and forms a strip shape parallel to the first side surface 7.

The second diode contact portion 43 is a contact portion of the second electrode film 39 with respect to the second diode portion 332. The second diode contact portion 43 overlaps the second external electrode 4. The second diode contact portion 43 may also be disposed in a lower region of the second external electrode 4 (in this embodiment, at the second outer peripheral portion 60). The second diode contact portion 43 extends along the second side surface 8 of the substrate 2 in the first direction X, and forms a strip shape parallel to the second side surface 8.

FIG. 6 shows a schematic top view of the chip part 1. Next referring to FIG. 6, the planar structures of the first electrode film 38 and the second electrode film 39 are described in detail below. For clarity, in FIG. 6, the required constituting elements and the reference symbols and numerals are extracted and shown.

The first electrode film 38 is formed as an open loop that surrounds the capacitor portion 32 and is partially open on the side of the second external electrode 4. As described above, the first electrode film 38 integrally includes the first base portion 43 and the pair of first extending portions 46.

The first base portion 45 forms a substantially rectangle having a lengthwise direction along the second direction Y, and is disposed below the first external electrode 3. Accordingly, the first base portion 45 overlaps the first external electrode 3. The first base portion 45 includes a first peripheral portion 80, which is disposed outside the first external electrode 3 and surrounds the first external electrode 3 in the plan view. In this embodiment, the first peripheral portion 80 is disposed adjacent to outer sides of the first long side 15, the first short side 17 and the second short side 18 of the first external electrode 3. The first base portion 45 forms the second lower contact portion 75 and the first diode contact portion 41.

The pair of first extending portions 46 extend from the first base portion 45 along the third side surface 9 and the fourth side surface 10 of the substrate 2. The pair of first extending portions 46 form the first lower contact portion 74.

As described above, the second electrode film 39 integrally includes the second base portion 43 and the second extending portion 50.

The second base portion 49 forms a substantially rectangle having a lengthwise direction along the second direction Y, and is disposed below the second external electrode 4. Accordingly, the second base portion 49 overlaps the second external electrode 4. The second base portion 49 includes a second peripheral portion 81, which is disposed outside the second external electrode 4 and surrounds the second external electrode 4 in the plan view. In this embodiment, the second peripheral portion 81 is disposed adjacent to outer sides of the third long side 20, the third short side 22 and the fourth short side 23 of the second external electrode 4. The second base portion 49 forms the second end portion 79 of the upper contact portion 42 and the second diode contact portion 43.

The second extending portion 50 forms a rectangle extending from the second base portion 49 toward the first base portion 45 of the first electrode film 38. The second extending portion 50 forms most of the upper contact portion 42. The second extending portion 50 has a peripheral portion 82, which is disposed outside the upper contact portion 42 and surrounds the upper contact portion 42 in the plan view. The peripheral portion 82 of the second extending portion 50 may also include a pair of first peripheral portions 83 extending along the pair of first lower contact portions 74 in the first direction X, and a second peripheral portion 84 extending along the second lower contact portion 75 in the second direction Y. The first peripheral portion 83 and the second peripheral portion 84 may also be strip shapes respectively having lengthwise directions along the first direction X and the second direction Y. Alternatively, the first peripheral portion 83 is formed in a region between the first external electrode 3 and the second external electrode 4, and the second peripheral portion 84 is formed in a lower region of the first external electrode 3. Accordingly, the second peripheral portion 84 may also overlap the first external electrode 3. Moreover, comparing a width W2 of the first peripheral portion 83 with a width W3 of the second peripheral portion 84, the width W3 may be greater than the width W2.

[Structure of the Capacitor Portion 32]

Figure 7:
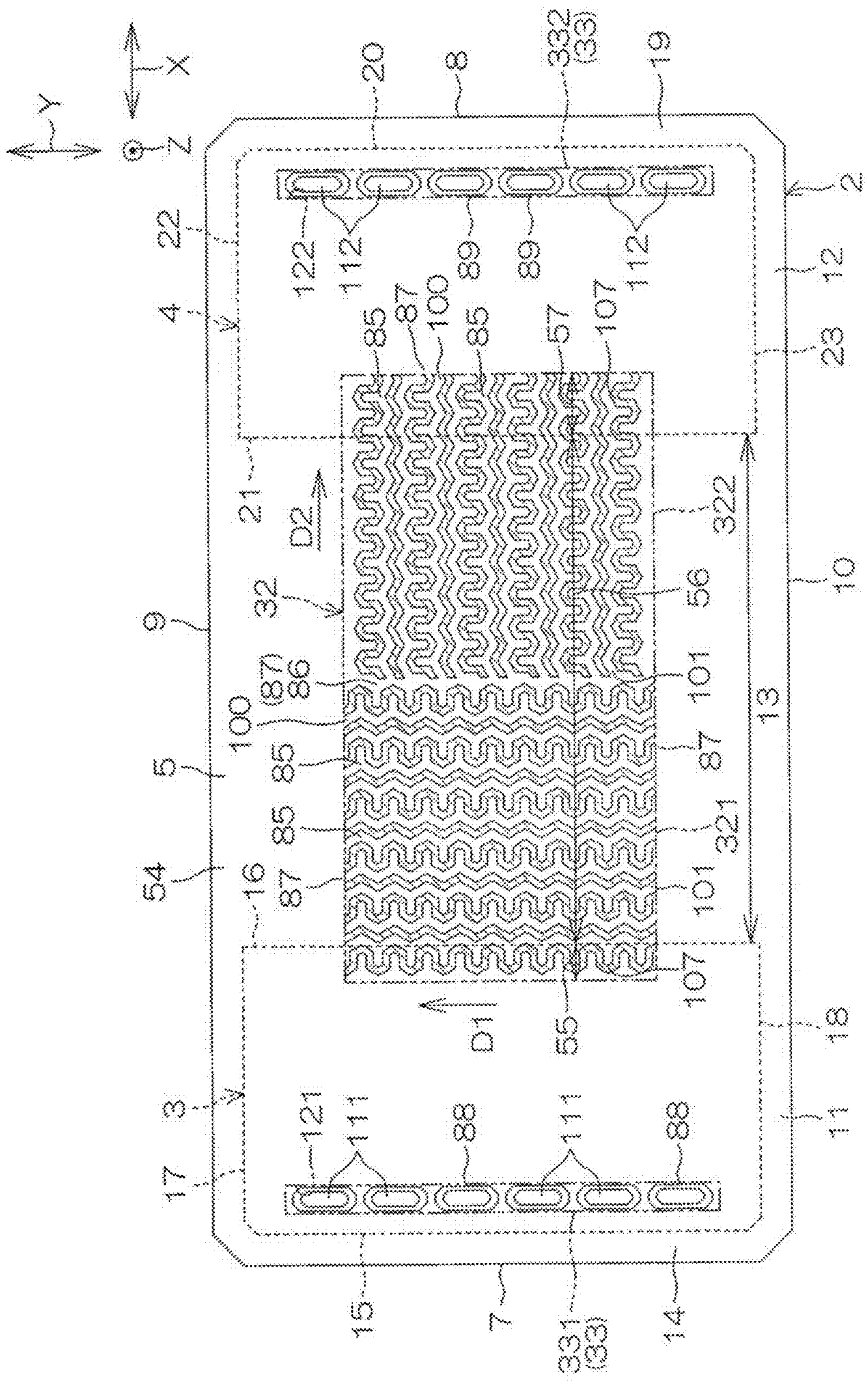
FIG. 7 is a schematic top view of the chip part
Figure 8:
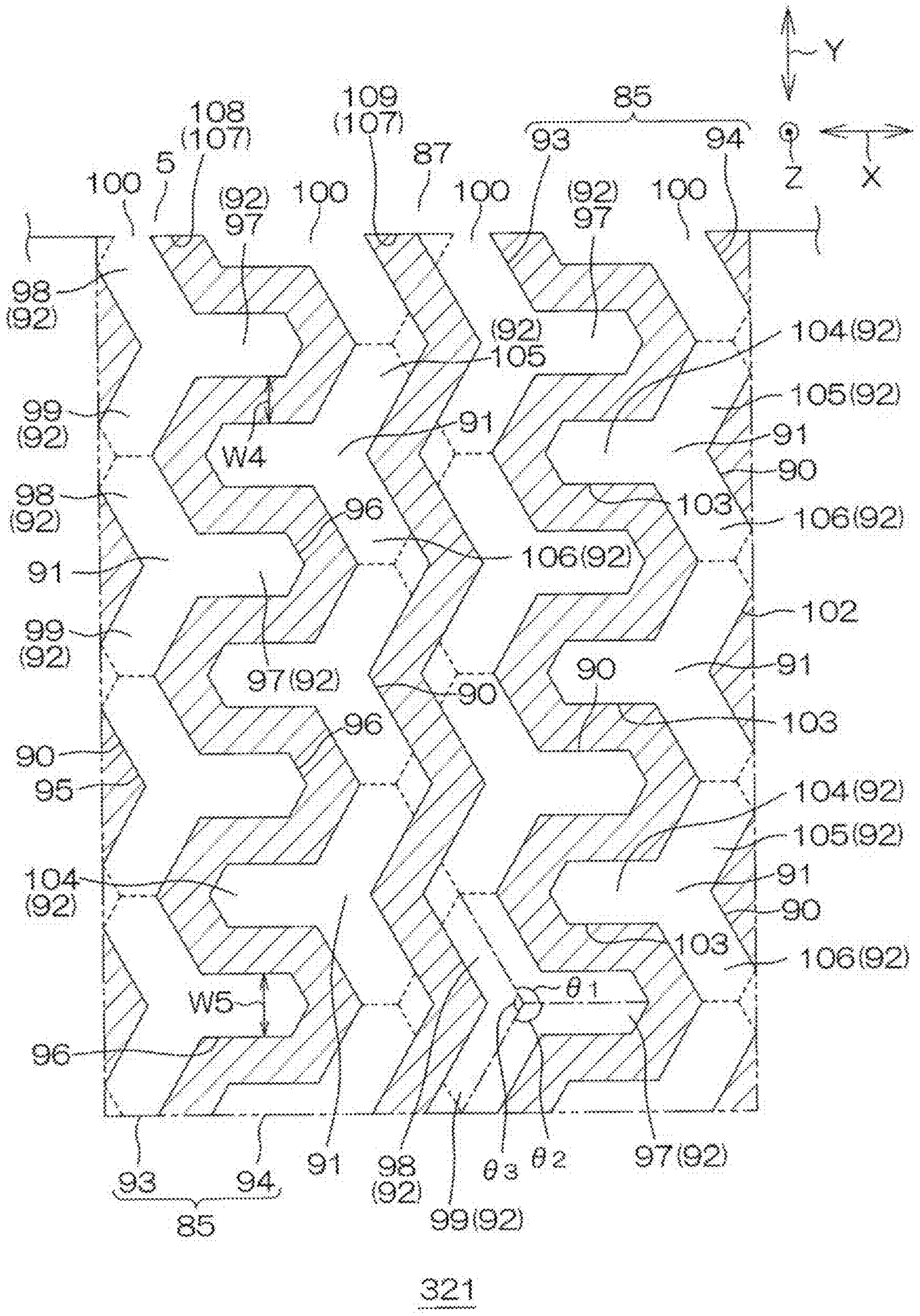
FIG. 8 is an enlarged diagram of a main part of the chip part in FIG. 7
Figure 9:
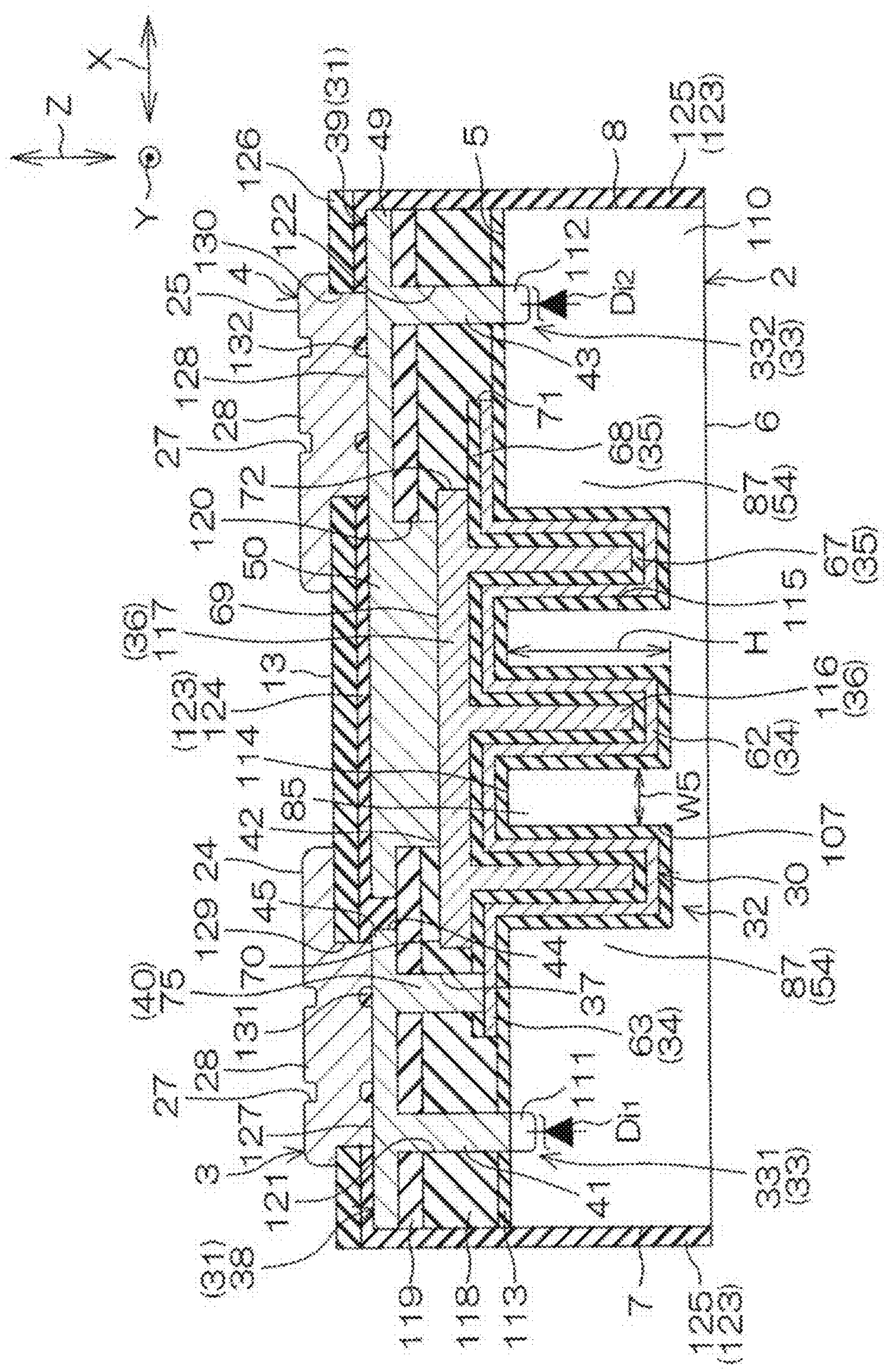
FIG. 9 is a schematic section diagram of the chip part
Figure 10:
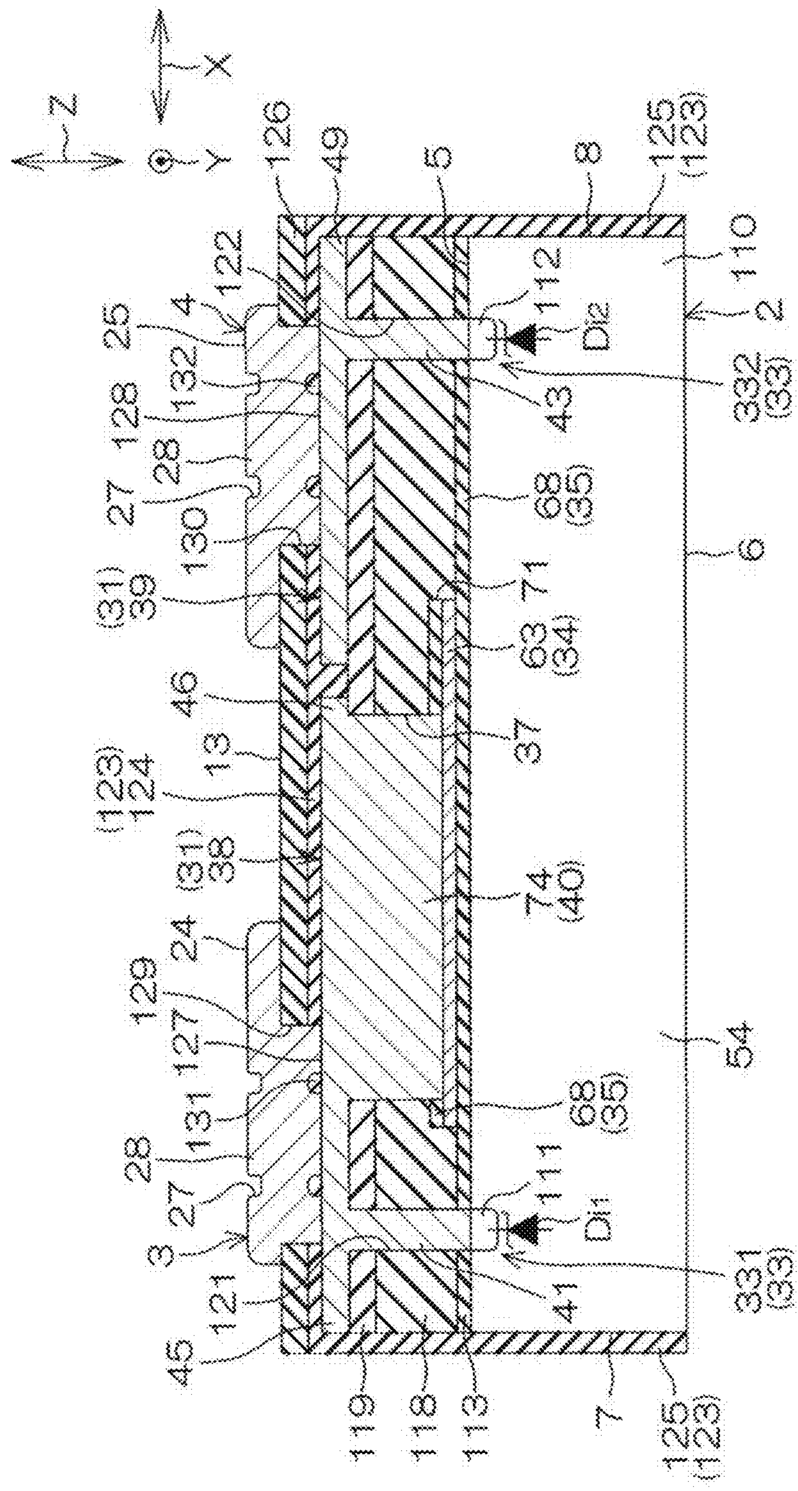
FIG. 10 is a schematic section diagram of the chip part

FIG. 7 shows a schematic top view of the chip part 1. FIG. 8 shows an enlarged diagram of a main part of the chip part 1 in FIG. 7. FIG. 9 and FIG. 10 show schematic section diagrams of the chip part 1. For clarity, in FIG. 7, the trench 107 is shaded by lines, and the first external electrode 3 and the second external electrode 4 are depicted in a perspective manner by dotted lines. Moreover, in FIG. 7, the required constituting elements and the reference symbols and numerals are extracted and shown. Moreover, FIG. 9 and FIG. 10 are schematic diagrams of the layered structure on the first main surface 5 of the chip part 1, but are not cross sections along any specific section line in FIG. 7. However, FIG. 9 is a diagram for illustrating a section structure of the capacitor portion 32 in FIG. 7, and FIG. 10 is a diagram for illustrating a section structure around the capacitor portion 32.

Referring to FIG. 7, the chip part 1 is a composite component that mounts the capacitor portion 32 and the diode portion 33 on the common substrate 2. The substrate 2 may be a semiconductor substrate such as a silicon substrate, or may be an insulative substrate such as a ceramic substrate or a glass substrate. The thickness of the substrate 2 may be, for example, 200 μm or more and 600 μm or less.

In the capacitor portion 32, by selectively removing a portion on the side of the first main surface 5 of the substrate 2, a plurality of wall portions 85 are formed by a portion of the substrate 2. The plurality of wall portions 85 have a lengthwise direction, and form strip shapes in the plan view. The plurality of wall portions 85 are formed across the entirety of the capacitor portion 32. Accordingly, in the plan view, the plurality of wall portions 85 overlap the first external electrode 3 and the second external electrode 4.

In this embodiment, the capacitor portion 32 includes a plurality of capacitor portions in which the lengthwise directions of the wall portions 85 are different. In FIG. 7, the capacitor portion 32 includes a first capacitor portion 321 with the wall portions 85 having a first lengthwise direction D1, and a second capacitor portion 322 with the wall portions 85 having a second lengthwise direction D2. In this embodiment, the first lengthwise direction D1 and the second lengthwise direction D2 are directions orthogonal to each other. The first lengthwise direction D1 may be a direction parallel to the second direction Y, and the second lengthwise direction D2 may be a direction parallel to the first direction X. Moreover, the first lengthwise direction D1 may also be a direction along a pair of side surfaces in one direction of the substrate 2 (in this embodiment, the first side surface 7 and the second side surface 8), and the second lengthwise direction D2 is a direction along a pair of side surfaces in the other direction of the substrate 2 (in this embodiment, the third side surface 9 and the fourth side surface 10).

One of the first capacitor portion 321 and one of the second capacitor portion 322 are disposed adjacent to each other. In this embodiment, the first capacitor portion 321 and the second capacitor portion 322 are disposed adjacent to each other in the first direction X. More specifically, the first capacitor portion 321 is formed crossing the first overlapping portion 55 and the center portion 57, and the second capacitor portion 322 is formed crossing the second overlapping portion 56 and the center portion 57. A border portion 86 between the first capacitor portion 321 and the second capacitor portion 322 is disposed at the center portion 57.

In the first capacitor portion 321, the plurality of wall portions 85 are spaced from each other in a direction intersecting the first lengthwise direction D1. In the second capacitor portion 322, the plurality of wall portions 85 are spaced from each other and arranged in a direction intersecting the second lengthwise direction D2. Accordingly, in each of the first capacitor portion 321 and the second capacitor portion 322, the plurality of wall portions 85 form strip shapes in the plan view.

As described above, the substrate body portion 54 surrounds the capacitor portion 32. The substrate body portion 54 may also individually surround the first capacitor portion 321 and the second capacitor portion 322. Thus, the substrate body portion 54 may also include the border portion 86 between the first capacitor portion 321 and the second capacitor portion 322. The substrate body portion 54 including the border portion 86 is connected to one end portion 100 and the other end portion 101 of each of the wall portions 85 in the lengthwise directions D1 and D2. Accordingly, the wall portions 85 are supported by two sides of the substrate body portion 54. In the substrate body portion 54, a portion near a connection portion with the wall portions 85 may also be defined as a support portion 87.

The first diode portion 331 includes a plurality of first diodes 88. The plurality of first diodes 88 are spaced and arranged in one row along the first side surface 7 of the substrate 2. The second diode portion 332 includes a plurality of second diodes 89. The plurality of second diodes 89 are spaced and arranged in one row along the second side surface 8 of the substrate 2.

Next referring to FIG. 8 to FIG. 10, structures of the wall portions 85, the first diodes 88 and the second diodes 89, and a section structure of the chip part 1 are specifically described below. In addition, the structure of the first capacitor portion 321 is described with reference to FIG. 8, and apart from the different lengthwise direction of the wall portions 85, the structure of the first capacitor portion 321 is applicable to the structure of the second capacitor portion 322.

Referring to FIG. 8, the wall portions 85 are formed by a plurality of pillar units 90. Herein, the expression "the wall portions 85 are formed by a plurality of pillar units 90) may refer to, for example, line-shaped wall portions 85 are formed by connecting pillar objects (in this embodiment, the pillar units 90) in the same shape as each other in the plan view. In other words, the wall portions 85 themselves are not pillar-shaped, but as shown by the dotted lines in FIG. 8, the wall portions 85 may be divided by imaginary lines into the pillar units 90 identical to each other. Thus, the base material (in this embodiment, the semiconductor portion) of the substrate 2 is continuous at a border portion between protruding portions 92 of adjacent pillar units 90. Accordingly, the adjacent protruding portions 92 are integrally connected to each other by the base material of the substrate 2.

Each of the plurality of pillar units 90 includes the central portion 91, and three protruding portions 92 extending from the central portion 91 to three different directions in the plan view. The wall portions 85 are formed by connecting the protruding portions 92 of the adjacent pillar units 90. More specifically, in each pillar unit 90, angles $\theta_1$, $\theta_2$ and $\theta_3$ which are 120° are formed between each protruding portion 92 and the adjacent protruding portions 92, and the adjacent protruding portions 92 cross at the central portion 91.

Moreover, in this embodiment, the angles $\theta_1$, $\theta_2$ and $\theta_3$ are equal to each other and are 120°; however, these angles may also be different from each other. For example, the angle $\theta_3$ between a second protruding portion 98 and a third protruding portion 99 below is 160°, and the angle $\theta_1$ between a first protruding portion 97 and the second protruding portion 98 and the angle $\theta_2$ between the first protruding portion 97 and the third protruding portion 99 are both 100°.

In addition, in this embodiment, one pair of adjacent wall portions 85 among the plurality of wall portions 85 may also be referred to as a first wall portion 93 and a second wall portion 94.

The first wall portion 93 includes a first main portion 95 extending in the second direction Y and connected to the support portion 87, and a first branch portion 96 extending in the first direction X and arranged in a comb shape in the second direction Y. Each first branch portion 96 is formed by the first protruding portion 97 of the protruding portion 92 of each pillar unit 90 of the first wall portion 93.

On the other hand, each protruding portion 92 of each pillar unit 90 of the first wall portion 93 includes the second protruding portion 98 and the third protruding portion 99 in addition to the first protruding portion 97. The first main portion 95 is formed by connecting the second protruding portion 98 and the third protruding portion 99 of the adjacent pillar units 90. That is to say, in this embodiment, the second protruding portion 98 and the third protruding portion 99 are alternately arranged in the second direction Y, and in overall forms the first main portion 95 appearing corrugated (zigzagged) in the plan view.

The protruding portion 92 forming the one end portion 100 and the other end portion 101 (not shown in FIG. 8) of the first main portion 95 is connected to the support portion 87. More specifically, the base material portion (in this embodiment, the semiconductor portion) of the substrate 2 is continuous at a border portion between the support portion 87 and the first main portion 95. Accordingly, the support portion 87 and the first main portion 95 are integrally connected by the base material portion of the substrate The second wall portion 94 includes a second main portion 102 extending in the second direction Y and connected to the support portion 87, and a comb-like second branch portion 103 extending toward the first main portion 95 and engaged with the comb-like first branch portion 96. Each second branch portion 103 is formed by a fourth protruding portion 104 of the protruding portion 92 of each pillar unit 90 of the second wall portion 94.

On the other hand, each protruding portion 92 of each pillar unit 90 of the second wall portion 94 includes a fifth protruding portion 105 and a sixth protruding portion 106 in addition to the fourth protruding portion 104. The second main portion 102 is formed by connecting the fifth protruding portion 105 and the sixth protruding portion 106 of the adjacent pillar units 90. That is to say, in this embodiment, the fifth protruding portion 105 and the sixth protruding portion 106 are alternately arranged in the second direction Y, and in overall forms the second main portion 102 appearing corrugated (zigzagged) in the plan view.

The protruding portion 92 forming the one end portion 100 and the other end portion 101 (not shown in FIG. 8) of the second main portion 102 is connected to the support portion 87. More specifically, the base material portion (in this embodiment, the semiconductor portion) of the substrate 2 is continuous at a border portion between the support portion 87 and the second main portion 102. Accordingly, the support portion 87 and the second main portion 102 are integrally connected by the base material portion of the substrate 2.

Further, in this embodiment, one pair of wall portions 85 including the first wall portion 93 and the second wall portion 94 in comb-like engagement are sequentially formed in the first direction X. That is to say, the first wall portions 93 and the second wall portions 94 are alternately arranged in the first direction X. The trench 107 is formed between the first wall portion 93 and the second wall portion 94. The trench 107 is a portion obtained after removing the base material of the substrate 2, and is a portion surrounded by the wall portions 85 and the support portions 87. A width W4 of the trench 107 may be, for example, 2 μm or more and 8 μm or less.

In this embodiment, the trench 107 may also include a first trench 108 and a second trench 109. The first trench 108 may be formed between the first wall portion 93 and the second wall portion 94 in comb-like engagement, and is formed as a curved shape. The second trench 109 may be formed between the first wall portion 93 and the second wall portion 94 which face each other with the surfaces on the opposite side of comb teeth interposed in between, and are formed as corrugated (zigzagged).

In addition, in this embodiment, as shown in FIG. 9, a ratio (W5/H) of a width W5 of the protruding portion 92 of the pillar unit 90 to a height H (the depth of the trench 107) of the wall portion 85 may be 2/50 or more and 2/100 or less. The width W5 of the protruding portion 92 (as shown in FIG. 8) may be defined as a width of each protruding portion 92 in a direction orthogonal to an extending direction from the central portion 91. More specifically, the width W5 of the protruding portion 92 of the pillar unit 90 may be, for example, 2 μm or more and 8 μm or less. On the other hand, the height H of the wall portion 85 may be, for example, 50 μm or more and 400 μm or less.

Referring to FIG. 9 and FIG. 10, in the substrate 2, a p-type base region 110 is formed in an exposed manner from the first main surface 5 of the substrate 2. In this embodiment, a p-type impurity is introduced into the entire thickness direction of the substrate 2 from the first main surface 5 to the second main surface 6 of the substrate 2. Accordingly, the following form is set, that is, the base region 110 is formed in the entire region of the substrate 2, and the substrate 2 may be regarded as a p-type substrate. The specific resistance of the substrate 2 can also be set to about 5 mΩ·cm by introducing the p-type impurity. The base region 110 is not selectively formed at the diode portion 33, but is formed on the entire substrate 2 including the capacitor portion 32. Thus, the wall portions 85 of the capacitor portion 32 and the substrate body portion 54 are formed by the p-type base region 110.

Referring to FIG. 7 to FIG. 9, a plurality of (six in FIG. 7) first impurity regions 111 are formed on a portion of the surface of the base region 110 in the first diode portion 331. The first impurity regions 111 are n-type impurity regions. The plurality of first impurity regions 111 are spaced and arranged in the second direction Y (along the direction of the first side surface 7 of the substrate 2), as shown in FIG. 7. A plurality of (six in FIG. 7) second impurity regions 112 are formed on a portion of the surface of the base region 110 in the second diode portion 332. The second impurity regions 112 are n-type impurity regions. The plurality of second impurity regions 112 are spaced and arranged in the second direction Y (along the direction of the second side surface 8 of the substrate 2), as shown in FIG. 7.

The first impurity regions 111 and the second impurity regions 112 may also be formed to have the same depth and the same n-type impurity concentration. The n-type impurity concentration of the first impurity regions 111 and the second impurity regions 112 may be $1.0\times10^{19}$ $cm^{-3}$ or more, and $1.0\times10^{21}$ $cm^{-3}$ or less. The first impurity regions 111 and the second impurity regions 112 are formed in the same shape and the same area in the plan view in FIG. 7. The first impurity regions 111 and the second impurity regions 112 extend in the second direction Y in the plan view, and form a rectangle with four corners removed (a rectangle with rounded corners).

A pn junction is formed between the first impurity region 111 and the base region 110. A first Zener diode $Di_1$ (the first diode 88) is formed by the pn junction between the first impurity region 111 and the base region 110. On the other hand, a pn junction is formed between the second impurity region 112 and the base region 110. A second Zener diode $Di_2$ (the second diode 89) is formed by the pn junction between the second impurity region 112 and the base region 110. The first Zener diode $Di_1$ and the second Zener diode $Di_2$ are connected in reverse series via the base region 110. The first impurity regions 111 and the second impurity regions 112 are formed in a manner of respectively overlapping the first external electrode 3 and the second external electrode 4 in the plan view below the first external electrode 3 and the second external electrode 4. Accordingly, a depletion layer extending from the pn junctions between the first impurity regions 11 and the base region 110 does not overlap a depletion layer extending from the pn junctions between the second impurity regions 112 and the base region 110. Thus, a bidirectional Zener diode including the first Zener diode $Di_1$ and the second Zener diode $Di_2$ is formed in the substrate 2.

Referring to FIG. 9 and FIG. 10, on the first main surface 5 of the substrate 2, an insulating film 113 is formed covering the entire region of the first main surface 5 of the substrate 2. In addition to being formed on the first main surface 5 that is a flat surface of the substrate 2, the insulting film 113 is also formed on the entire surface (the upper surfaces 114 and the side surface 115) of the wall portions 85. The insulating film 113 has an end surface consistent with the side surfaces 7 to 10 of the substrate 2. The insulating layer 113 may be a silicon dioxide ($SiO_2$) film or a silicon nitride (SiN) film. The thickness of the insulating layer 113 may be, for example, between 20000 angstroms (Å) and 40000 Å (between 2 micrometers (μm) and 4 μm).

In the capacitor portion 32, the capacitor structure 30 is formed on the insulating film 113. The capacitor structure 30 is formed by imitating the upper surfaces 114 and the side surfaces 115 of the wall portions 85. In other words, the capacitor structure 30 at least has the lower electrode 34 having consistent concave and convex shapes as the wall portions 85 in the latitudinal direction and the lengthwise direction, respectively. In this embodiment, the lower electrode 34 is formed on the insulating film 113, and is formed as an electrode film, which has one surface joined with the upper surfaces 114 and the side surfaces 115 of the wall portions 85, and another surface equally distanced from the upper surfaces 114 and the side surfaces 115 of the wall portions 85. In other words, the lower electrode 34 has a fixed thickness along the upper surfaces 114 and the side surfaces 115 of the wall portions 85.

The capacitive film 35 is formed on the lower electrode 34, and the upper electrode 36 is formed on the capacitive film 35. The first body portion 62 of the lower electrode 34 is opposite to the upper surfaces 114 and the side surfaces 115 of the wall portions 85, and includes an opposite electrode with respect to the upper electrode 36. The first peripheral portion 63 of the lower electrode 34 is drawn out onto the first main surface 5 of the substrate 2 from the first body portion 62, and includes a contact portion with respect to the first external electrode 3. Moreover, the lower electrode 34 may be made of, for example, a semiconductor material such as polysilicon, or a metal material including Cu or Al. If the lower electrode 34 is made of a metal material, for example, Cu, Al, AlSi or AlCu may be included. Moreover, the thickness of the lower electrode 34 may be 1000 Å or more and 3000 Å or less (100 nm or more and 300 nm or less).

The capacitive film 35 is formed by imitating the shape of the lower electrode 34, and has consistent concave and convex shapes as the wall portions 85 in the latitudinal direction and the lengthwise direction, respectively. The capacitive film 35 includes the second body portion 67 covering the first body portion 62 of the lower electrode 34, and the second peripheral portion 68 covering the first peripheral portion 63 of the first lower electrode 34. The first peripheral portion 63 and the second peripheral portion 68 have the common edge 71. Moreover, the capacitive film 35 may be a $SiO_2$ film or a silicon nitride (SiN) film, and a layered film of the above. For example, the capacitive film 35 may also be a $SiO_2$/SiN layered film, or a $SiO_2$/SiN/$SiO_2$ layered film. Moreover, the capacitive film 35 may also be an oxide-nitride (ON) film, or an oxide-nitride-oxide (ONO) film, or may be a layered film of the above. Further, the capacitive film 35 may also be an insulating film including a high dielectric material (high-k material). A high dielectric material, in addition to aluminum oxide ($Al_2O_3$), tantalum pentoxide ($Ta_2O_5$), titanium pentoxide ($Ti_3O_5$) and hafnium oxide ($HfM_2$), the high dielectric material may further include, for example, perovskite compounds such as strontium titanate ($SrTiO_3$) and barium strontium titanate ($(Ba_xSr_{1-x})$ $TiO_3$. Moreover, the thickness of the capacitive film 35 may be 100 Å or more and 1000 Å or less (10 nm or more and 100 nm or less).

The upper electrode 36 is embedded into the trench 107, and is disposed along the first main surface 5 of the substrate 2. The upper electrode 36 is integrally embedded into an embedding portion 116 in the trench 107, and a flat portion 117 connected to an upper end of the embedding portion 116 and formed flat along the first surface 5 of the substrate 2. The flat portion 117 is formed to be drawn out to the peripheral portion 70 of the upper electrode 36 outside the capacitor portion 32. The flat portion 117 has the edge 72 located inside the lower electrode 34 and the edge 71 of the capacitive film 35. Moreover, the upper electrode 36 may be made of, for example, a semiconductor material such as polysilicon, or a metal material including Cu or Al. If the upper electrode 36 is made of a metal material, for example, Cu, Al, AlSi or AlCu may be included. Moreover, the thickness of the upper electrode (the flat portion 117) may be 4000 Å or more and 10000 Å or less (400 nm or more and 1000 nm or less).

A first insulating film 118 and a second insulating film 119 are further disposed on the substrate 2. The first insulating film 118 covers the insulating film 113, the lower electrode 34, the capacitive film 35 and the upper electrode 36, and is layered on these films. The second insulating film 119 is layered on the first insulating film 118. The first insulating film 118 and the second insulating film 119 have end surfaces consistent with the side surfaces 7 to 10 of the substrate 2. Thus, the insulating film 113, the first insulating film 118 and the second insulating film 119 may have a layering interface exposed on extension lines of the side surfaces 7 to 10 of the substrate 2, when observed from the cross sections in FIG. 9 and FIG. 10.

The first capacitor contact hole 37 exposing the first peripheral portion 63 of the lower electrode 34, and a second capacitor contact hole 120 exposing the flat portion 117 in the body portion 69 of the upper electrode 36 are formed in the first insulating layer 118 and the second insulating layer 119. The first capacitor contact portion 37 is also disposed at the capacitive film 35.

Moreover, a first diode contact hole 121 exposing the first diode portion 331 and a second diode contact hole 122 exposing the second diode 332 are further formed in the insulating film 113, the first insulating film 118 and the second insulating film 119. Referring to FIG. 7, the first diode contact hole 121 forms a strip shape having a lengthwise direction along the second direction Y, to expose the plurality of first diodes 88 altogether. The second diode contact hole 122 forms a strip shape having a lengthwise direction along the second direction Y, to expose the plurality of second diodes 89 altogether.

Referring to FIG. 9 and FIG. 10, on the second insulating film 119, the first electrode film 38 and the second electrode film 39 are disposed spaced from each other.

Referring to FIG. 9, a portion of the first base portion 45 of the first electrode film 38 serving as the first diode contact portion 41 is formed in the first diode contact hole 121, and that serving as the second lower contact portion 75 (the lower contact portion 40) is formed in the first capacitor contact hole 37. Referring to FIG. 10, a portion of the first extending portion 46 of the first electrode film 38 serving as the first lower contact portion 74 (the lower contact portion 40) is formed in the first capacitor contact hole 37.

Referring to FIG. 9, a portion of the second base portion 49 of the second electrode film 39 serving as the second diode contact portion 43 is formed in the second diode contact hole 121. Moreover, a portion of the second extending portion 50 of the second electrode film 39 serving as the upper contact portion 42 is formed in the second capacitor contact hole 120.

Moreover, the first electrode film 38 and the second electrode film 39 may also adopt an appropriate material including Al as the electrode material thereof. Such material may include, for example, AlCu and AlSiCu, and preferably AlCu.

A surface insulating film 123 is further formed on the substrate 2. The surface insulating film 123 covers the first electrode film 38 and the second electrode film 39. The surface insulating film 123 may be, for example, a $SiO_2$ film or a SiN film. The thickness of the surface insulating layer 123 may be, for example, 10000 Å or more and 15000 Å or less (1 μm or more and 1.5 μm or less). The surface insulating layer 123 integrally covers a first portion 124 covering a region of the first main surface 5 of the substrate 2, and a second portion 125 covering the side surfaces 7 to 10 of the substrate 2. Accordingly, the second main surface 6 is an exposed surface in the substrate 2, and the remaining surfaces are all covered by the surface insulating film 123.

A surface protective film 126 is formed on the first portion 124 of the surface insulating film 123. The surface protective film 126 may be, for example, a resin film such as polyimide film. The thickness of the surface protective film 126 may be, for example, 20000 Å or more and 100000 Å or less (2 μm or more and 10 μm or less). The surface protective film 126 serves as an insulative space 13 between the first external electrode 3 and the second external electrode 4 and is exposed.

A first pad opening 129 exposing the first base portion 45 used as a first pad 127 is formed in the surface insulating film 123 and the surface protective film 126. Moreover, a second pad opening 130 exposing the second base portion 49 used as a second pad 128 is formed in the surface insulating film 123 and the surface protective film 126.

A first covering portion 131 selectively covering the first pad 127 is disposed on the first pad 127. A second covering portion 132 selectively covering the second pad 128 is disposed on the second pad 128. The first covering portion 131 and the second covering portion 132 may be made of materials the same as the surface insulating film 123. The first covering portion 131 and the second covering portion 132 may be formed by the same patterns as the recesses 27 formed at the first electrode surface 24 of the first external electrode 3 and the second electrode surface 25 of the second external electrode 4.

The first external electrode 3 is formed in the first pad opening 129. The first external electrode 3 serving as the first external contact portion 47 in the first pad opening 129 is connected to the first pad 127. Accordingly, the first external electrode 3 is electrically connected to the lower electrode 34 and the first impurity region 111 via the first electrode film 38.

The second external electrode 4 is disposed in the second pad opening 130. The second external electrode 4 serving as the second external contact portion 51 in the second pad opening 130 is connected to the second pad 128. Accordingly, the second external electrode 4 is electrically connected to the upper electrode 36 and the second impurity region 112 via the second electrode film 39.

Moreover, the first external electrode 3 and the second external electrode 4 may be, for example, a Ni/PdAu layered film sequentially including a Ni film, a Pd film and an Au film from the substrate 2. Moreover, these layered films may be plated layers formed by means of plating and deposition.

[Manufacturing Method of the Chip Part 1]

Figure 11A:
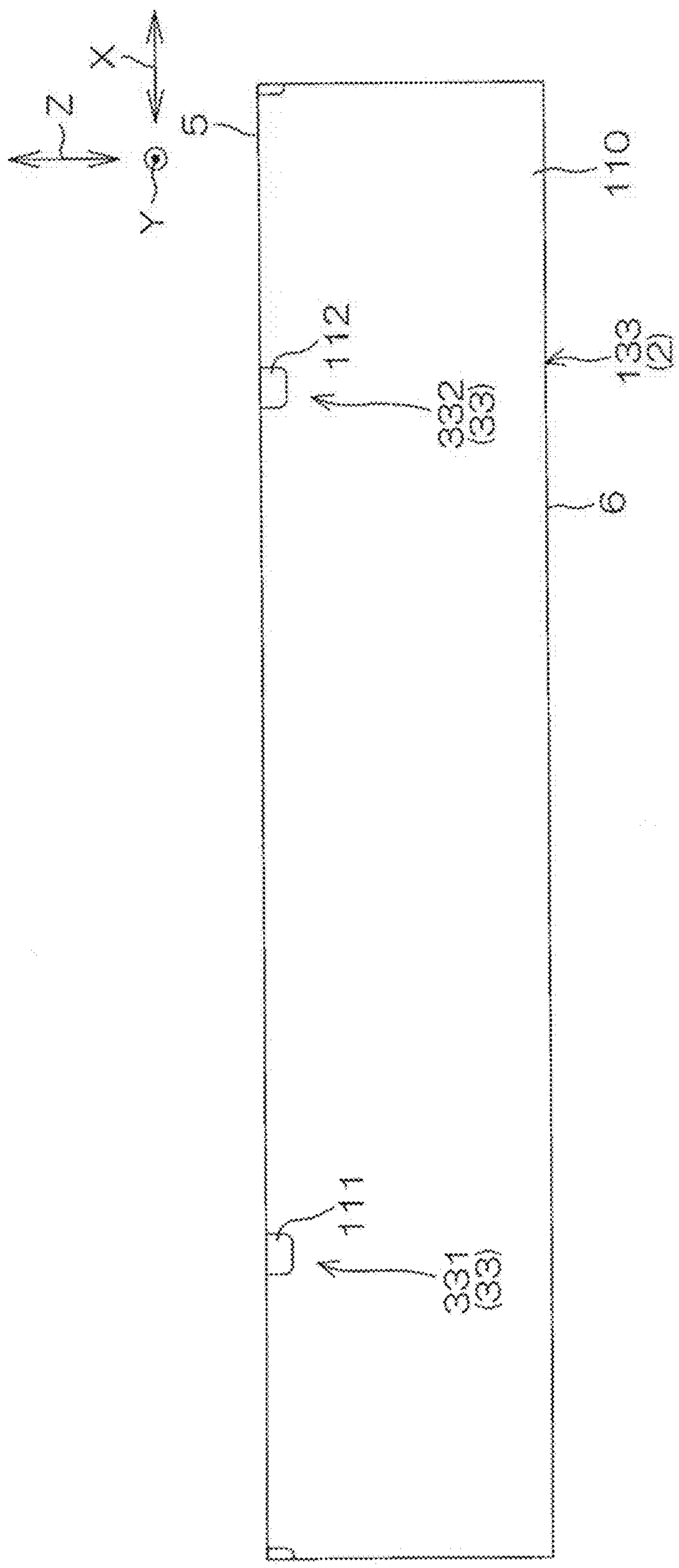
FIG. 11A is a schematic section diagram of a part of a manufacturing step of the chip part
Figure 11B:
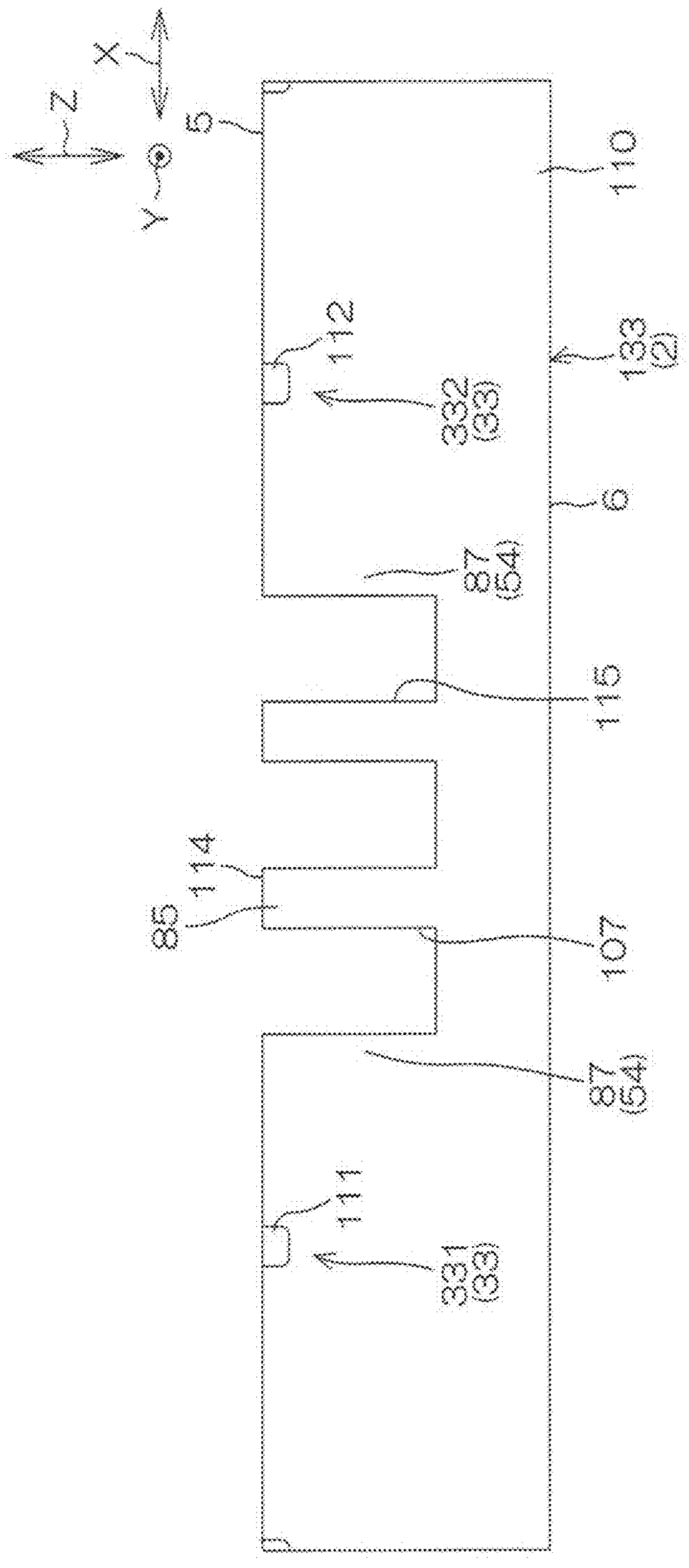
FIG. 11B is a diagram of a next step of FIG. 11A
Figure 11C:
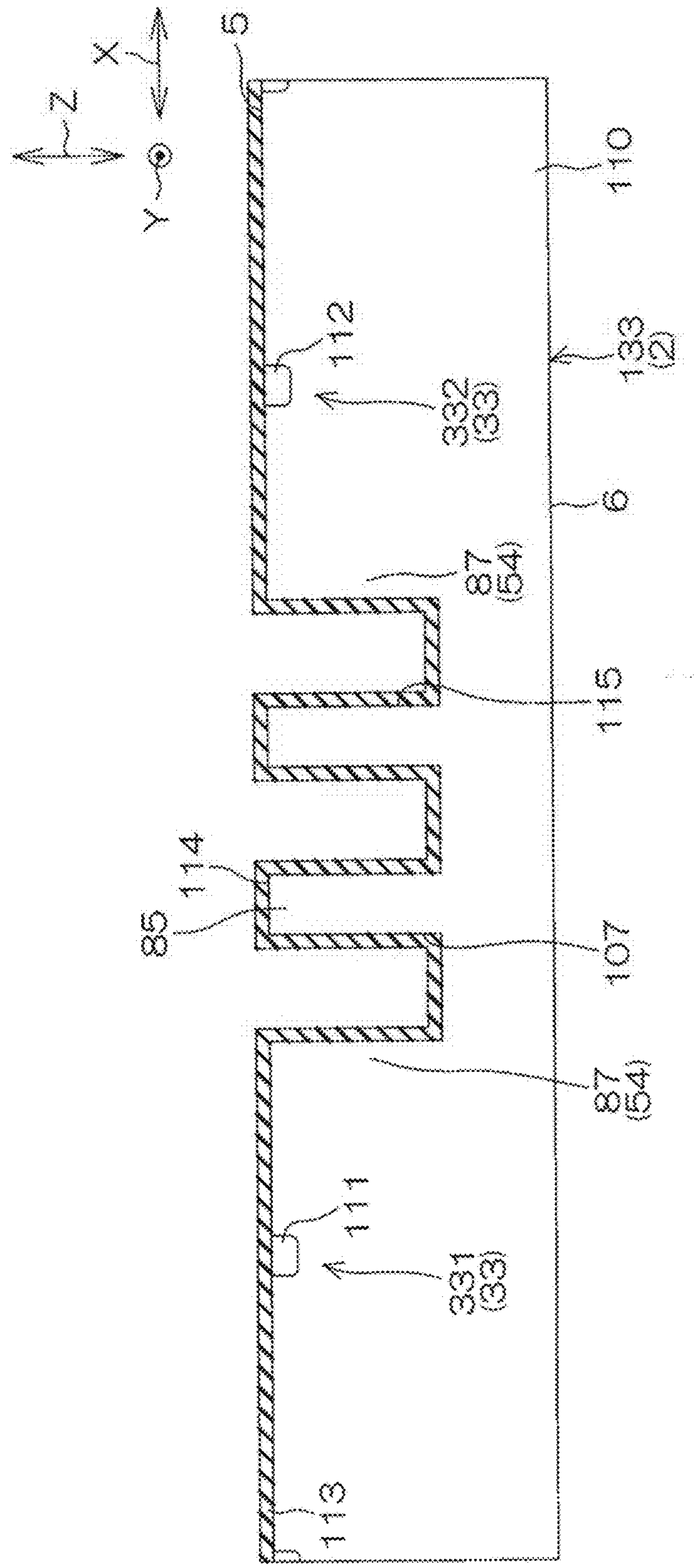
FIG. 11C is a diagram of a next step of FIG. 11B
Figure 11D:
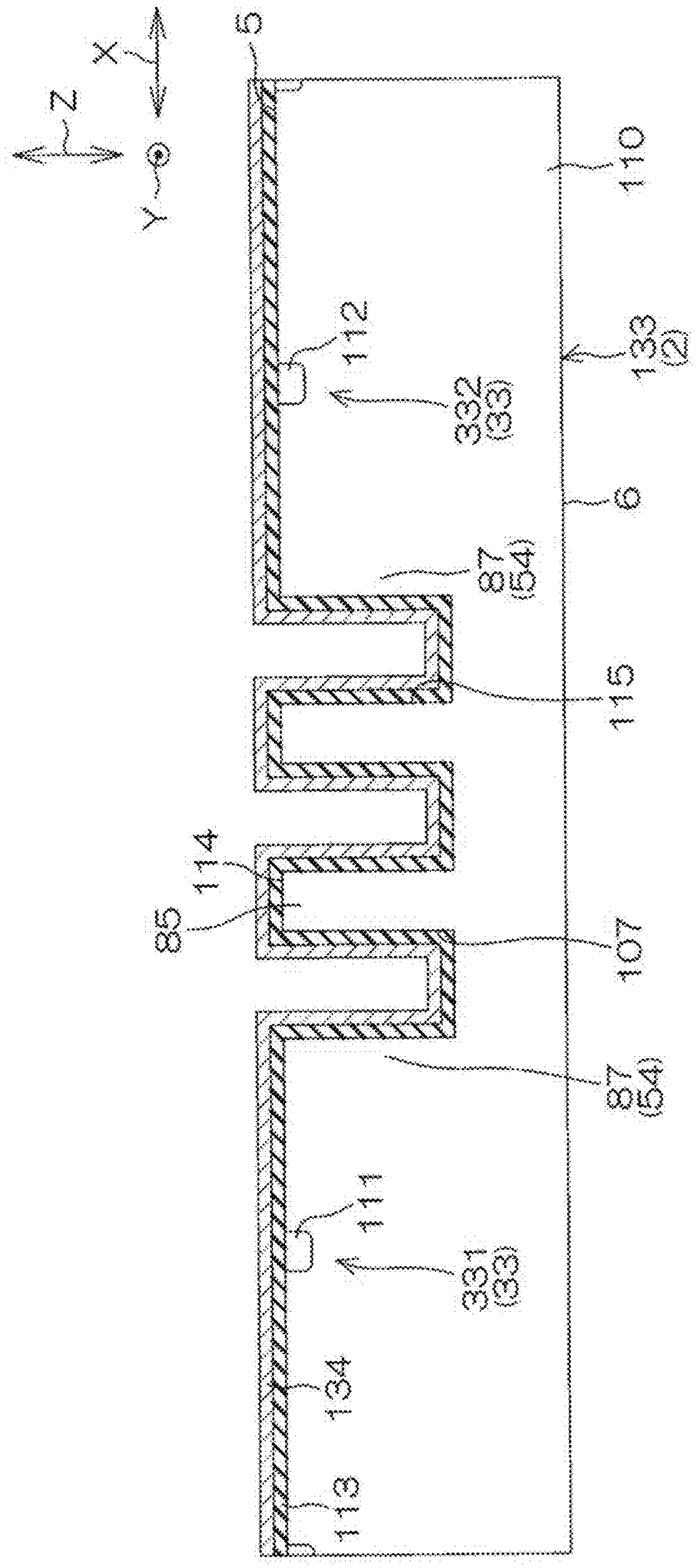
FIG. 11D is a diagram of a next step of FIG. 11C
Figure 11E:
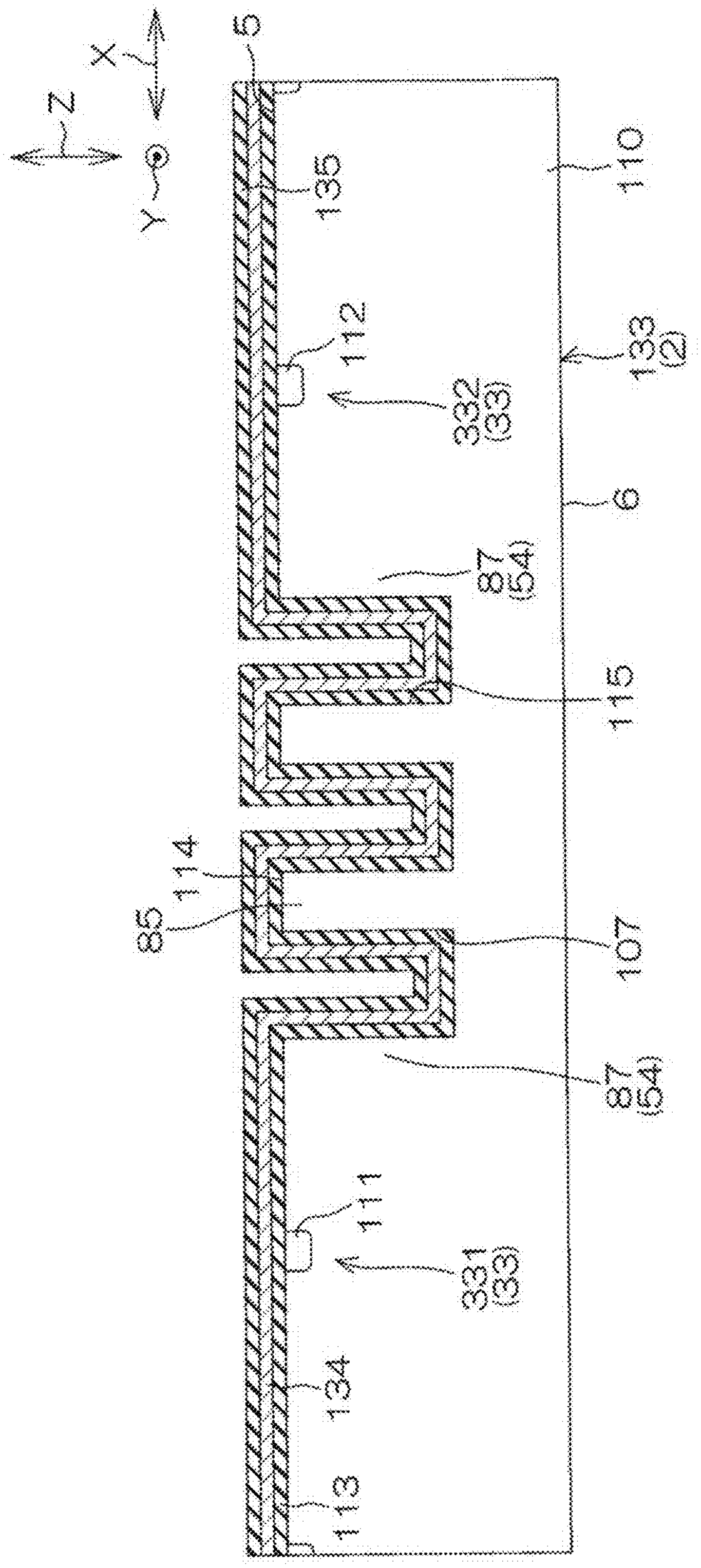
FIG. 11E is a diagram of a next step of FIG. 11D
Figure 11F:
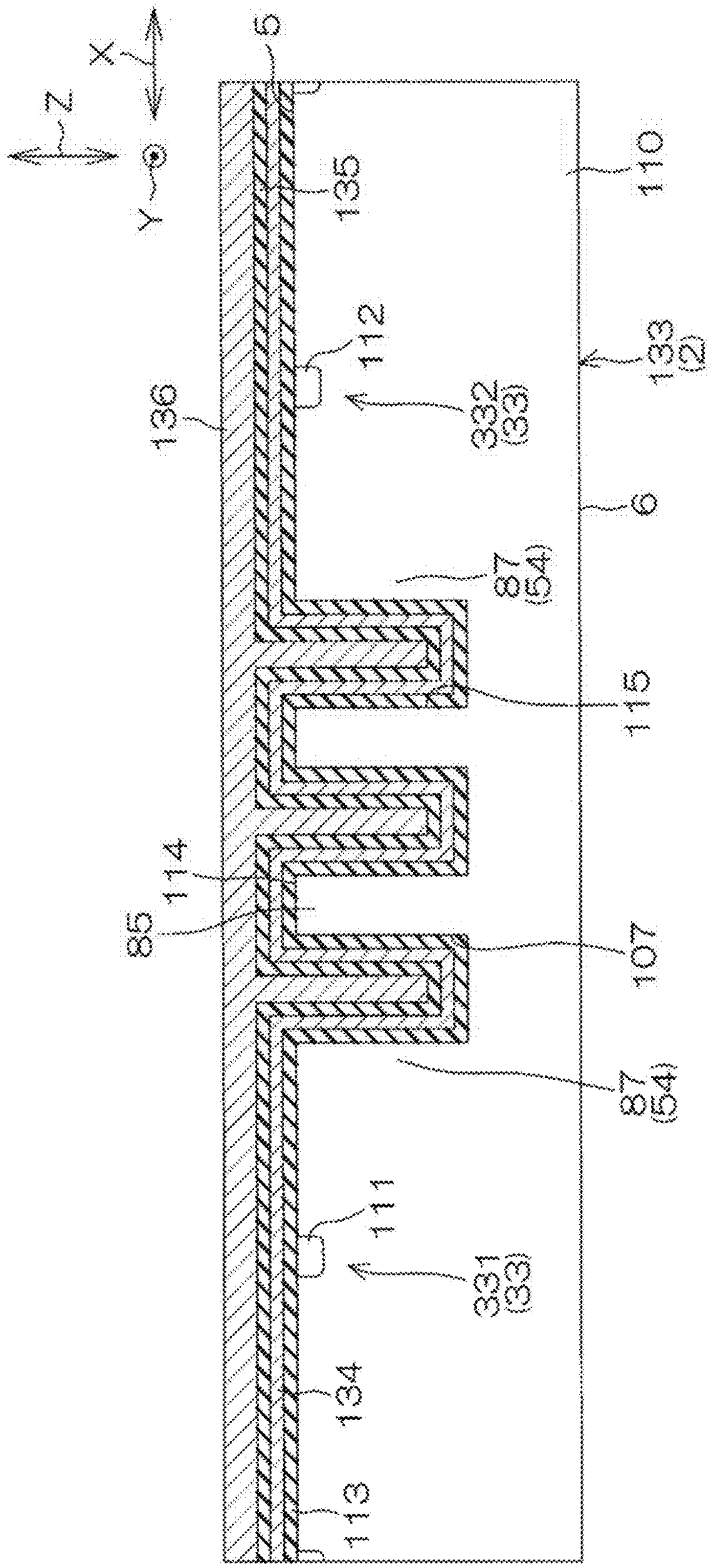
FIG. 11F is a diagram of a next step of FIG. 11E
Figure 11G:
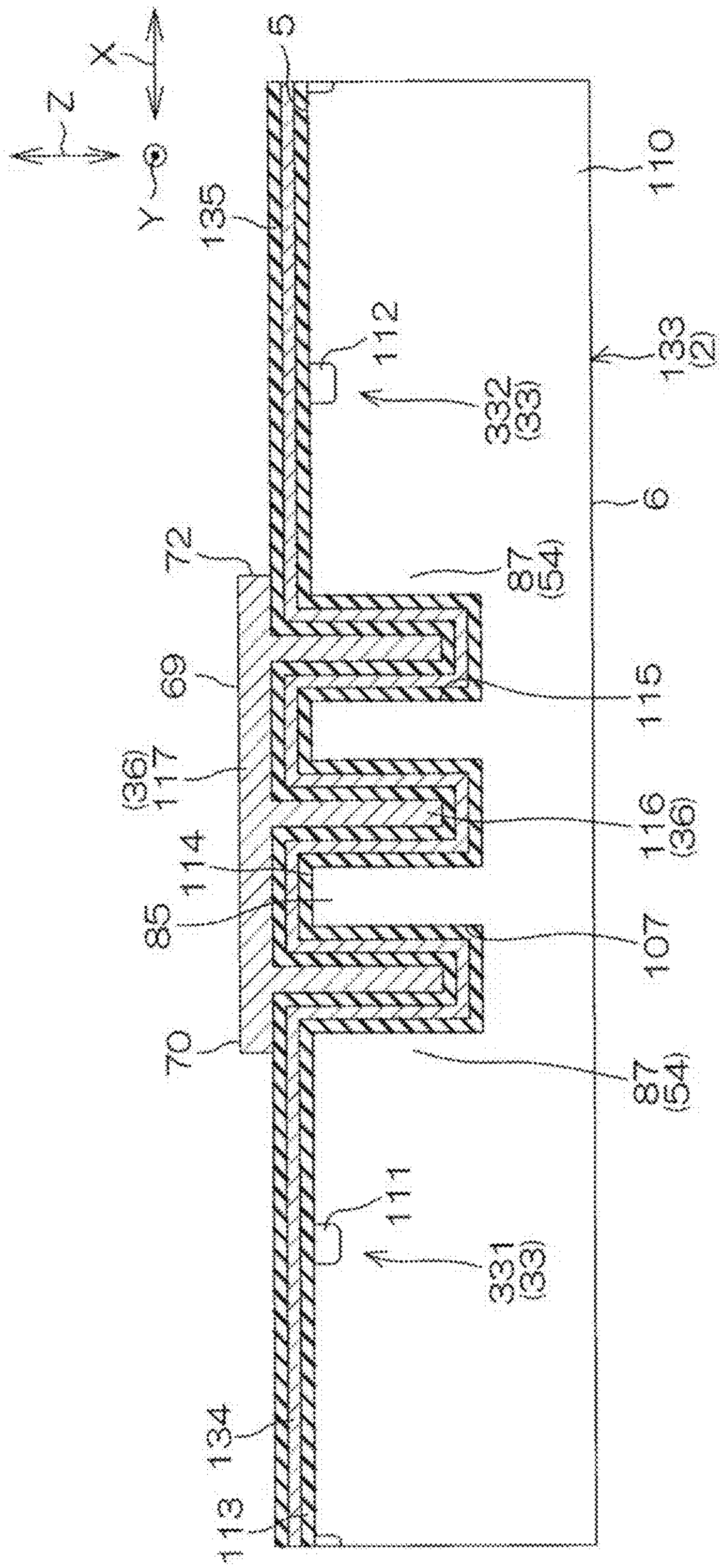
FIG. 11G is a diagram of a next step of FIG. 11F
Figure 11H:
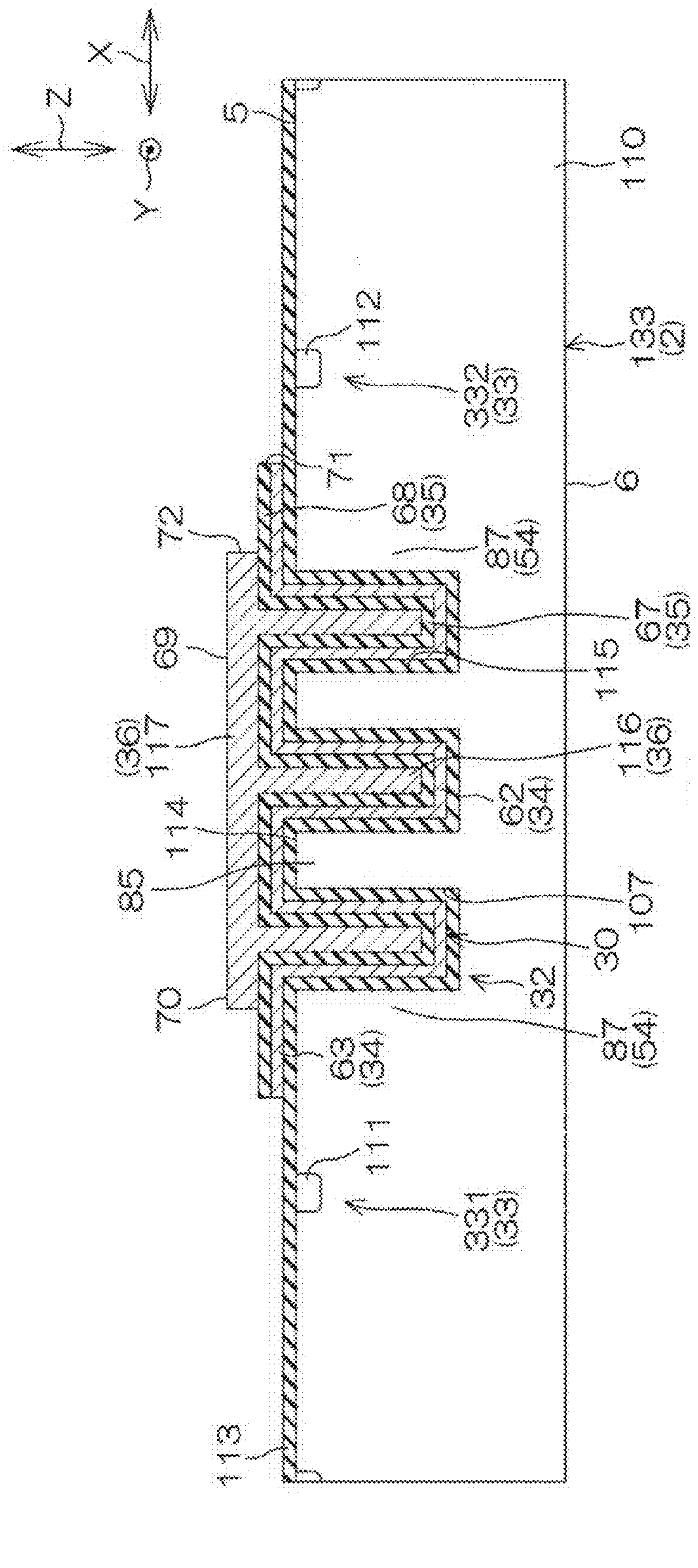
FIG. 11H is a diagram of a next step of FIG. 11G
Figure 111:
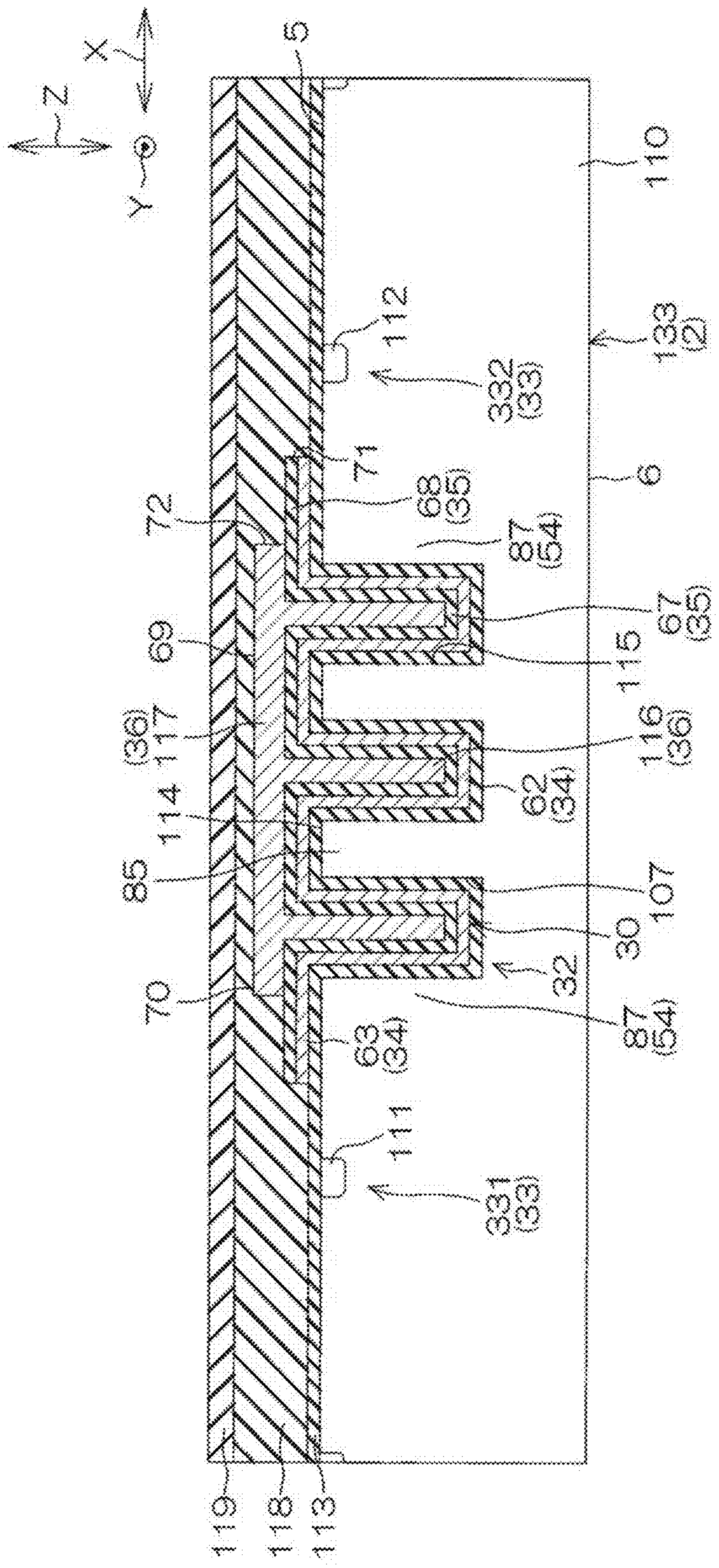
Figure 11J:
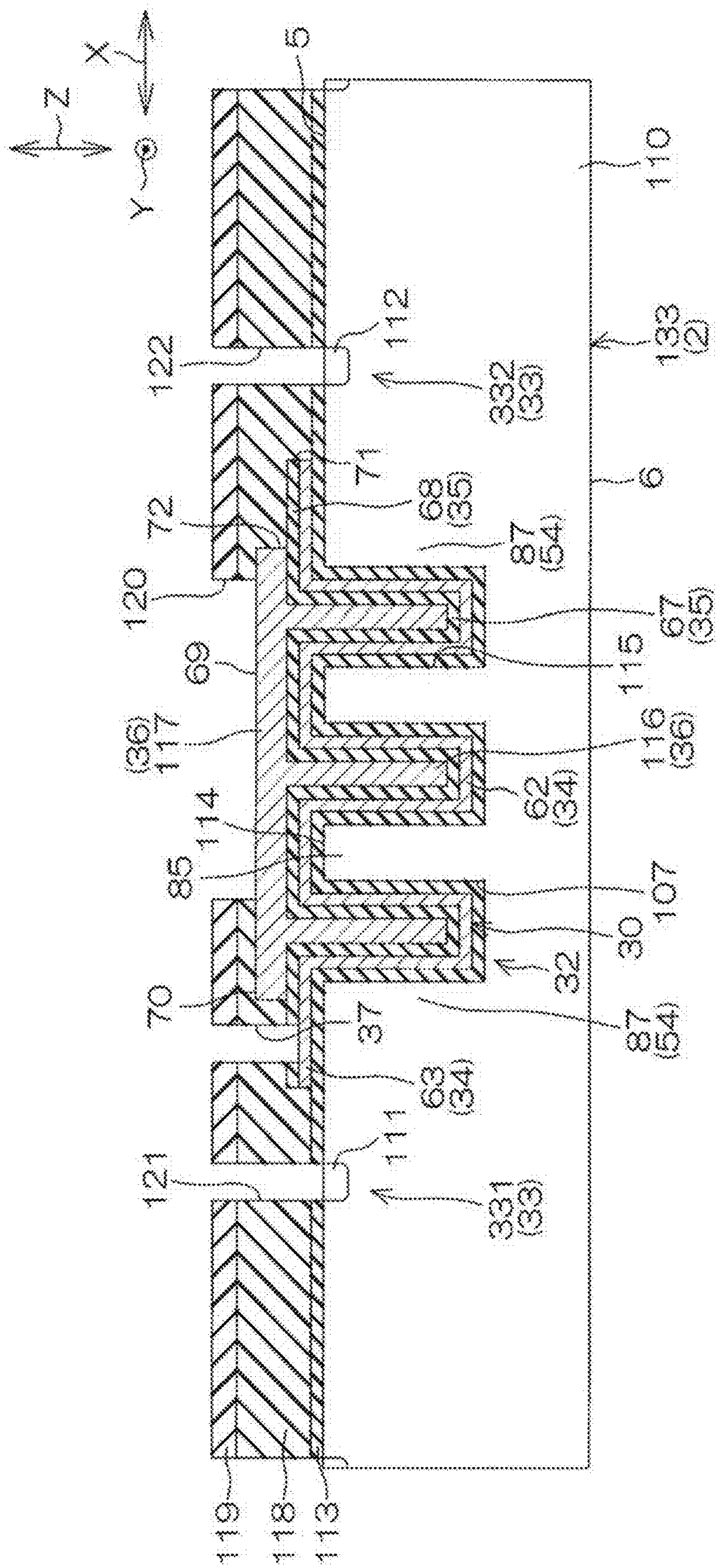
FIG. 11J is a diagram of a next step of FIG. 11I
Figure 11K:
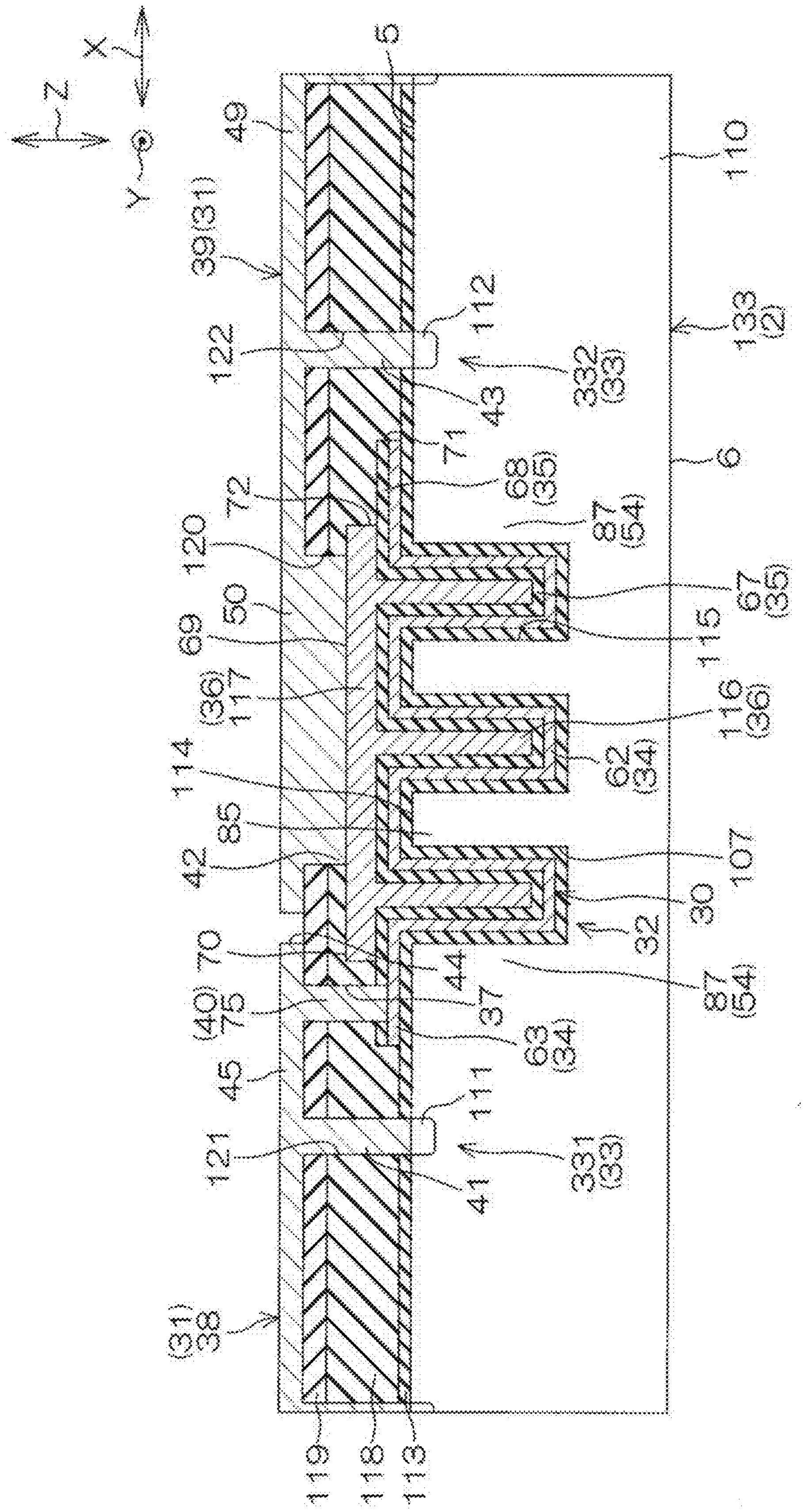
FIG. 11K is a diagram of a next step of FIG. 11J
Figure 11L:
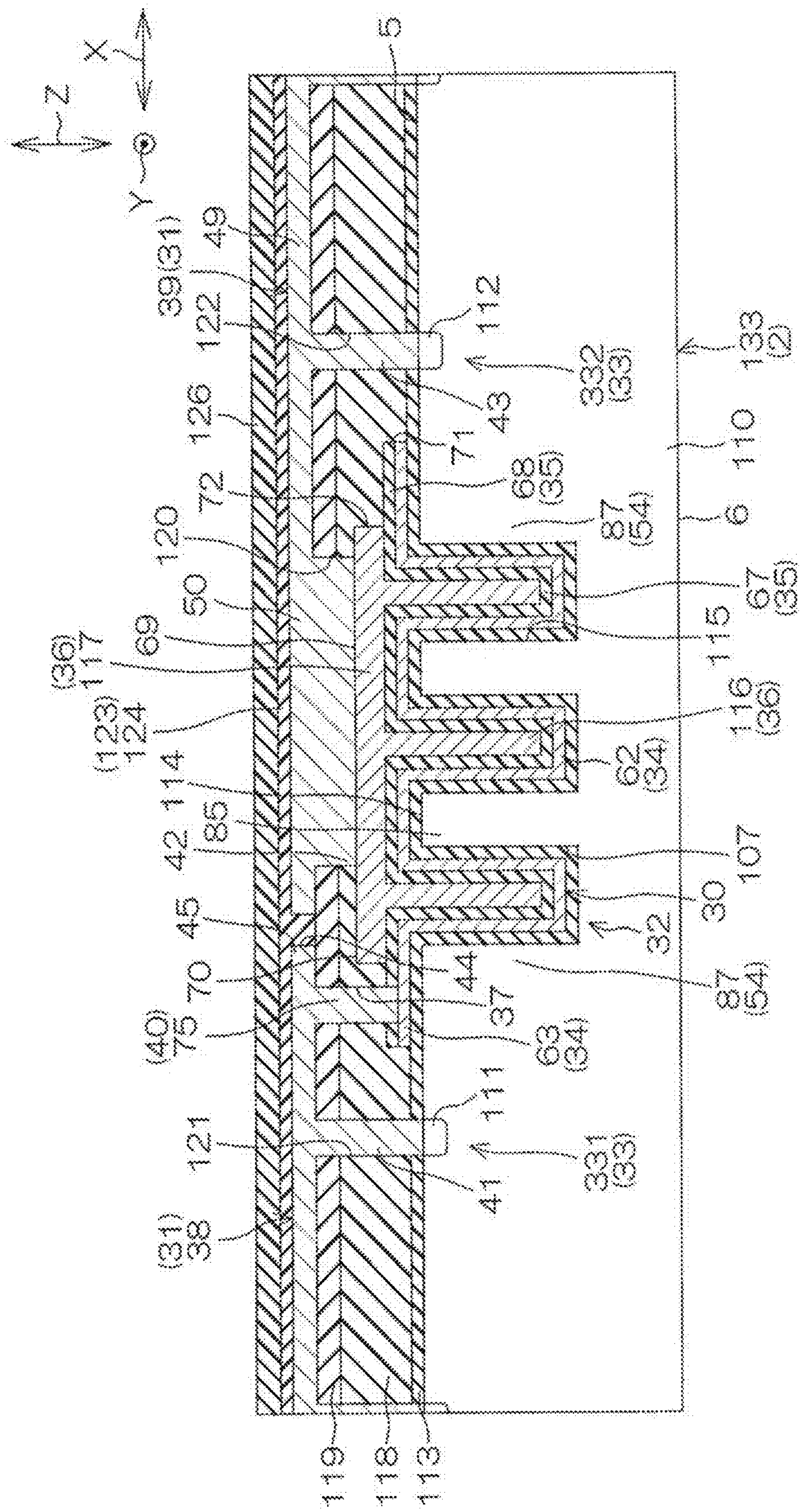
FIG. 11L is a diagram of a next step of FIG. 11K
Figure 11M:
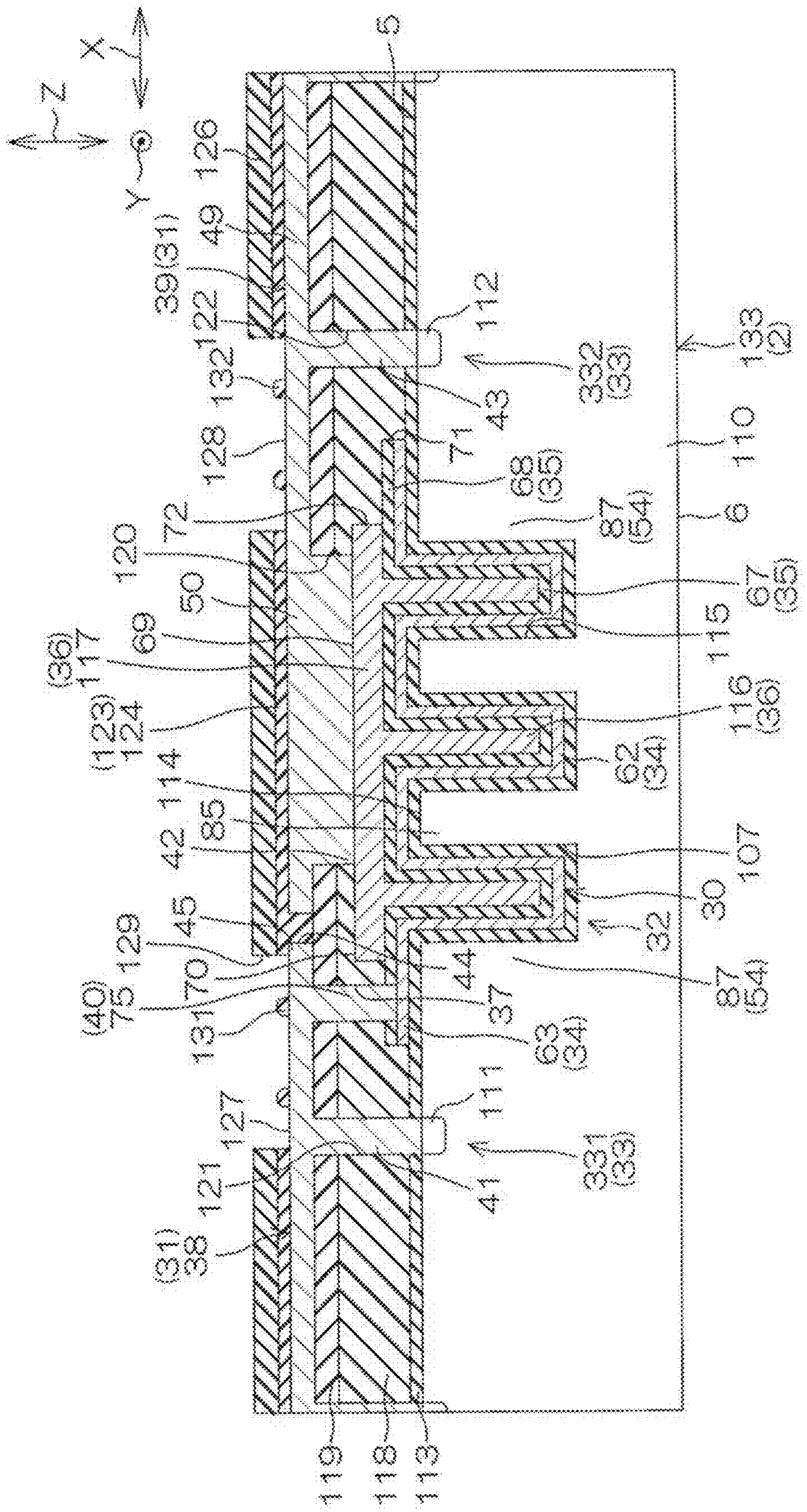
FIG. 11M is a diagram of a next step of FIG. 11L
Figure 11N:
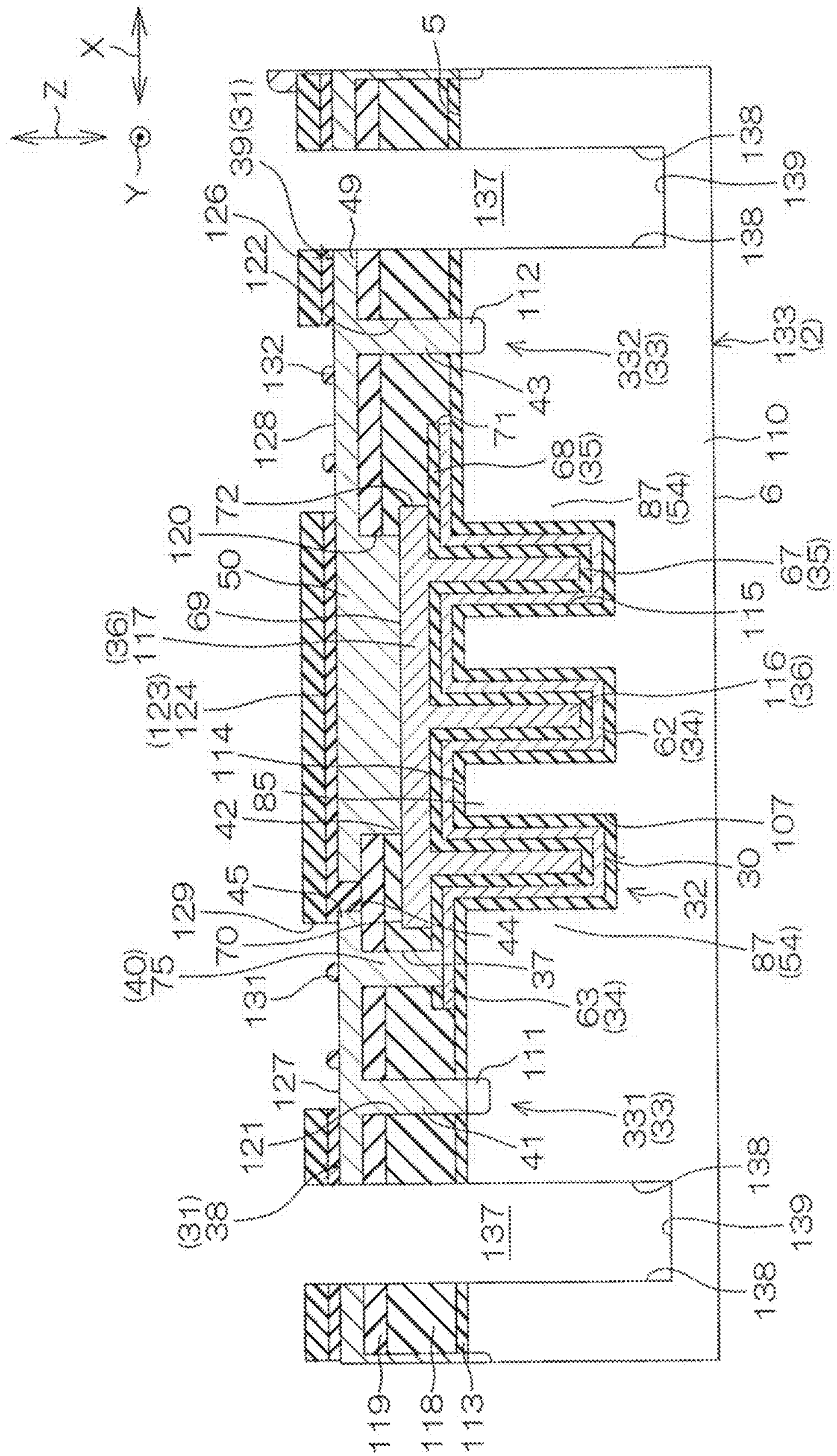
FIG. 11N is a diagram of a next step of FIG. 11M
Figure 11O:
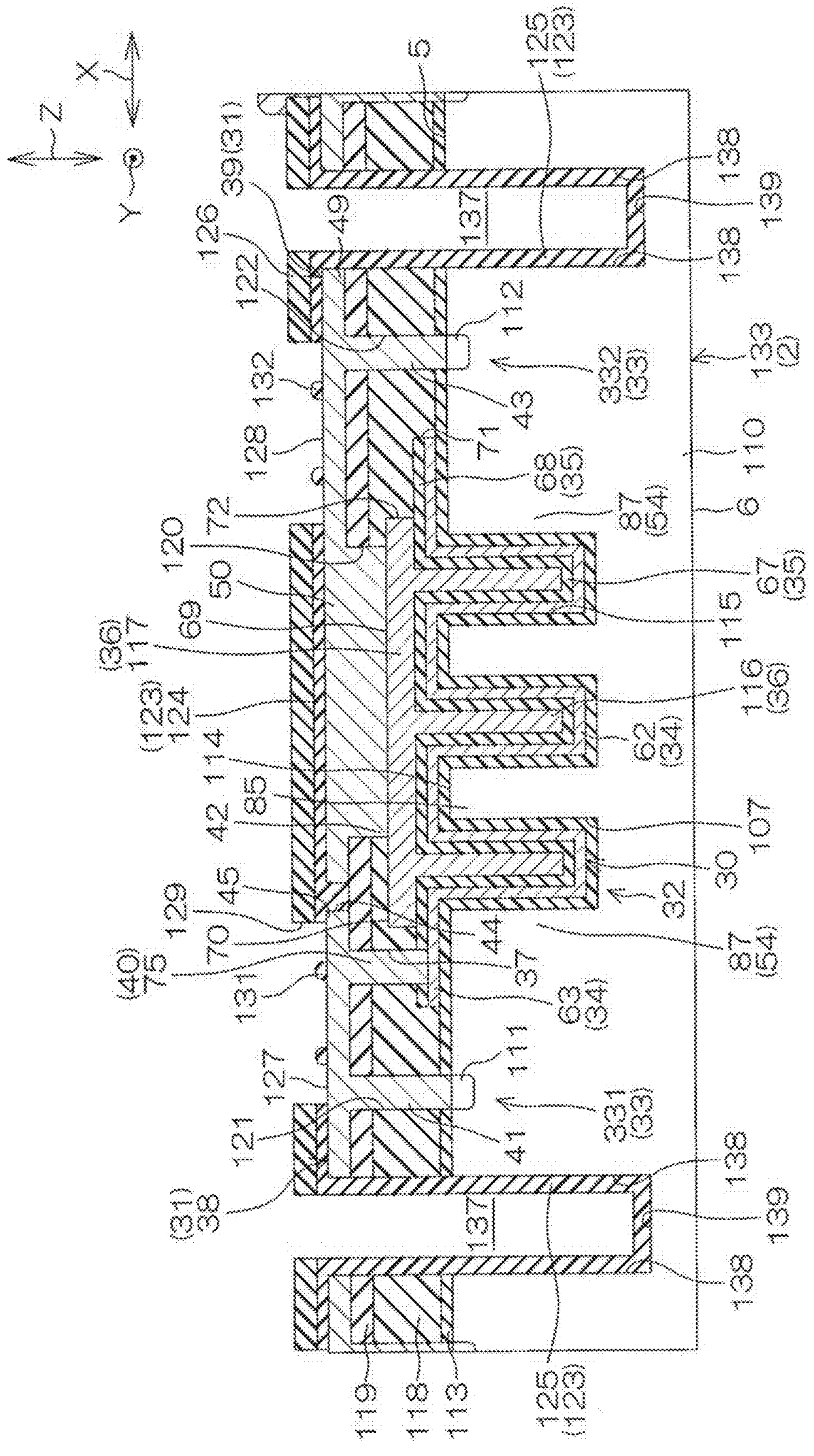
FIG. 11O is a diagram of a next step of FIG. 11N
Figure 11P:
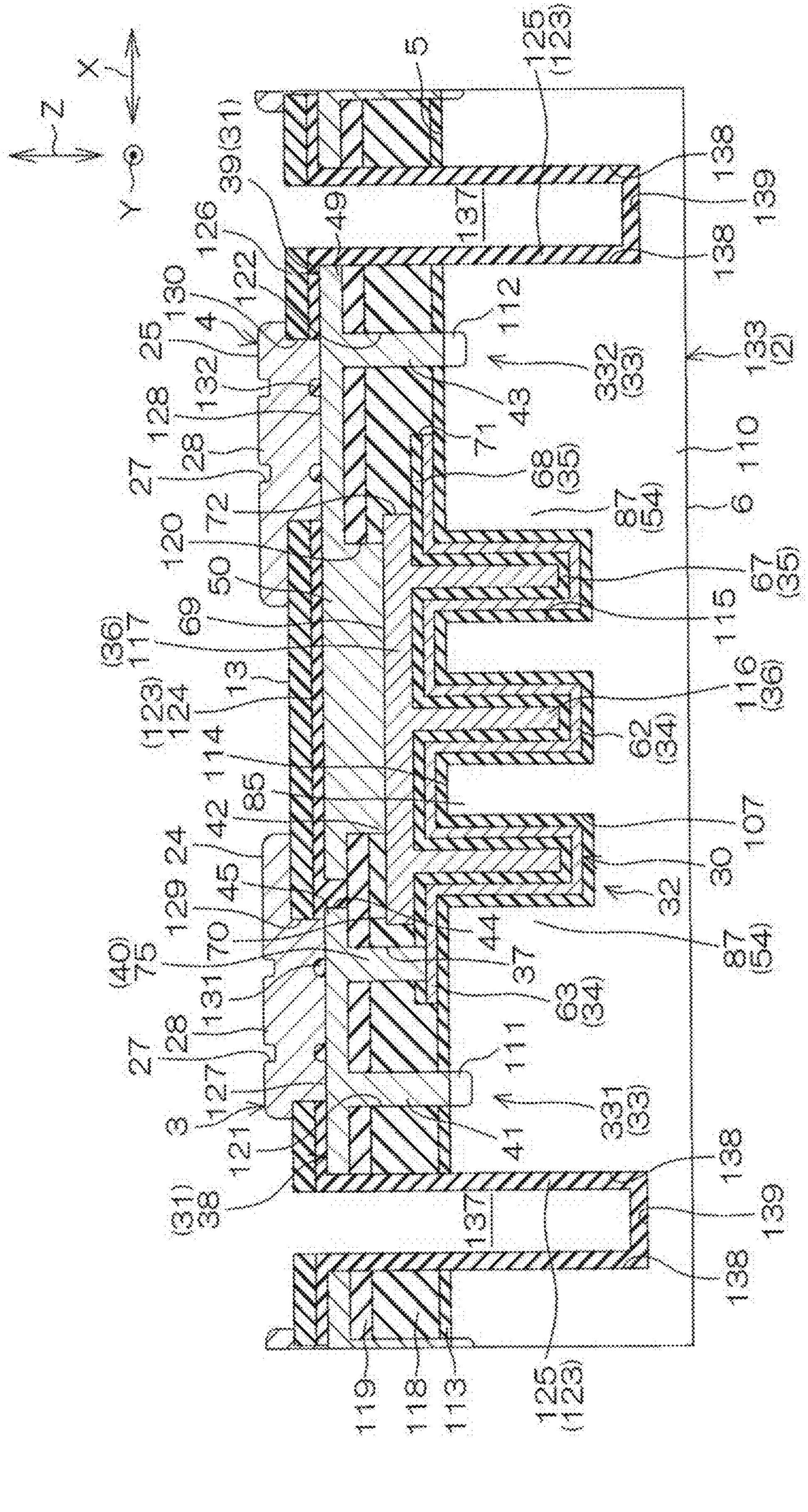
FIG. 11P is a diagram of a next step of FIG. 11O
Figure 11Q:
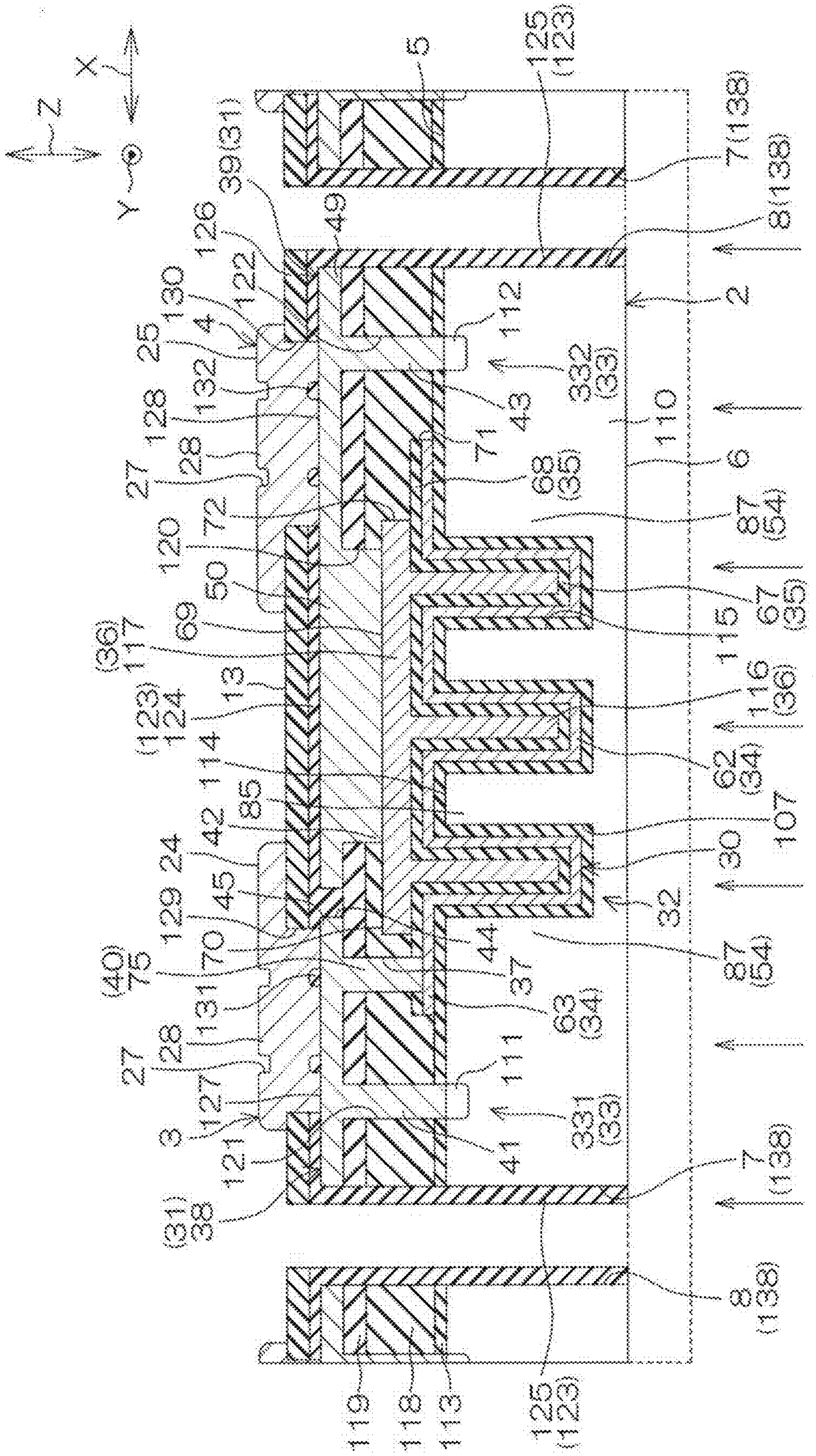
FIG. 11Q is a diagram of a next step of FIG. 11P

FIG. 11A to FIG. 11Q show diagrams of manufacturing steps of the chip part 1 in sequence, and correspond to the cross section in FIG. 9.

To manufacture the chip part 1, first of all, referring to FIG. 11A, a wafer 133 to become a base of the substrate 2 is prepared. Then, an n-type impurity (for example, phosphorus) is selectively introduced into the first main surface 5 of the substrate 2. Then, for example, by annealing at 900° C. to 1,000° C., the n-type impurity is diffused to the surface portion of the first main surface 5 of the wafer 133 to form the first impurity region 111 and the second impurity region 112.

Next, referring to FIG. 11B, for example, a hard mask (not shown) containing $SiO_2$ is formed by thermally oxidizing the first main surface 5 of the wafer 133. Next, an opening is formed at the hard mask, and etching is selectively performed on wafer 133 by using the hard mask from the side of the first main surface 5. Herein, the trench 107 is formed at a portion removed from the wafer 133, and the wall portions 85 and the support portion 87 (the substrate body portion 54) are formed on portions other than the trench 107. Dry etching is preferably used as a means of etching.

Next, referring to FIG. 11C, for example, the insulating film 133 including $SiO_2$ is formed thermal oxidizing the first main surface 5 of the wafer 133, the upper surfaces 114 and the side surfaces 115 of the wall portions 85.

Next, referring to FIG. 11D, a first conductive film 134 that becomes a base of the lower electrode 34 is formed on the insulating film 113 by means of, for example, chemical vapor deposition (CVD). The first conductive film 134 is formed covering the upper surfaces 114 and the side surfaces 115 of the wall portions 85 and the entire surface of the first main surface 5 of the wafer 133.

Next, referring to FIG. 11E, by means of CVD, for example, an intermediate insulating film 135 that becomes a base of the capacitive film 35 is formed on the first conductive film 134. The intermediate insulating film 135 is formed covering the upper surfaces 114 and the side surfaces 115 of the wall portions 85 and the entire surface of the first main surface 5 of the wafer 133.

Next, referring to FIG. 11F, by means of CVD, for example, a second conductive film 136 that becomes a base of the upper electrode 36 is formed on the intermediate insulating film 135. The second conductive film 136 is embedded into the trench 107, and is formed covering the entire surface of the first main surface 5 of the wafer 133.

Next, referring to FIG. 11G, the second conductive film 136 is selectively etched to form the upper electrode 36. A gas having sufficient selectivity on the material of the intermediate insulating layer 135 is used, so that the intermediate insulating layer 135 is not etched.

Next, referring to FIG. 11H, the intermediate insulating film 135 is selectively etched to form the capacitive film 35.

Next, referring to FIG. 11G, the first conductive film 135 is selectively etched by using the same mask used for forming the capacitive film 35 to accordingly form the lower electrode 34. Because the capacitive film 35 and the lower electrode 34 are formed by means of etching by using the same etching mask, the capacitive film 35 and the lower electrode 34 have the common edge 71. At this point, the shape of an opening pattern of the etching mask is appropriately specified in a manner of having the edge 71 be outside the edge 72 of the upper electrode 72. Accordingly, the capacitor structure 30 is formed.

Next, referring to FIG. 11I, by means of CVD, for example, the first insulating film 118 and the second insulating film 119 are sequentially formed.

Next, referring to FIG. 11J, the second insulating film 119, the first insulating film 118, the capacitive film 35 and the insulating film 113 are selectively etched to form the first capacitor contact hole 37, the second capacitor contact hole 120, the first diode contact hole 121 and the second diode contact hole 122.

Next, referring to FIG. 11K, by means of spluttering, for example, films are formed from the materials of the first electrode film 38 and the second electrode film 39, and the first electrode film 38 and the second electrode film 39 are then formed by means of patterning.

Next, referring to FIG. 11L, by means for CVD, for example, the material for forming the surface insulating film 123 (the first portion 124) is applied over the entire first main surface 5 of wafer 133. Next, the material (for example, a liquid of a photosensitive resin containing polyamide) of the surface protective film 126 is spray coated onto the wafer 133 to form the surface protective film 126 of the photosensitive resin. Moreover, in addition to spray coating with the liquid of a photosensitive resin, the liquid may also be spin coated or a sheet material containing a photosensitive resin may also be adhered to the first main surface 5 of the wafer 133 to form the surface protective film 126. Next, the surface protective film 126 is heat treated (curing treated). Accordingly, the thickness of the surface protective film 126 is thermally shrunk, and the surface protective film 126 is hardened and the film quality is then stable.

Next, referring to FIG. 11M, by using a photolithography process, for example, the surface protective film 126 and the surface insulating film 123 are selectively removed and patterned by means of dry etching such as reactive ion etching (RIE). Accordingly, the first pad opening 129 and the second pad opening 130 are formed at the same time. At this point, a portion of the surface insulating film 123 is patterned in a manner of leaving the first pad 127 and the second pad 128 respectively serving as the first covering portion 131 and the second covering portion 12.

Next, referring to FIG. 11N, the wafer 133 is selectively removed by means of RIE using a mask (not shown). Accordingly, the material of the wafer 133 is removed from a border region between adjacent component regions (regions forming the chip parts 1). As a result, a trench 137 having a specified depth as from the first main surface 5 of the wafer 133 through the midway of the thickness of the wafer 133 is formed. The trench 137 is defined by a pair of side surfaces 138 opposite to each other and a bottom surface 139 connecting lower ends of the pair of side surfaces 138 (ends on the second main surface 6 of the wafer 133). For example, the depth of the trench 137 based on the first main surface 5 of the wafer 133 may be approximately 100 μm, the width of the trench 137 may be approximately 20 μm, and the trench 137 is kept fixed in the entire region in the depthwise direction.

Next, referring to FIG. 11O, by means for CVD, for example, the surface insulating film 123 (the second portion 125) is formed over the entire region of the inner surface (the side surfaces 138 and the bottom surface 139) of the trench 137.

Next, referring to FIG. 11P, by means of electroless plating, for example, Ni, Pd, and Au are layered to form the first external electrode 3 and the second external electrode 4 at the same time. At this point, the progress of coating in the regions on the first covering layer 131 and the second covering layer 132 is relatively slower. Accordingly, the recesses 27 having the same pattern as those of the first covering portion 131 and the second covering portion 12 are formed on the electrode surfaces 24 and 25 of the first external electrode 3 and the second external electrode 4.

Next, referring to FIG. 11A, the wafer 133 is ground from the second main surface 6. More specifically, after the trench 137 is formed, a sheet-like support tape (not shown) made of polyethylene terephthalate (PE) and having an adhesive surface is attached to the side of the first external electrode 3 and the second external electrode 4 (that is, the first main surface 5). Then, as the wafer 133 is supported by the support tape, the wafer 133 is ground from the side of the second main surface 6. Once the wafer 133 is thinned by grinding to the bottom surface 139 of the trench 137, there is not any portion available for connecting the adjacent chip parts 1. Thus, the wafer 133 is cut by using the trench 137 as a border to become finished products of the chip parts 1. That is to say, the wafer 133 is cut (segmented) at the trench 137 (in other words, a border region) to accordingly provide the chip parts 1 after the cutting. Moreover, the wafer 133 may also be etched from the side of the second surface 6 to the bottom surface 139 of the trench 137 to accordingly provide the chip parts 1. Moreover, the second main surface 6 of the substrate 2 in the finished chip part 1 may be mirror-finished by means of grinding or etching to clean the second main surface 6.

Next, details of features 1 to 3 extracted from a plurality of features included by the embodiments of the present disclosure are described below. Moreover, the features 1 to 3 are merely examples of the features of the present disclosure, and are not to be interpreted as limitations to the contents of the claims.

Feature 1 of the Embodiments of the Present Disclosure

(1) Effects of the Capacitor Portion 32 of the Present Disclosure

According to the chip part 1, as shown in FIG. 8, the wall portions 85 formed at the substrate 2 are formed by a plurality of pillar units 90. Each of the plurality of pillar units 90 includes the central portion 91, and three protruding portions 92 extending from the central portion 91 to three different directions in the plan view. Accordingly, compared to when the wall portions 85 are formed by connecting pillars such as quadrilateral pillars, the surface area of the wall portions 85 can be increased. Moreover, as shown in FIG. 9, the lower electrode 34, the capacitive film 35 and the upper electrode 36 are formed by imitating the upper surfaces 114 and the side surfaces 115 of the wall portions 85. Thus, the capacitance of the capacitor portion 32 is not limited by the plane size of the substrate 2, and a large capacitance can be realized by increasing the height of the wall portions 85. That is to say, even if the plane size of the substrate 2 is smaller, it is ensured that the capacitor portion 32 has a larger capacitance, and therefore miniaturization of components and large capacitance of the capacitor structure 30 can both be satisfied. In addition, with the diode portion 33 provided, the chip part 1 can be provided with an electrostatic discharge (ESD) protection function.

In addition, if the wall portions 85 are formed by connecting the plurality of pillar units 90, the stability achieved is better than that of pillar units 90 that are separated from each other. Further, as shown in FIG. 7, end portions 100 and 101 of the wall portions 85 are connected to the support portion 87 around the wall portions 85. Thus, the wall portions 85 can be cantilevered on both sides and therefore can be reinforced to withstand lateral forces applied to the wall portions 85. As a result, even if the height H of the wall portions 85 is increased, the stability of the wall portions 85 can still be maintained, thereby enhancing component reliability. In addition, in each pillar unit 90, the angles $\theta_1$, $\theta_2$ and $\theta_3$ of 120° are formed between each protruding portion 92 and the adjacent protruding portions 92, and the adjacent protruding portions 92 cross at the central portion 91. Thus, regardless of the direction from which a force is applied to the wall portions 85, at least one protruding portion 92 among the three protruding portions 92 can provide a supporting effect for preventing the wall portions 85 from collapsing. As a result, the stability of the wall portions 85 can be enhanced.

In addition, the capacitor portion 32 includes the first capacitor portion 321 and the second capacitor portion 322 having lengthwise directions different from each other. Thus, the direction of stress generated in the substrate 2 (the wafer 133) due to forming of the wall portions 85 can be dispersed into a plurality of directions. As a result, warping of the substrate 2 (the wafer 133) can be inhibited to thereby enhance strength. In particular, in this embodiment, the first lengthwise direction D1 of the wall portions 85 of the first capacitor portion 321 and the second lengthwise direction D2 of the wall portions 85 of the second capacitor portion 322 are directions orthogonal to each other. Thus, the stress in the first capacitor portion 321 and the stress in the second capacitor portion 322 are applied in directions that cancel out each other, further inhibiting warping of the substrate 2 (the wafer 133). As a result, the chip part 1 having the capacitor structure 30 with mechanical strength and outstanding reliability can be provided.

Further, according to the chip part 1, the edge 71 of the lower electrode 34 is separated from the edge 72 of the upper electrode 36. Moreover, the lower electrode 34 between the edge 72 of the upper electrode 36 and the edge 71 of the lower electrode 34 can be covered by the capacitive film 35. Accordingly, short-circuit between the lower electrode 34 and the upper electrode 36 can be prevented, thereby providing the chip part 1 having outstanding insulation reliability.

(2) Variation Examples of the Capacitor Portion 32

Figure 12:
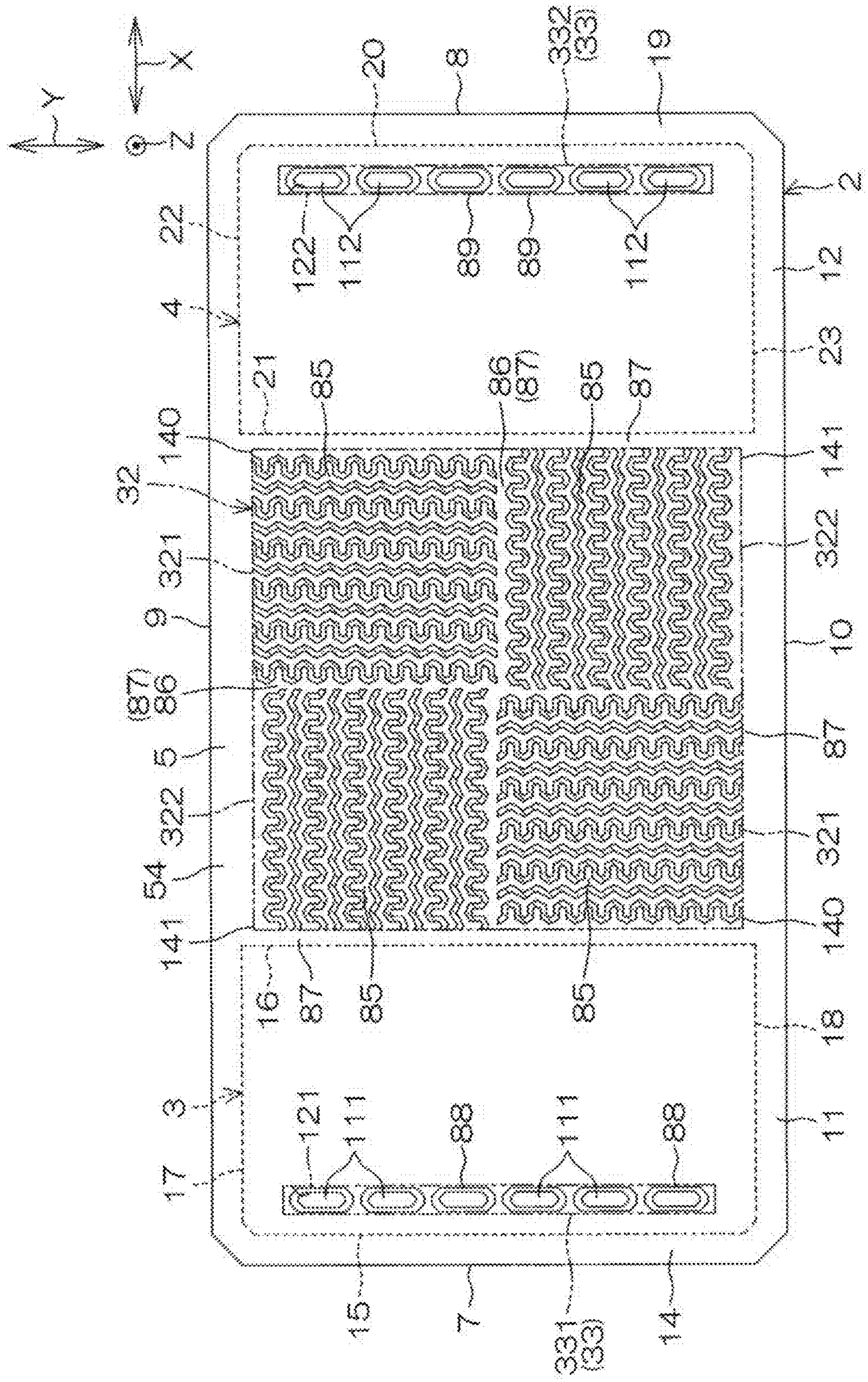
FIG. 12 is a diagram illustrating a variation example of the chip part
Figure 13:
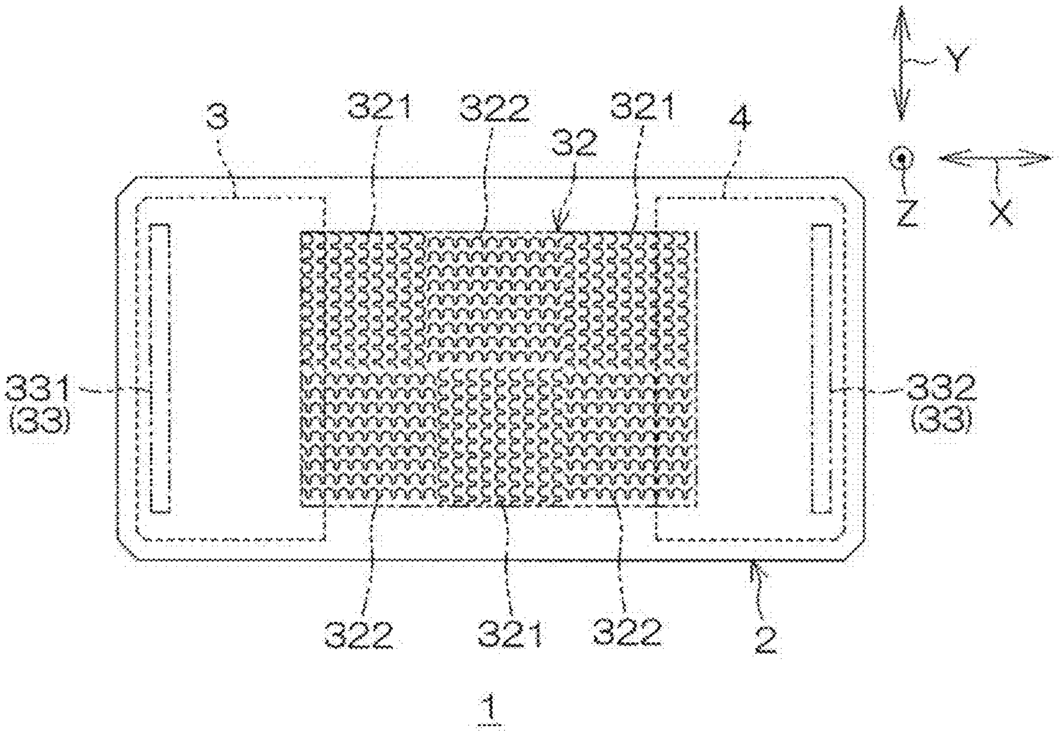
FIG. 13 is a diagram illustrating a variation example of the chip part
Figure 14:
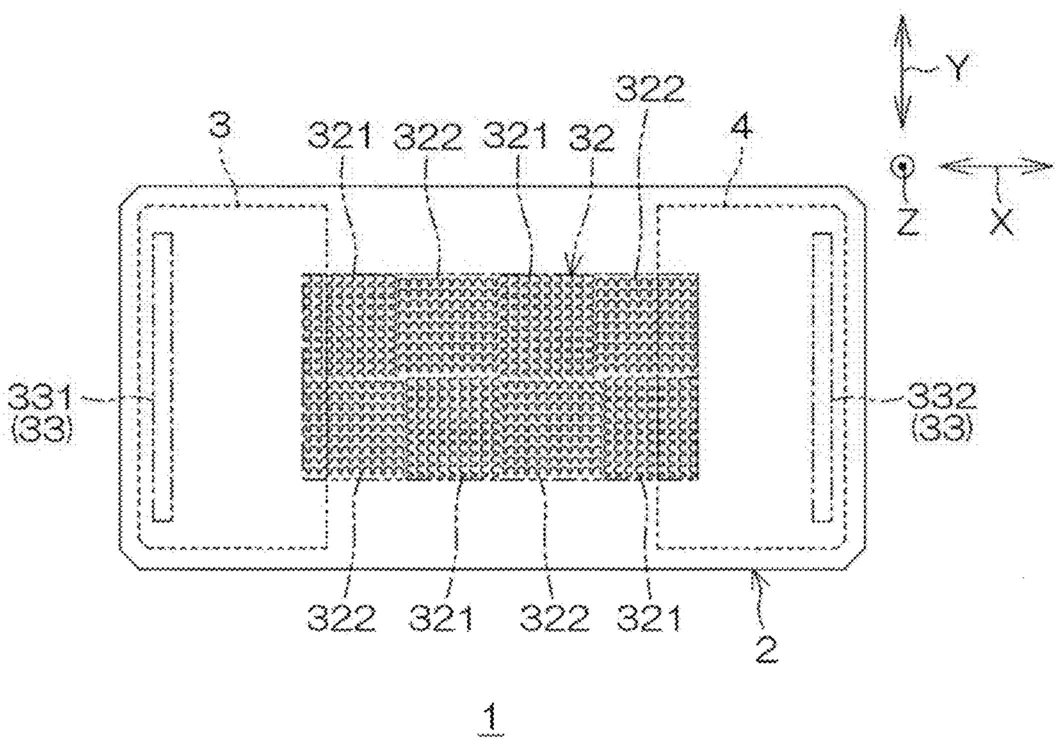
FIG. 14 is a diagram illustrating a variation example of the chip part
Figure 15:
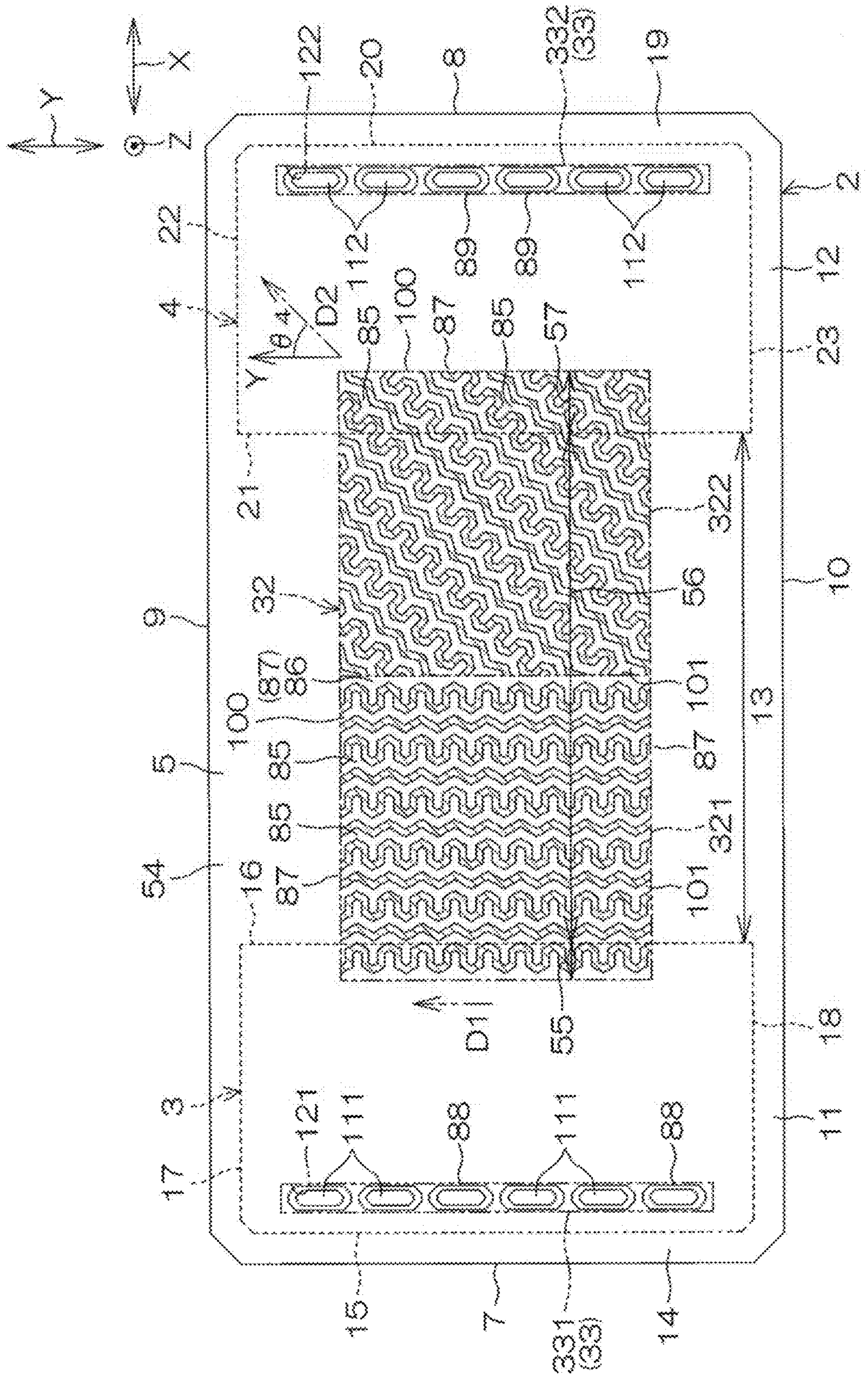
FIG. 15 is a diagram illustrating a variation example of the chip part
Figure 16:
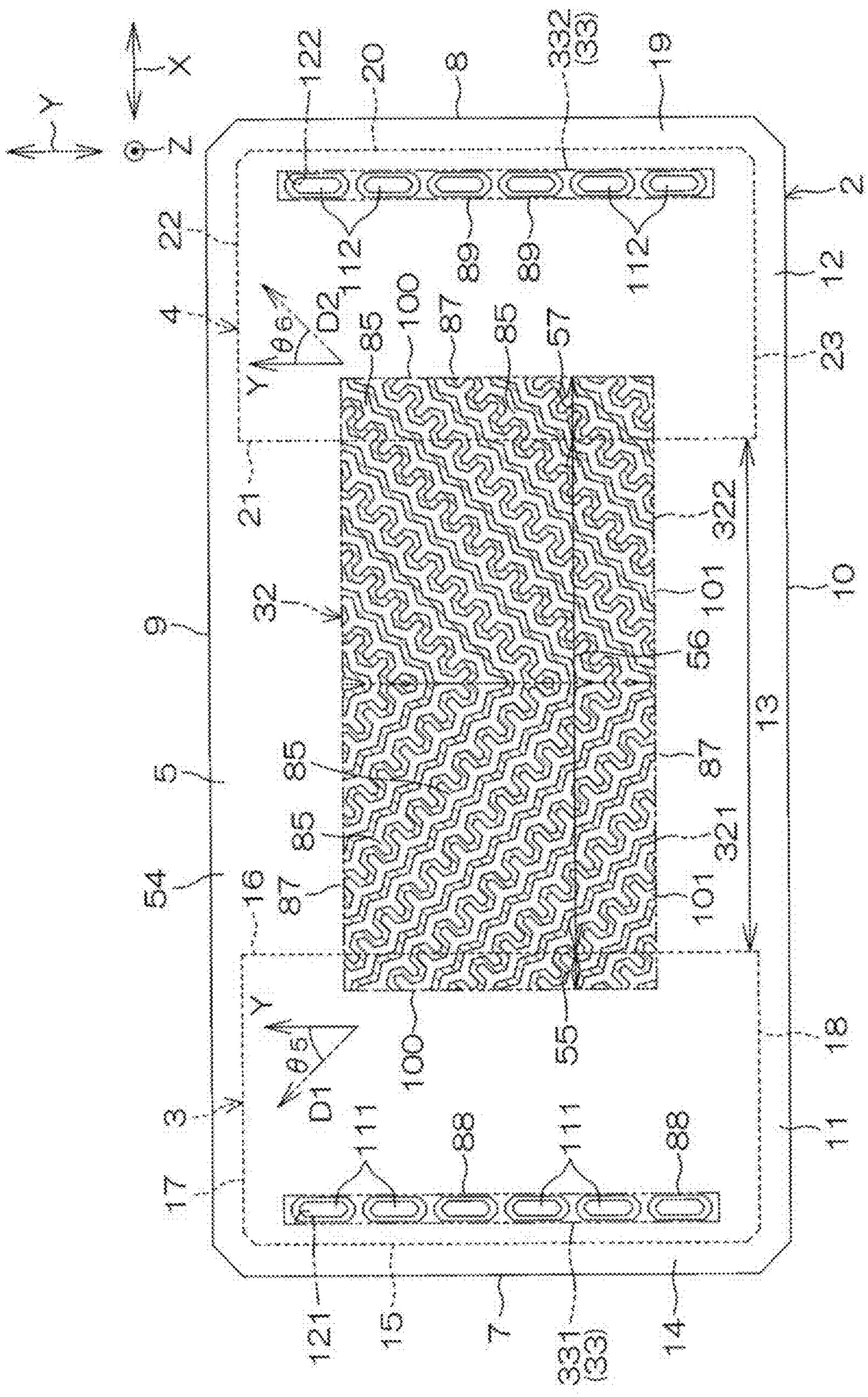
FIG. 16 is a diagram illustrating a variation example of the chip part
Figure 17:
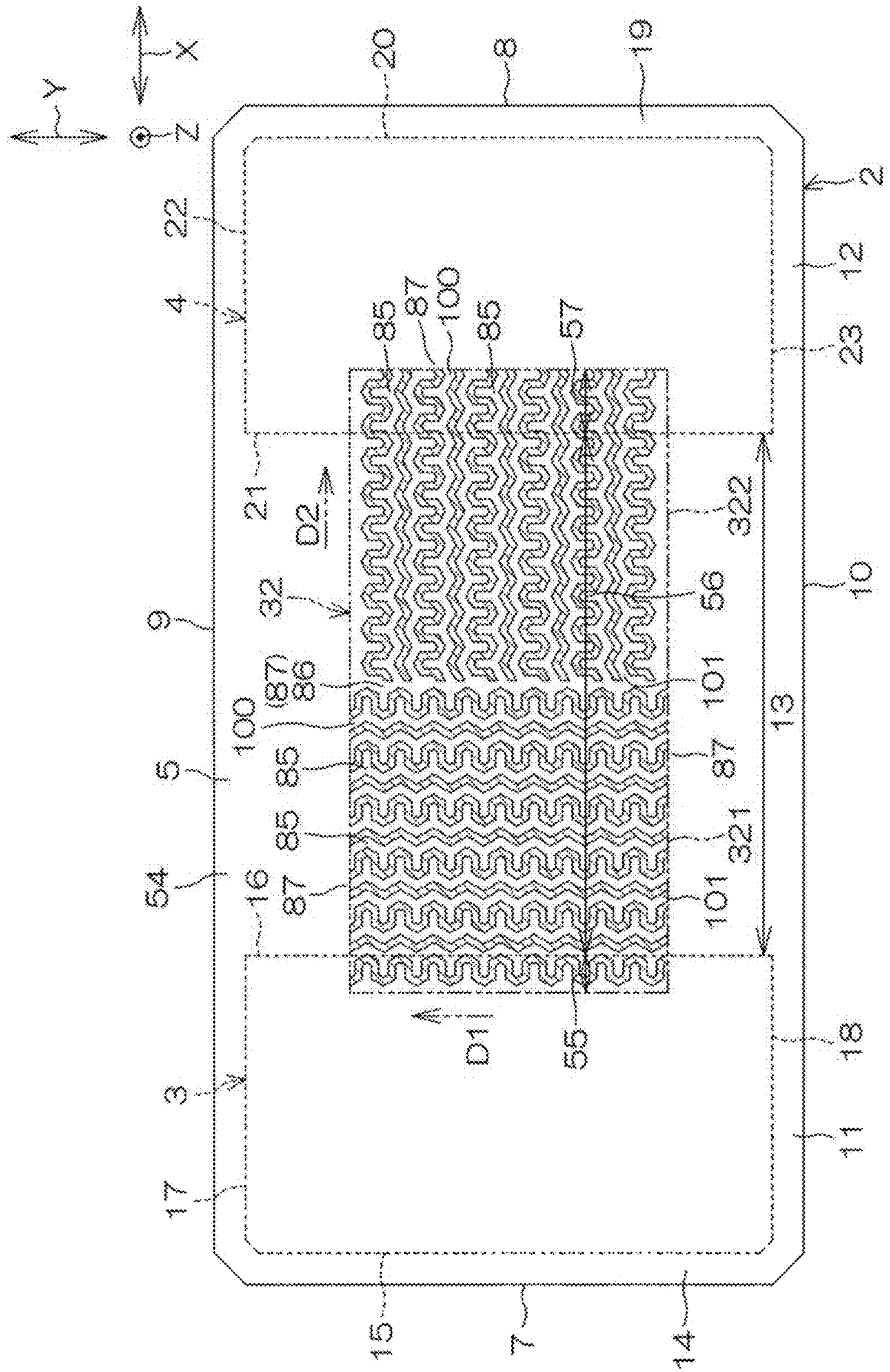
FIG. 17 is a diagram illustrating a variation example of the chip part

FIG. 12 to FIG. 17 shows diagrams illustrating variation examples of the chip part 1. FIG. 12 and FIG. 15 to FIG. 17 shows top views corresponding to FIG. 7. FIG. 13 and FIG. 14 show bottom views for illustratively representing the top view of FIG. 7. More specifically, FIG. 12 to FIG. 14 represent variation examples of the numbers of the capacitor portions included in the capacitor portion 32. FIG. 15 and FIG. 17 represent variation examples of the first lengthwise direction D1 of the first capacitor portion 321 and the second lengthwise direction D2 of the second capacitor portion 322. FIG. 17 represents a variation example in which the diode portion 33 can be omitted. Moreover, in FIG. 12 to FIG. 17, the required constituting elements and the reference symbols and numerals are extracted and shown.

Referring to FIG. 12, the capacitor portion 32 may also include a pair of first capacitor portions 321 and a pair of second capacitor portions 322. In this case, the pair of first capacitor portions 321 and the pair of second capacitor portions 322 may be alternately arranged in the plan view. In other words, for example, in the capacitor portion 32 that is a quadrilateral in the plan view, the pair of first capacitor portions 321 may be arranged in a relationship of being located at diagonal positions from each other at positions of a pair of first diagonal corners 140, and the pair of second capacitor portions 322 may be arranged in a relationship of being located at diagonal positions from each other at positions of a pair of second diagonal corners 141.

Next, referring to FIG. 13, the capacitor portion 32 may also include three first capacitor portions 321 and three second capacitor portions 322, which add up to a total of six capacitor portions. In this case, the three first capacitor portions 321 and the three second capacitor portions 322 may be alternately arranged in the plan view. In other words, when the second direction Y of the surface of the paper is set as a top-down direction, the first capacitor portions 321 and the second capacitor portions 322 may be alternately arranged at top-down swapped positions.

Next, referring to FIG. 14, the capacitor portion 32 may also include four first capacitor portions 321 and four second capacitor portions 322, which add up to a total of eight capacitor portions. In this case, the four first capacitor portions 321 and the four second capacitor portions 322 may be alternately arranged in the plan view. In other words, when the second direction Y of the surface of the paper is set as a top-down direction, the first capacitor portions 321 and the second capacitor portions 322 may be alternately arranged at top-down swapped positions.

Next, referring to FIG. 15, the first lengthwise direction D1 of the first capacitor portion 321 and the second lengthwise direction D2 of the second capacitor portion 322 may be directions non-orthogonal to each other. For example, the first lengthwise direction D1 may be a direction along the second direction Y (the widthwise direction of the substrate 2), and the second direction D2 may be a direction inclined relative to both of the first direction D1 and the second direction D2 (for example, a direction inclined at an angle $\theta_{4=45}$° relative to the second direction D2).

Next, referring to FIG. 16, the first lengthwise direction D1 of the first capacitor portion 321 and the second lengthwise direction D2 of the second capacitor portion 322, although being directions orthogonal to each other, may be non-orthogonal to the first direction X (the lengthwise direction of the substrate 2) or the second direction Y (the widthwise direction of the substrate 2). For example, the first lengthwise direction D1 and the second direction D2 may be directions inclined relative to both the first direction X and the second direction Y. In FIG. 16, the first lengthwise direction D1 is a direction inclined counterclockwise at an angle $\theta_5$=45° relative to the second direction Y, and the second lengthwise direction D2 is a direction inclined clockwise at an angle $\theta_6$=45° relative to the second direction Y.

Next, referring to FIG. 17, the chip part 1 is not necessarily a composite component in which both the capacitor portion 32 and the diode 33 are mounted on the substrate 2, and may also be a chip capacitor in which the diode portion 33 is omitted.

Feature 2 of the Embodiments of the Present Disclosure (1) Effects of the Lower Contact Portion 40 and the Upper Contact Portion 42 the Present Disclosure According to the chip part 1, as shown in FIG. 5, the lower contact portion 40 includes, in addition to the second lower contact portion 75 in the lower region of the first external electrode 3, the first lower contact portion 74 formed at the lower electrode 34 (the first portion 64) between the first external electrode 3 and the second external electrode 4. Moreover, the upper electrode 42 is formed covering substantially the entirety of the capacitor portion 32 between the first external electrode 3 and the second external electrode 4. Accordingly, the contact area between the lower contact portion 40 and the upper contact portion 42 is increased, hence providing the chip part 1 with outstanding electrical characteristics. As an example of evaluation results of electrical characteristics, quality factor (Q) values and series resistances Rs of chip parts S1 to S3 serving as samples 1 to 3 are compared.

Figure 18:
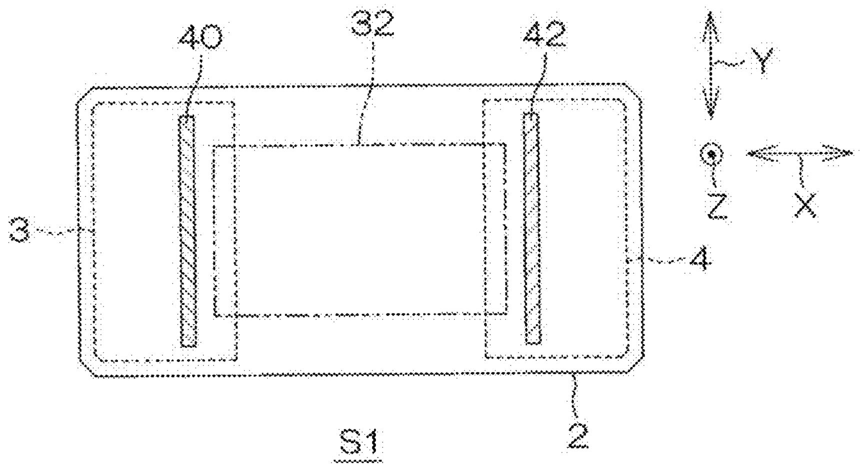
FIG. 18 is a schematic top view of a chip part of sample 1
Figure 19:
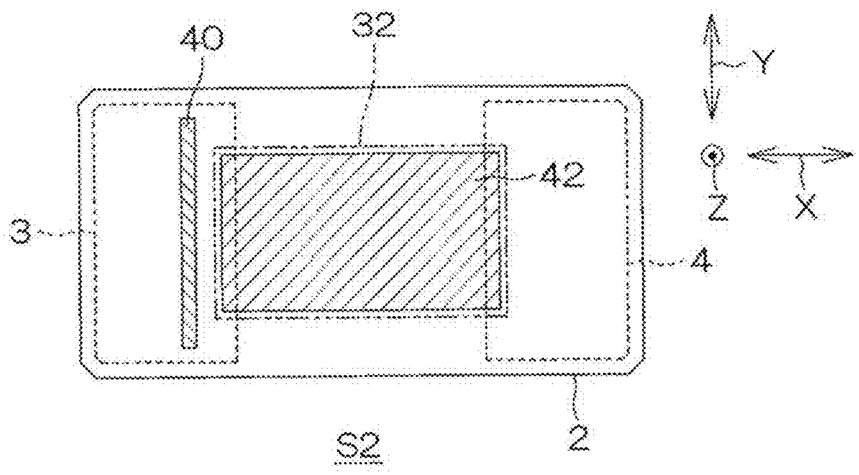
FIG. 19 is a schematic top view of a chip part of sample 2
Figure 20:
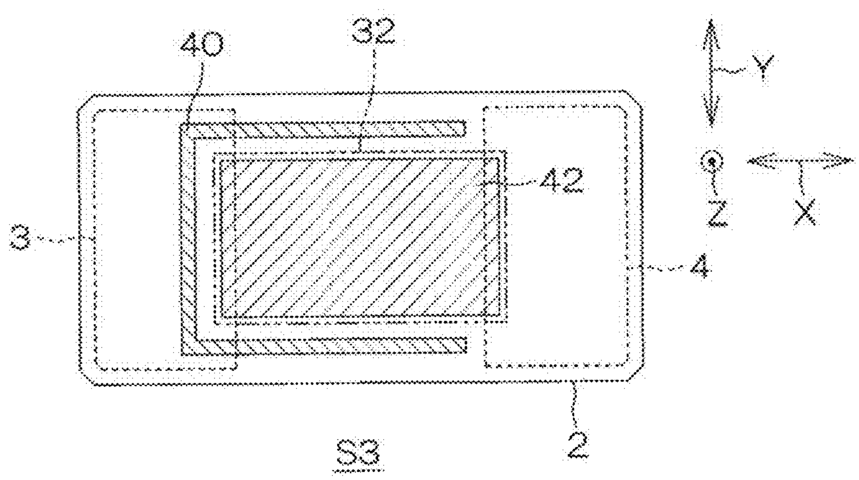
FIG. 20 is a schematic top view of a chip part of sample 3

FIG. 18 to FIG. 20 show schematic top views of the chip parts S1 to S3 serving as the samples 1 to 3. In FIG. 18 to FIG. 20, images of the upper contact portion 40 and the upper contact portion 42 needed for illustrating the evaluation results of electrical characteristics are primarily extracted from constituting elements and shown.

Referring to FIG. 18, the chip part S1 of the sample 1 differs from the chip part 1 in that, the lower contact portion 40 is formed only in the lower region of the first external electrode 3. Moreover, the chip part S1 of the sample 1 further differs from the chip part 1 in that, the upper contact portion 42 is formed only in the lower region of the second external electrode 4. In short, the lower contact portion 40 and the upper contact portion 42 of the chip part S1 respectively form strip shapes extending along the second direction Y in the lower regions of the first external electrode 3 and the second external electrode 4.

Referring to FIG. 19, the chip part S2 of the sample 2 differs from the chip part 1 in that, the lower contact portion 40 is formed only in the lower region of the first external electrode 3. In short, the lower contact portion 40 of the chip part S2 forms a strip shape extending along the second direction Y in the lower region of the first external electrode 3. On the other hand, the shape (pattern) of the upper contact portion 42 of the chip part S2, the same as the chip part 1, forms in the region substantially covering the entirety of the capacitor portion 32.

Referring to FIG. 20, the shapes (patterns) of the lower contact portion 40 and the upper contact portion 42 of the chip part S3 are the same as those of the chip part 1. That is to say, the lower contact portion 40 forms substantially a U shape surrounding the capacitor portion 32, and the upper contact portion 42 is formed in the region substantially covering the entirety of the capacitor portion 32.

Figure 21:
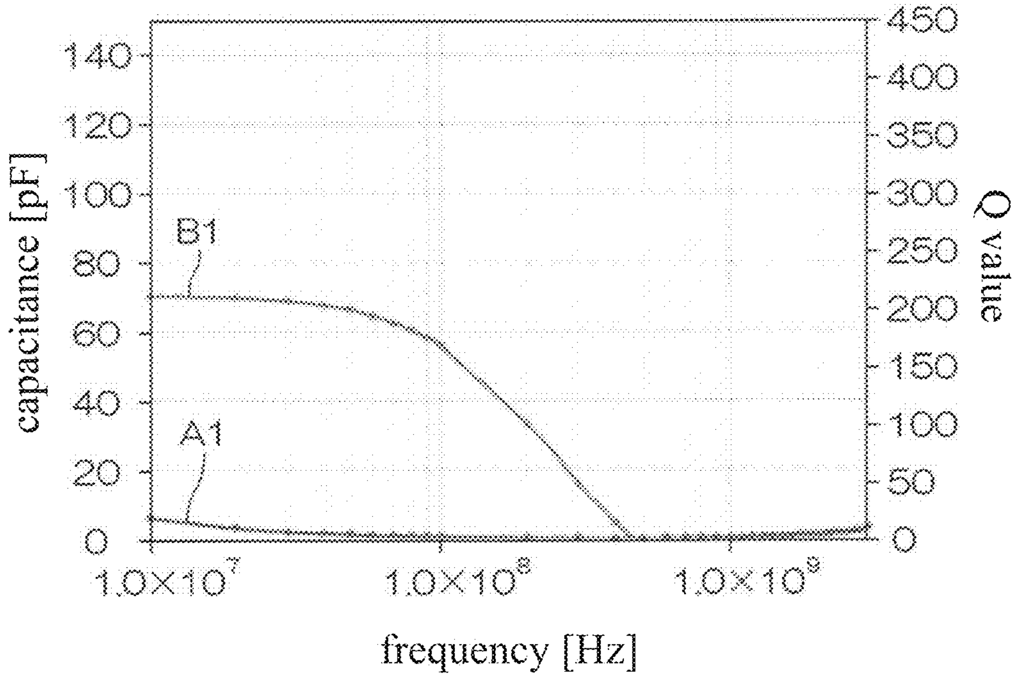
FIG. 21 is a diagram of evaluation results of a Q value and a capacitance value of sample 1
Figure 22:
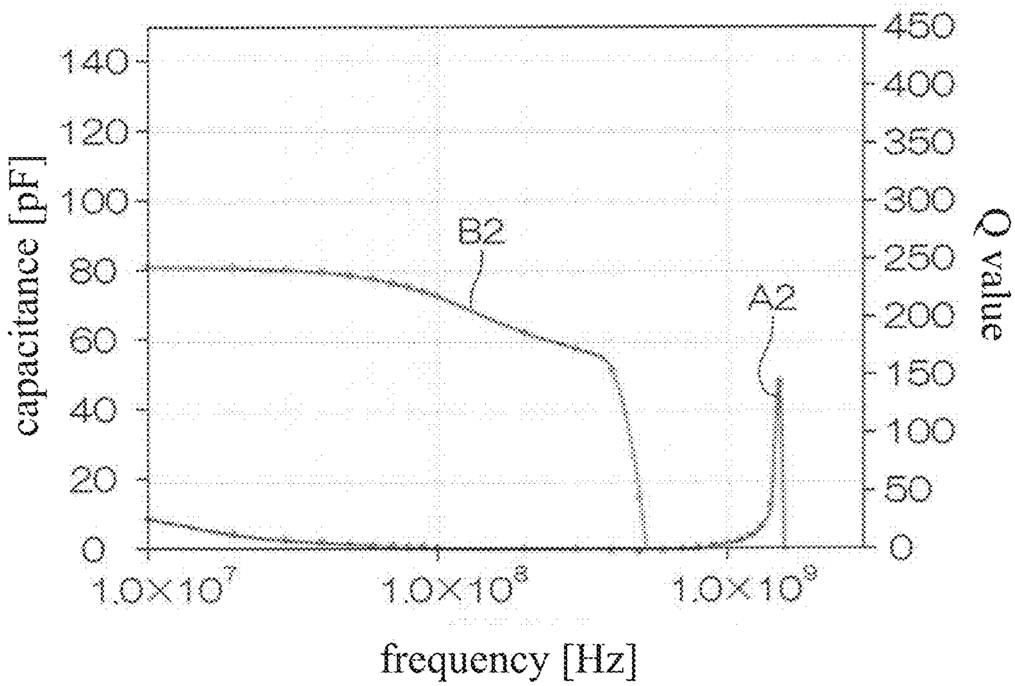
FIG. 22 is a diagram of evaluation results of a Q value and a capacitance value of sample 2
Figure 23:
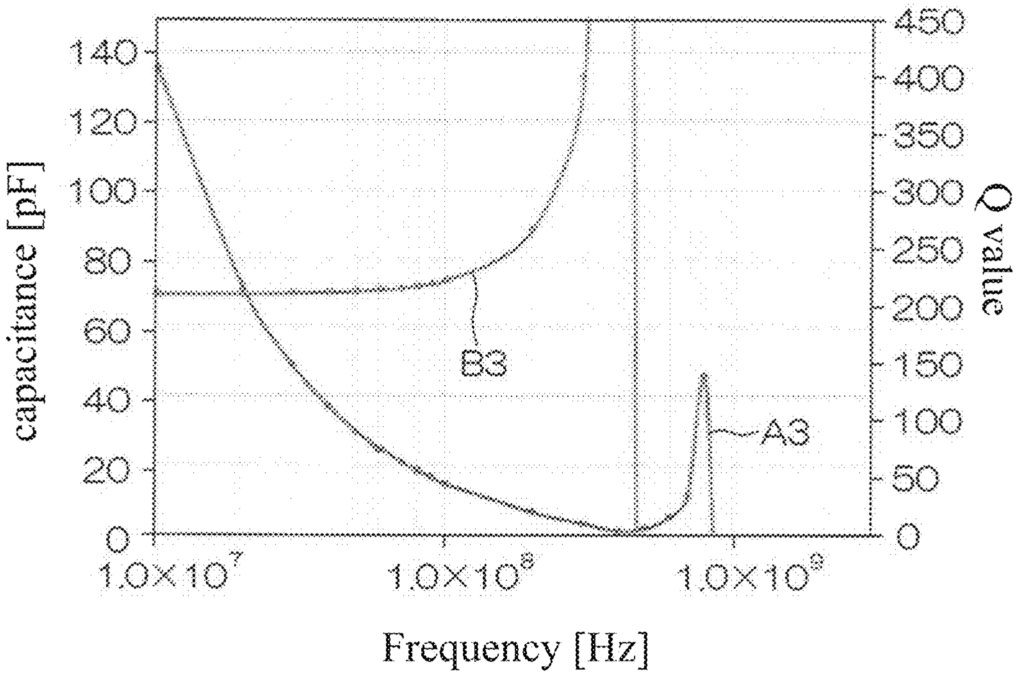
FIG. 23 is a diagram of evaluation results of a Q value and a capacitance value of sample 3

Then, by simulating and calculating the Q values and capacitance values of the chip parts S1 to S3, the results in FIG. 21 to FIG. 23 are obtained.

FIG. 21 to FIG. 23 respectively represent diagrams of evaluation results of the Q values and the capacitance values of the sample parts S1 to S3 (the samples 1 to 3). In FIG. 21 to FIG. 23, the horizontal axis represents the frequency in Hz, the right vertical axis represents the Q value, and the left vertical axis represents the capacitance value in pF. Curves A1 to A3 and B1 to B3 are respectively shown in FIG. 21 to FIG. 23. The curves A1 to A3 respectively represent the Q values of the chip parts S1 to S3 when the frequencies of the currents flowing through the chip parts S1 to S3 increase from 0 Hz to approximately 1 GHz. The curves B1 to B3 respectively represent the capacitance values of the chip parts S1 to S3 when the frequencies of the currents flowing through the chip parts S1 to S3 increase from 0 Hz to approximately 1 GHz.

It is known by comparing the curves A1 to A3 in FIG. 21 to FIG. 23, compared to the chip part S1, the Q values of the chip part S2 and the chip part S3 are increased. For example, comparing the Q values when the frequency is 10 MHz ($1\times10^7$ Hz), the results indicate that the Q value of the chip part S2 (the curve A2) is approximately 1.5 times of the Q value of the chip part S1 (the curve A1), and the Q value of the chip part S3 (the curve A3) is approximately 4 times of the Q value of the chip part S1 (the curve A1). It is known that the Q value (the curve A3) of the chip part S3 is particularly outstanding.

It is known by comparing the curves B1 to B3 in FIG. 21 to FIG. 23, compared to the chip part S1, the capacitance values of the chip part S2 and the chip part S3 are relatively stable in size. For example, comparing the capacitance values when the frequency is within the 10 MHz ($1\times10^7$ Hz) to 100 MHz ($1\times10^8$ Hz) frequency band, the results indicate that the variation range of the capacitance value of the chip part S2 (the curve B2) and the variation range of the capacitance value of the chip part S3 (the curve B3) are smaller than the variation range of the capacitance value of the chip part S1 (the curve B1). In particular, the capacitance value of the chip part S3 (the curve B3) is almost not attenuated and is kept constant within the 10 MHz ($1\times10^7$ Hz) to 100 MHz ($1\times10^8$ Hz) frequency band.

Figure 24:
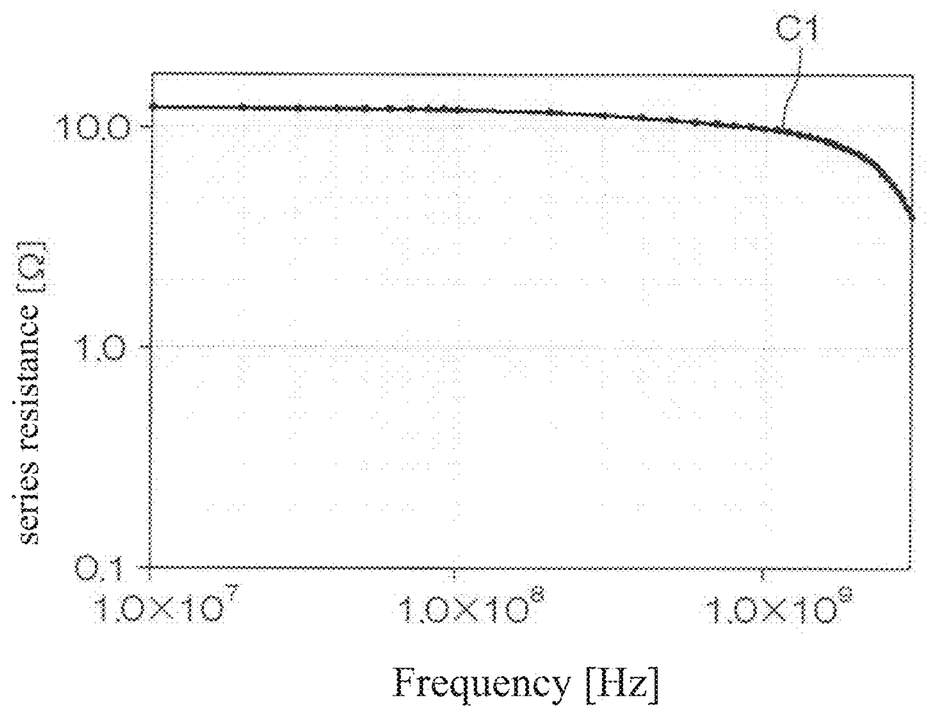
FIG. 24 is a diagram of evaluation results of a series resistance of sample 1
Figure 25:
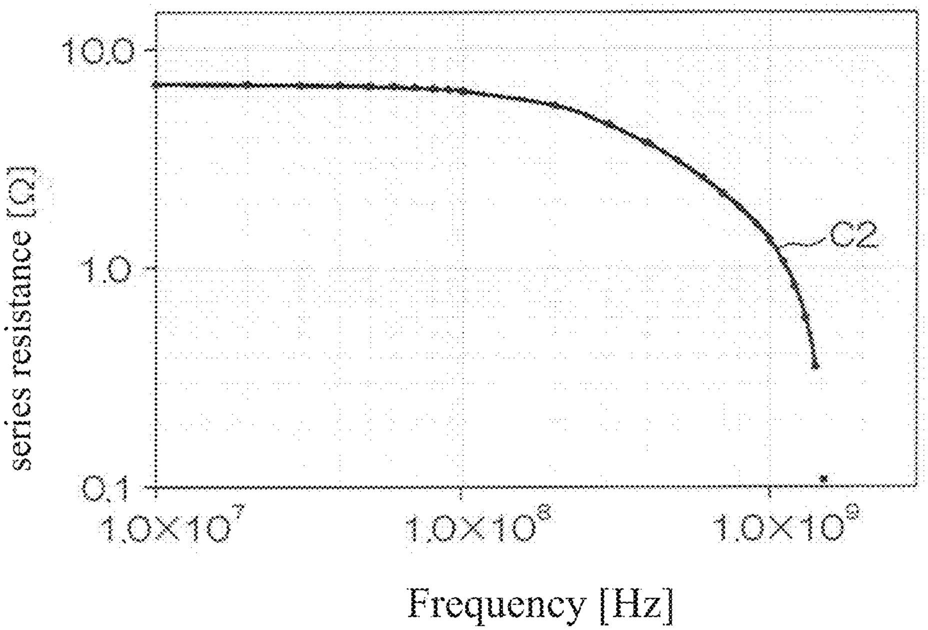
FIG. 25 is a diagram of evaluation results of a series resistance of sample 2
Figure 26:
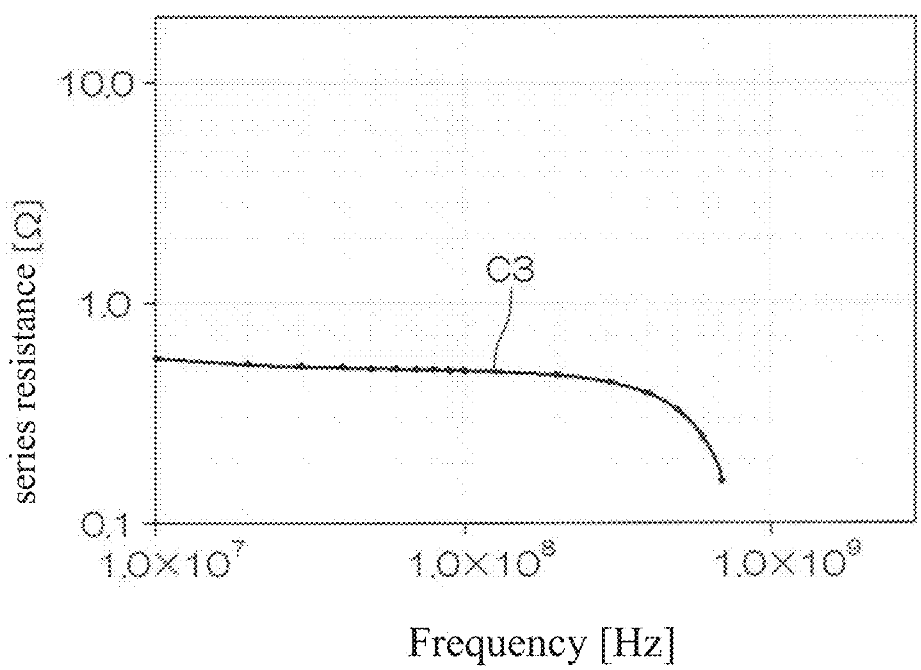
FIG. 26 is a diagram of evaluation results of a series resistance of sample 3

Next, by simulating and calculating the series resistances of the chip parts S1 to S3, the results in FIG. 24 to FIG. 26 are obtained.

FIG. 24 to FIG. 26 respectively represent diagrams of evaluation results of the series resistances of the sample parts S1 to S3 (the samples 1 to 3). In FIG. 24 to FIG. 26, the horizontal axis represents the frequency in Hz, and the vertical axis represents the resistance value in Ω. Curves C1 to C3 are respectively shown in FIG. 24 to FIG. 26. The curves C1 to C3 respectively represent the series resistances of the chip parts S1 to S3 when the frequencies of the currents flowing through the chip parts S1 to S3 increase from 0 Hz to approximately 1 GHz.

It is known by comparing the curves C1 to C3 in FIG. 24 to FIG. 26, compared to the chip part S1, the series resistances of the chip part S2 and the chip part S3 are reduced. For example, comparing the series resistance values when the frequency is within the 10 MHz ($1\times10^7$ Hz) frequency band, the results indicate that the series resistance value of the chip part S2 (the curve C2) is approximately ½ of the series resistance value of the chip part S1 (the curve C1), and the series resistance value of the chip part S3 (the curve C3) is approximately 1/21 of the series resistance value of the chip part S1 (the curve C1). It is known that the series resistance value of the chip part S3 (the curve C3) is particularly low.

(2) Variation Examples of the Lower Contact Portion 40

Figure 27:
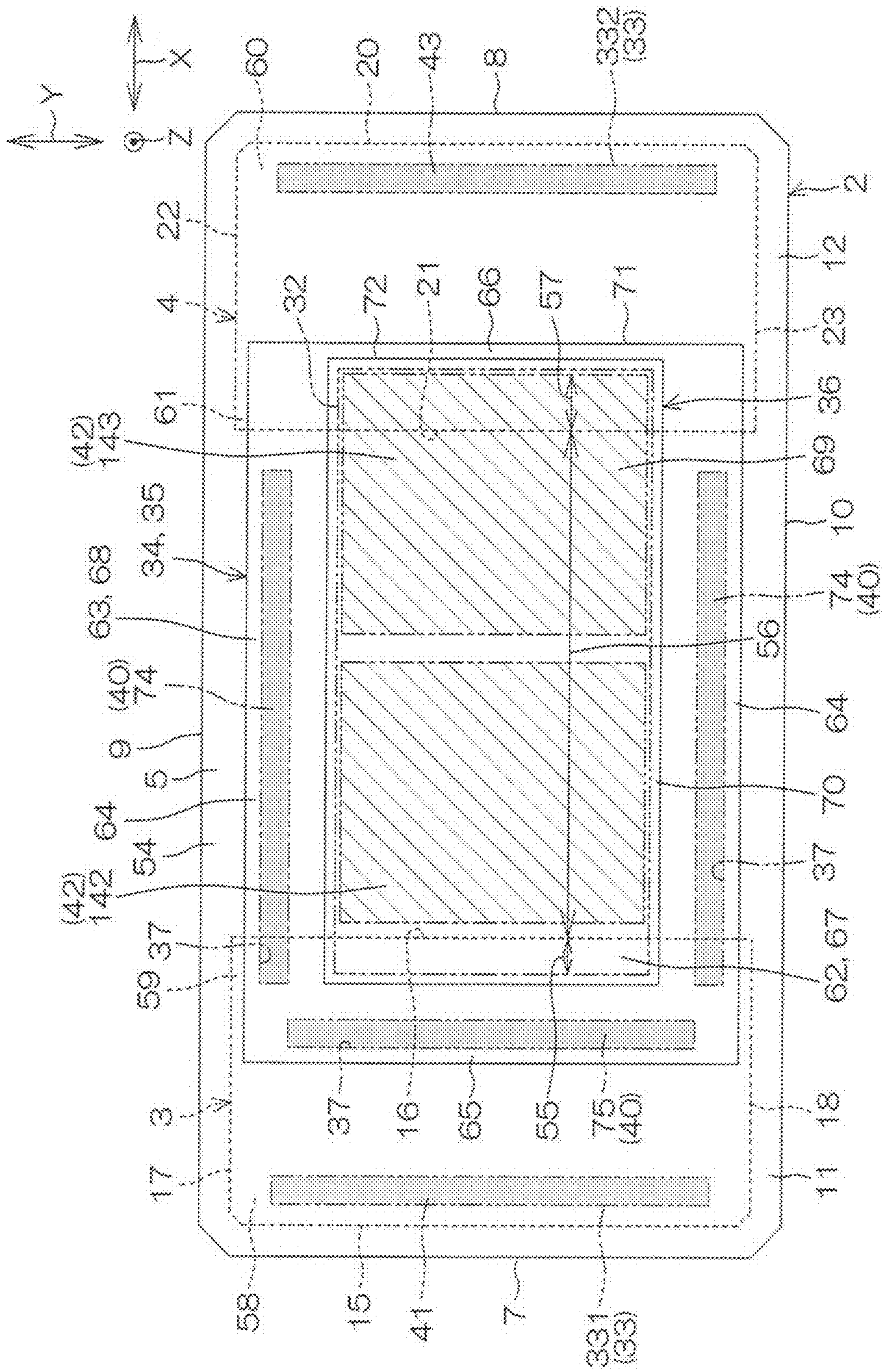
FIG. 27 is a diagram illustrating a variation example of the chip part
Figure 28:
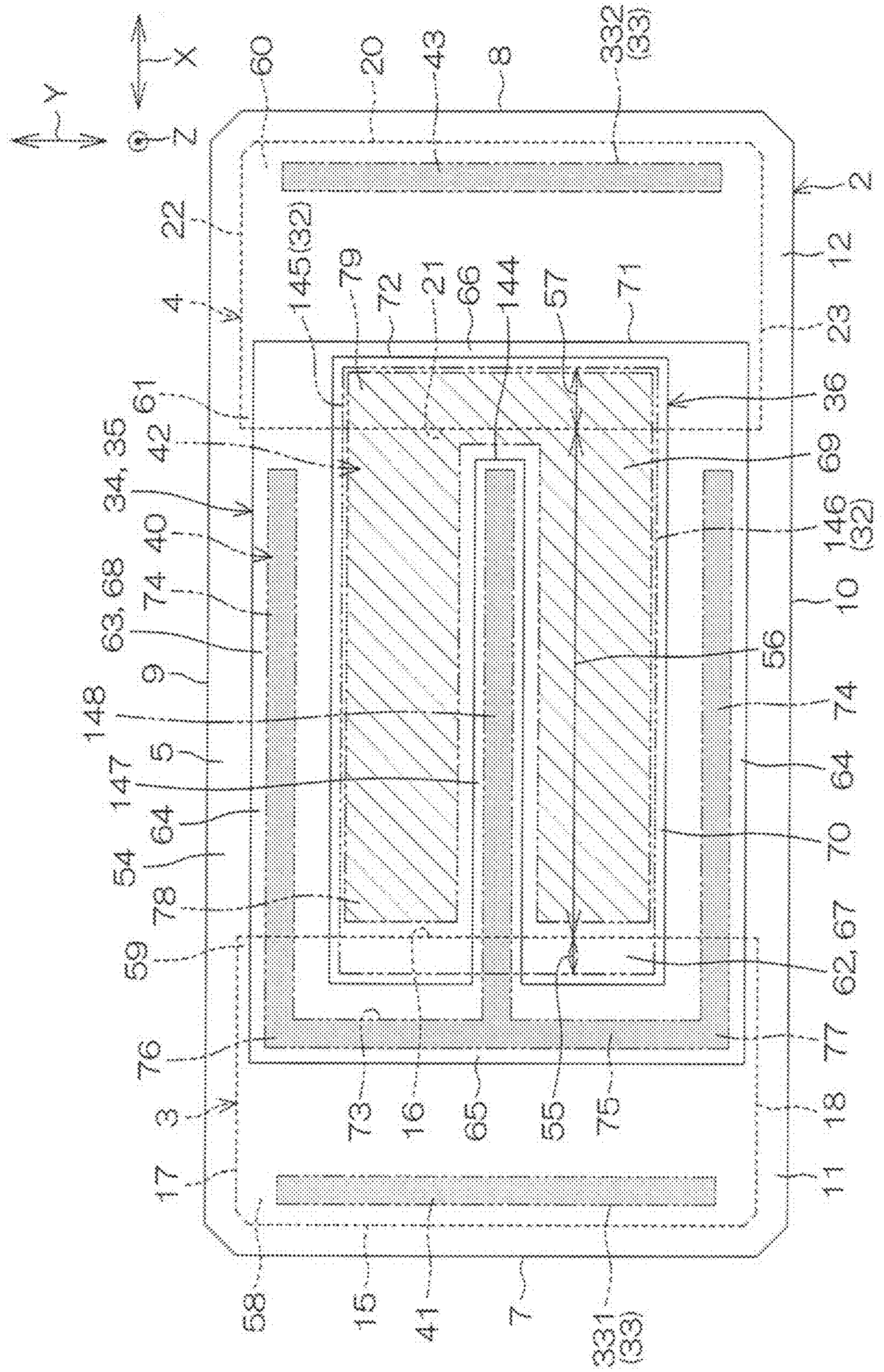
FIG. 28 is a diagram illustrating a variation example of the chip part
Figure 29:
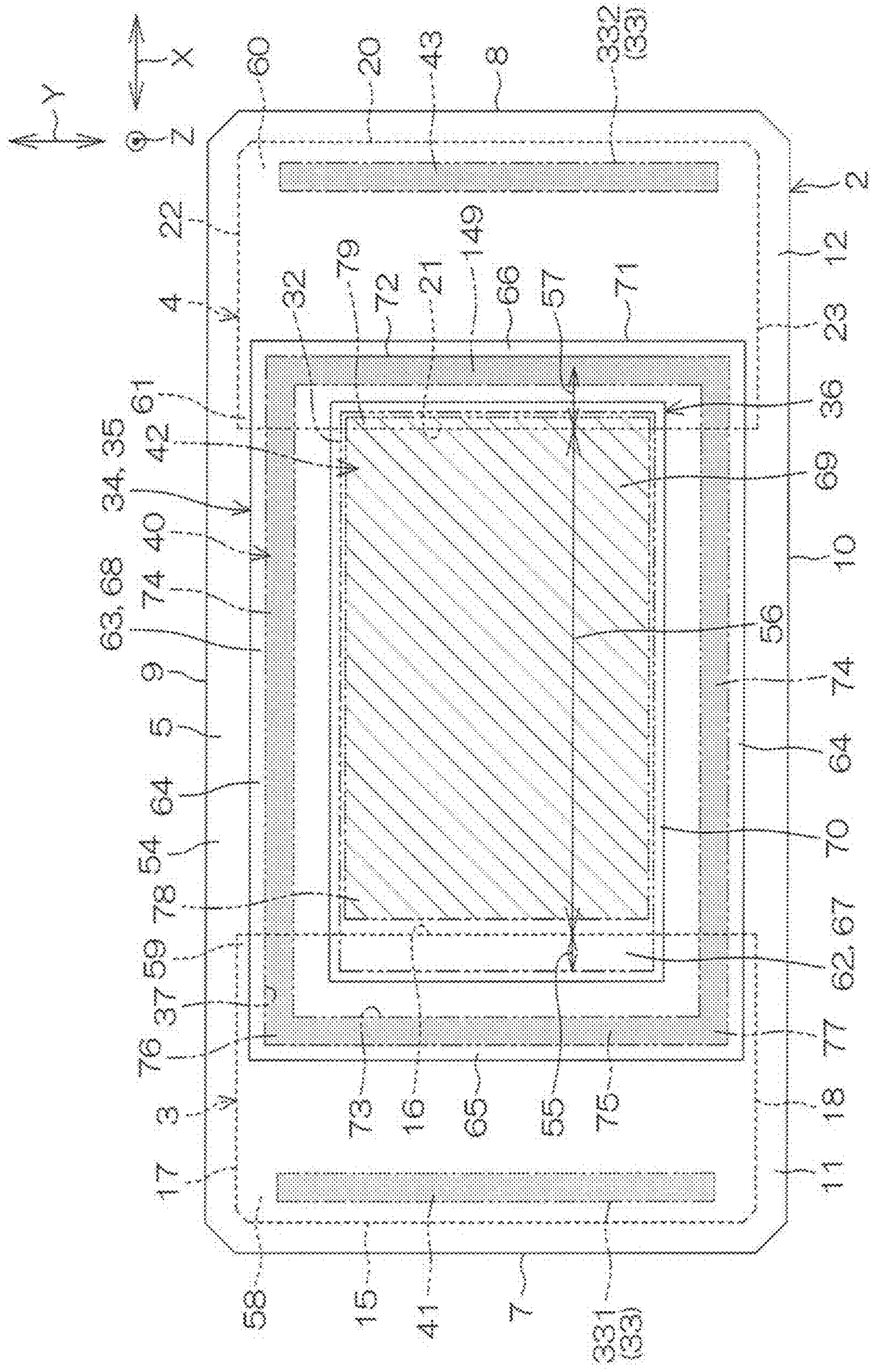
FIG. 29 is a diagram illustrating a variation example of the chip part
Figure 30:
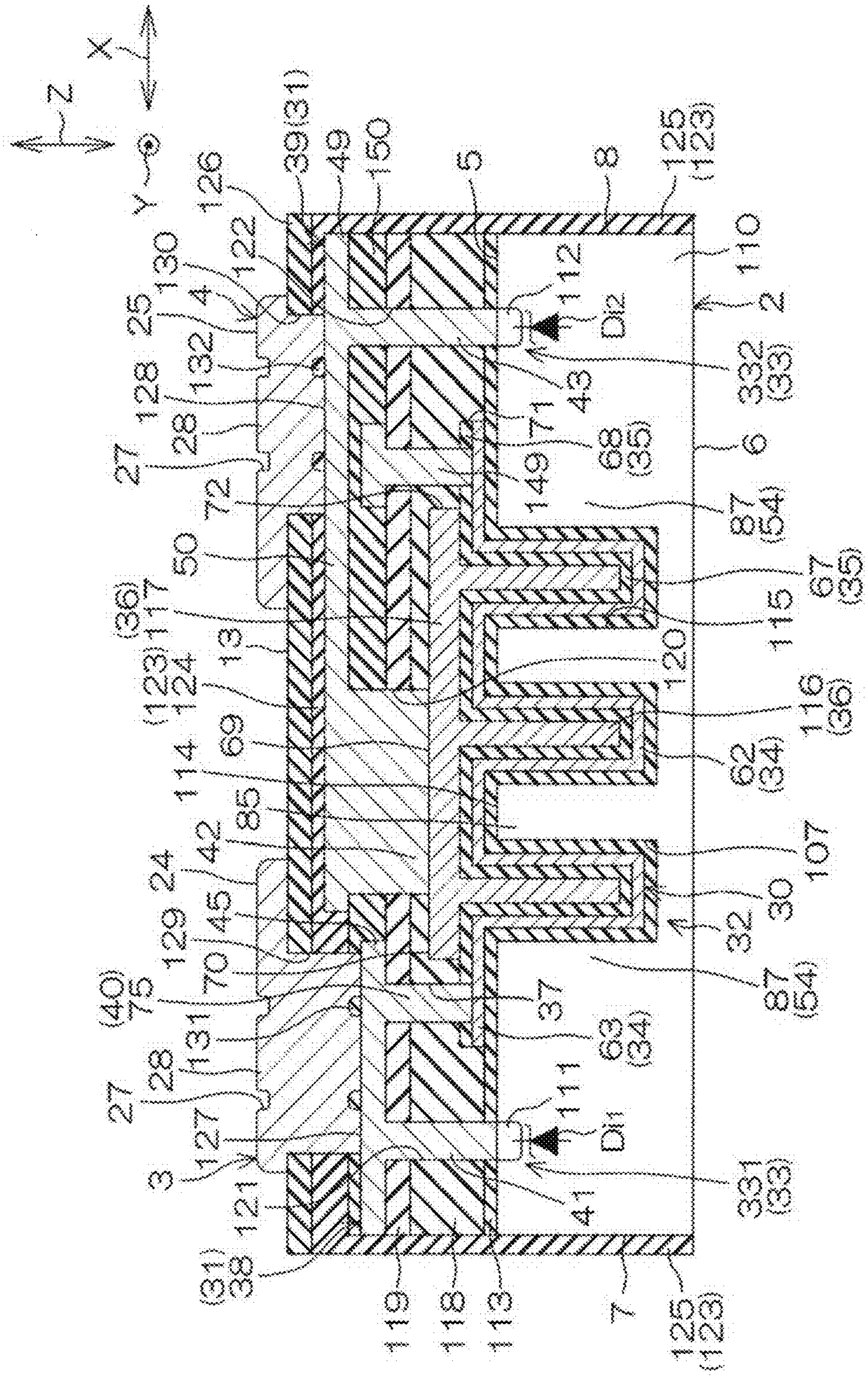
FIG. 30 is a diagram illustrating a variation example of the chip part
Figure 31:
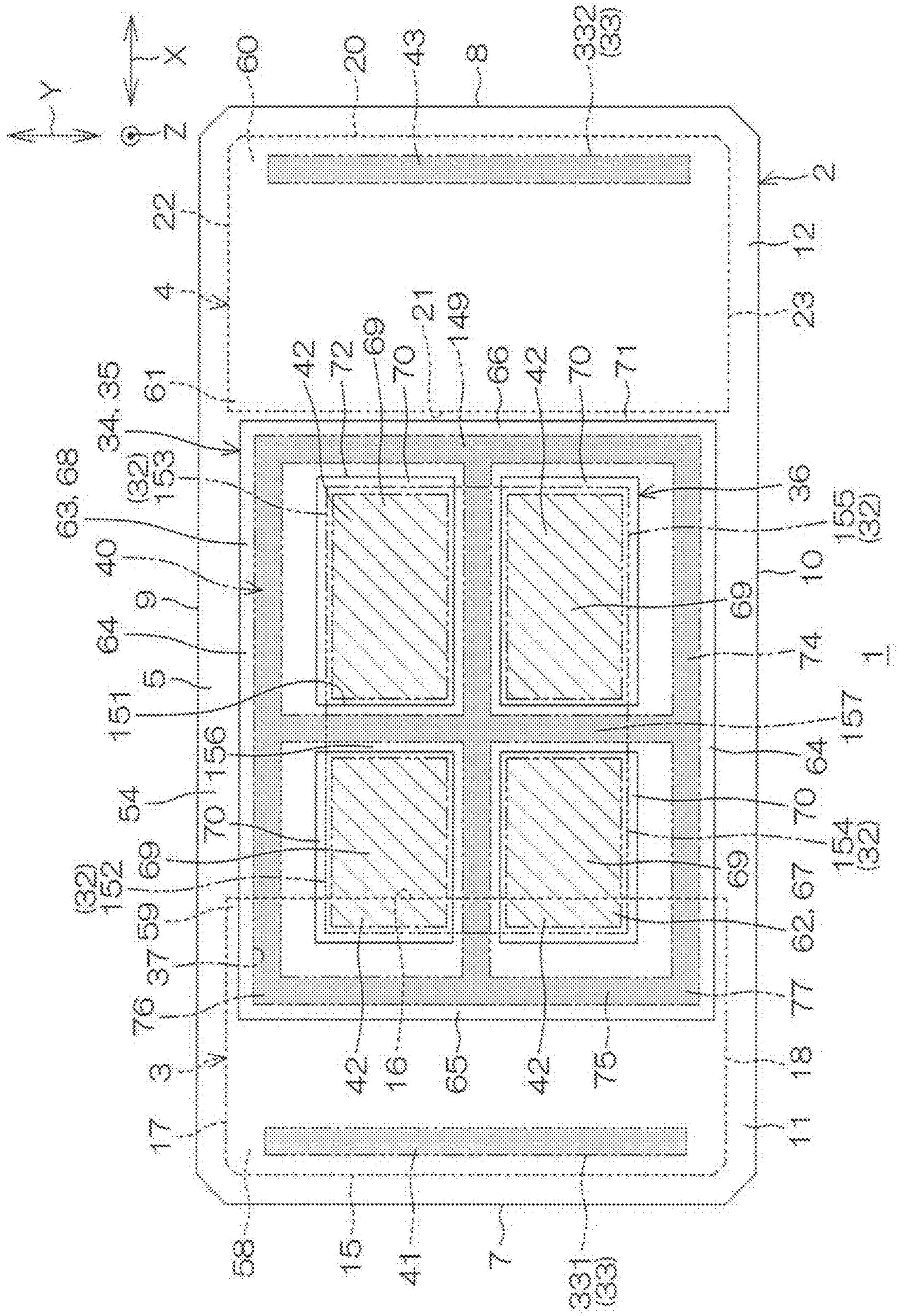
FIG. 31 is a diagram illustrating a variation example of the chip part
Figure 32:
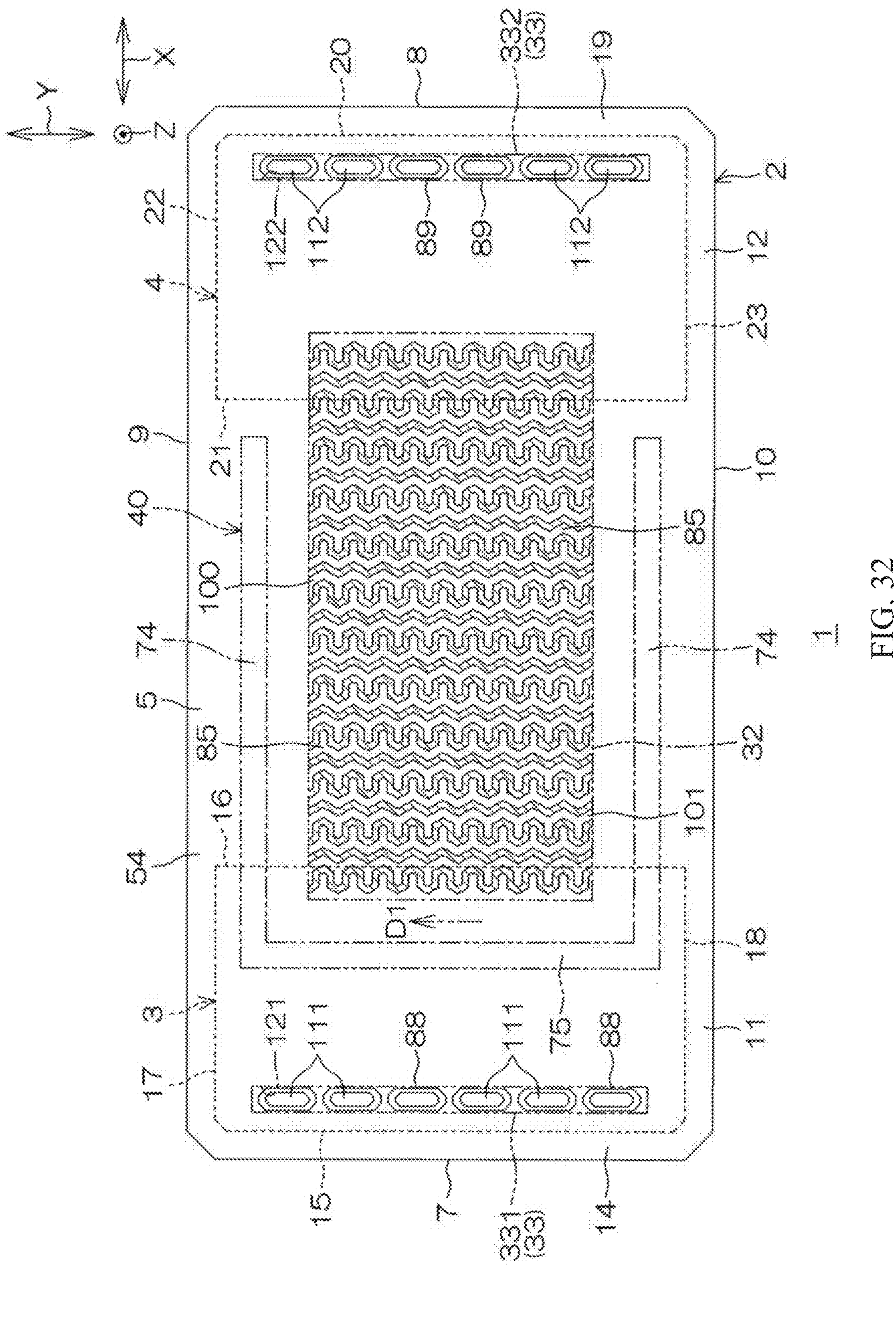
FIG. 32 is a diagram illustrating a variation example of the chip part
Figure 33:
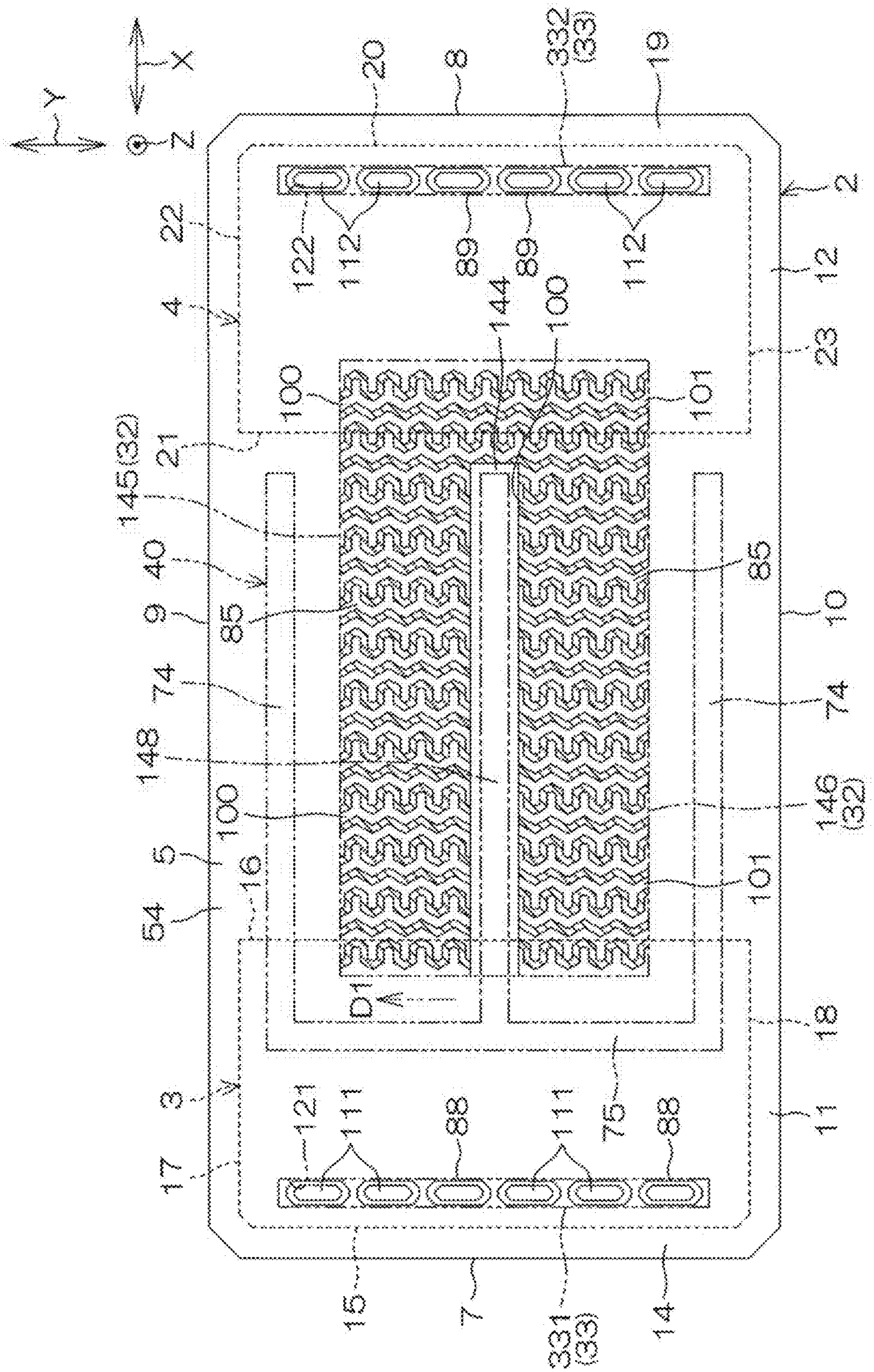
FIG. 33 is a diagram illustrating a variation example of the chip part
Figure 34:
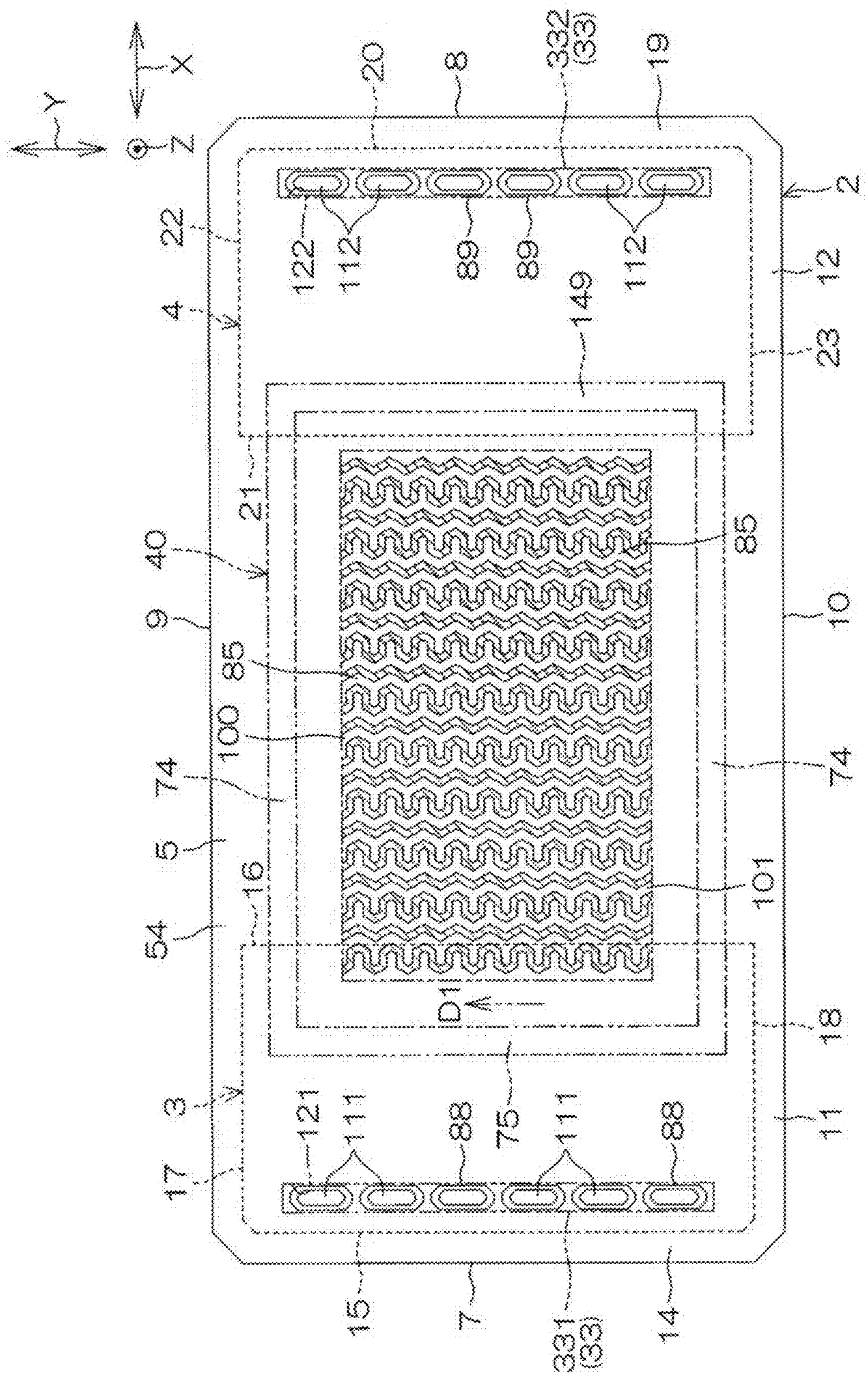
FIG. 34 is a diagram illustrating a variation example of the chip part
Figure 35:
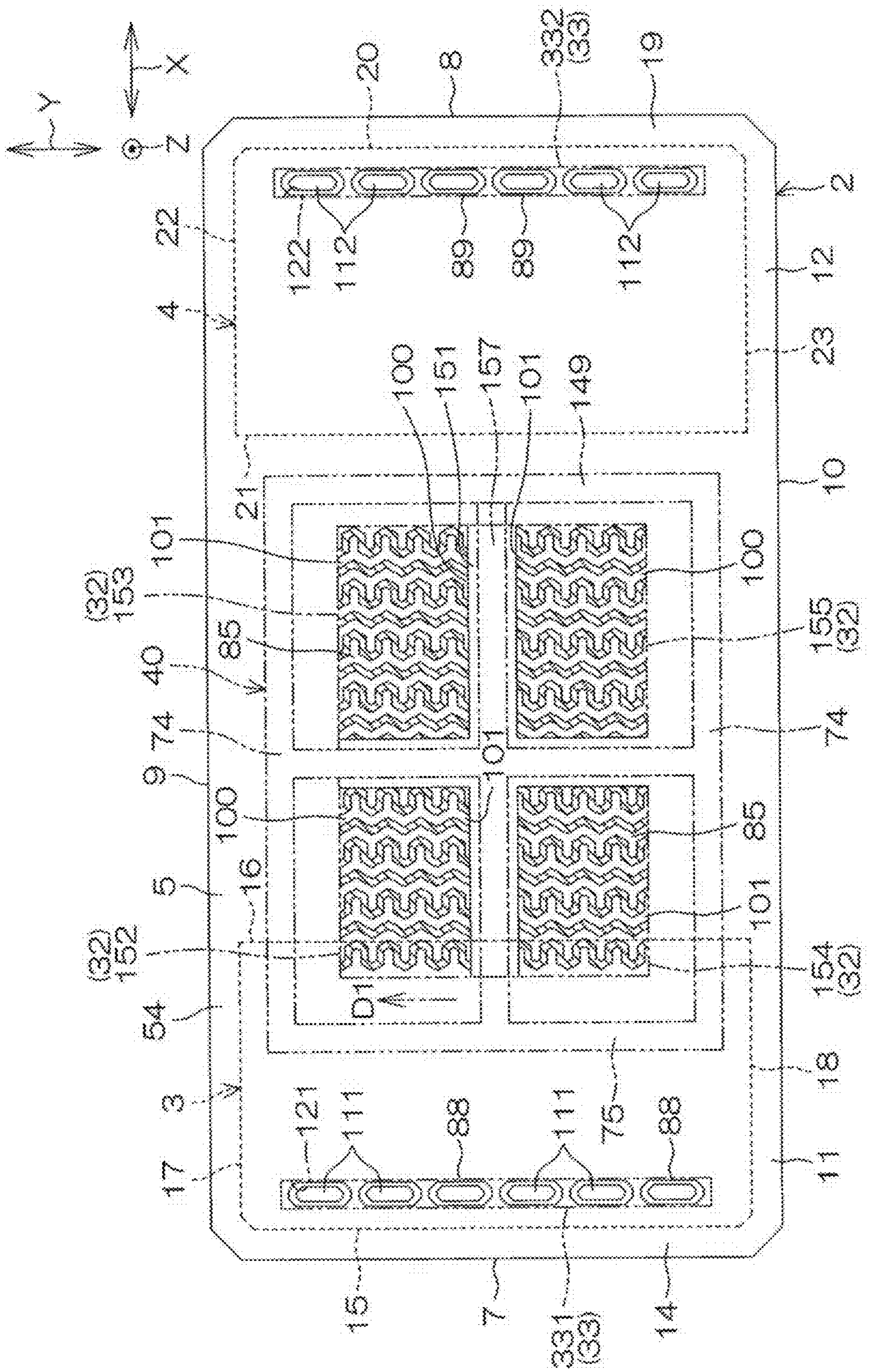
FIG. 35 is a diagram illustrating a variation example of the chip part

FIG. 27 to FIG. 31 shows diagrams illustrating variation examples of the chip part 1. FIG. 27 to FIG. 29 shows top views corresponding to FIG. 5. FIG. 30 shows a section diagram corresponding to FIG. 9. FIG. 31 shows a top view corresponding to FIG. 5. More specifically, FIG. 27 to FIG. 31 represent variation examples of the shape (pattern) of the lower contact portion 40. Moreover, in FIG. 27 to FIG. 31, the required constituting elements and the reference symbols and numerals are extracted and shown.

First of all, referring to FIG. 27, in the lower contact portion 40, the first lower contact portion 74 and the second lower contact portion 75 may also be formed to be non-integral. For example, the two contact portions may be disconnected in the lower region of the first external electrode 3. Moreover, the upper contact portion 42 may also be divided into the first lower contact portion 142 and the second lower contact portion 143 in the region overlapping the capacitor portion 32. The first lower contact portion 142 and the second lower contact portion 143 in overall cover the entirety of the capacitor portion 32.

Next, referring to FIG. 28, the substrate body portion 54 may further include a linear portion 144 that extends linearly from the lower region of the first external electrode 3 toward the second external electrode 4. The capacitor portion 32 may also be, with the linear portion 144 spaced in between in the second direction Y, separated into a first portion 145 on the side of the first lower contact portion 74 and a second portion 146 on the side of the first lower contact portion 74. The first portion 145 and the second portion 146 may also be connected in the lower region of the second external electrode 4. Accordingly, the capacitor portion 32 may also form a substantially U shape in the plan view.

The lower electrode 34 may also include a fourth portion 147 drawn out from the capacitor portion 32 onto the linear portion 144. The fourth portion 147 may also be covered by the capacitive film 35. The lower contact portion 40 includes a linear contact portion 148 connected to the fourth portion 147. The linear contact portion 148 integrally extends from the second lower contact portion 75 in the first direction X. Accordingly, the lower contact portion 40 includes a pair of first lower contact portions 74 and the linear contact portion 148 integrally connected perpendicularly with the second lower contact portion 75, to form a substantially U shape in the plan view.

On the other hand, the upper contact portion 42 is formed in a pattern corresponding to the capacitor portion 32 in a substantially U shape, and has a substantially U shape in the plan view.

Next, referring to FIG. 29, the lower contact portion 40 includes a third lower contact portion 149 connected to the third portion 66 of the lower electrode 34. The third lower contact portion 149 connects front ends (ends on an opposite side of the second lower contact portion 75) of a pair of first lower contact portions 74 to each other. The third lower contact portion 146 may also be formed in the lower region of the second external electrode 4. Accordingly, the lower contact portion 40, with the first lower contact portion 74, the second lower contact portion 75 and the third lower contact portion 149 integrally formed, forms a closed loop contact portion surrounding the capacitor portion 32.

In this configuration, as shown in FIG. 30, a third insulating film 150 covering the first electrode film 38 is formed on the second insulating film 119, and the second electrode film 39 is formed on the third insulating film 150. Accordingly, with the insulation provided by the third insulating film 150 between the first electrode film 38 and the second electrode film 39, the second electrode film 39 can be overlapped over the first electrode film 38 (the third lower contact portion 149), and the second extending portion 50 can extend to the upper region of the capacitor portion 32.

Next, referring to FIG. 31, the substrate body portion 54 may also include a grid portion 151 that divides the capacitor portion 32 into a plurality of portions. The capacitor portion 32 may also be separated by the grid portion 151 into a first portion 152, a second portion 153, a third portion 154 and a fourth portion 155. That is to say, the capacitor portion 32 may also be formed in window portions defined by the grids of the grid portion 151.

The lower electrode 34 may also include a fifth portion 156 drawn out from the capacitor portion 32 onto the grid portion 151. The fifth portion 156 may also be covered by the capacitive film 35. The lower contact portion 40 includes a grid contact portion 157 connected to the fifth portion 156. The grid contact portion 157 is integrally connected to the pair of first lower contact portion 74, the second lower contact portion 75 and the third lower contact portion 149.

On the other hand, the upper contact portion 42 may also be formed covering each of the first portion 152, the second portion 153, the third portion 154 and the fourth portion 155 of the capacitor portion 32.

FIG. 32 to FIG. 35 shows diagrams illustrating variation examples of the chip part 1. More specifically, in addition to representing the variation examples of the shape (pattern) of the low contact portion 40 in FIG. 27 to FIG. 31, FIG. 32 to FIG. 35 represent variation examples of the numbers of the capacitor portions included in the capacitor portion 32. FIG. 32 to FIG. 35 show top views corresponding to FIG. 7. The shapes of the lower contact portion 40 in FIG. 32 to FIG. 35 respective the same as those of the lower contact portion 40 in FIG. 7, FIG. 28, FIG. 29 and FIG. 31. Moreover, in FIG. 32 to FIG. 35, the required constituting elements and the reference symbols and numerals are extracted and shown.

Referring to FIG. 32 to FIG. 35, the capacitor portion 32 is formed by a collective body of the wall portions 85 that use a specific direction as the lengthwise direction. In FIG. 32 to FIG. 35, the lengthwise directions of the wall portions 85 forming the capacitor portion 32 are all the first direction D1. That is to say, the capacitor portions 32 in FIG. 32 to FIG. 35 are different from the capacitor portion 32 in FIG. 7, and do not include the plurality of wall portions in which the lengthwise directions of the wall portions 85 are different from each other.

Feature 3 of the Embodiments of the Present Disclosure

(1) Effects of the Diode Portion 33 of the Present Disclosure

According to the chip part 1, as shown in FIG. 7, the capacitor portion 32 and the diode portion 33 are mounted in the common substrate 2, and can thus provide the chip part 1 with an ESD protection function. Further, the diode portion 33 is disposed in the lower region of the first external electrode 3 and the second external electrode 4. Accordingly, compared to when the diode portion 33 is formed to avoid the regions of the first external electrode 3 and the second external electrode 4, the ESD protection function can be enhanced. As an example of evaluation results of ESD protection characteristics, breakdown voltages in kV of chip parts S4 to S10 of samples 4 to 10 are compared below.

FIG. 36 to FIG. 42 show schematic top views of the chip parts S4 to S10 serving as the samples 4 to 10. In FIG. 36 to FIG. 42, positions of the diode portion 33 needed for illustrating the evaluation results of ESD protection characteristics are primarily extracted from the constituting elements of the chip part 1 and shown.

Figure 36:
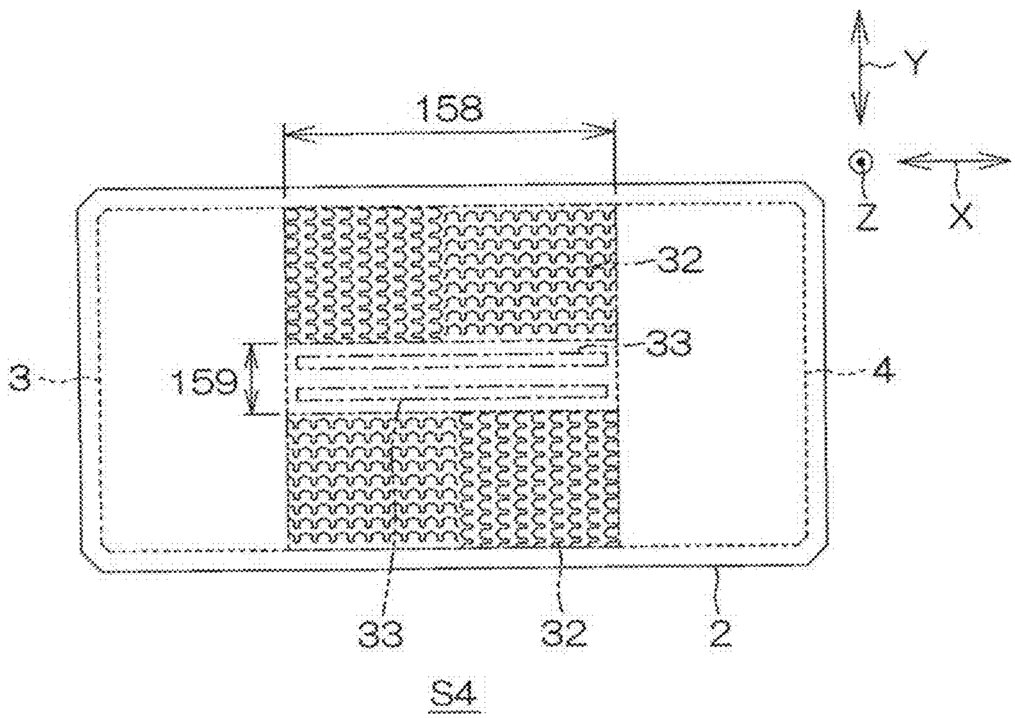
FIG. 36 is a schematic top view of a chip part of sample 4

Referring to FIG. 36, the chip part S4 of the sample 4 differs from the chip part 1 in that, the diode portion 33 is formed in a region 158 between the first external electrode 3 and the second external electrode 4. More specifically, in the region 158, capacitor portions 32 separated from each other include a pair of capacitor portions 32. The pair of capacitor portions 32 are adjacent with a diode region 159 interposed in between in the second direction Y. A pair of diodes portions 33 are formed in the diode region 159. The diode portions 33 form strips extending in the first direction X.

Figure 37:
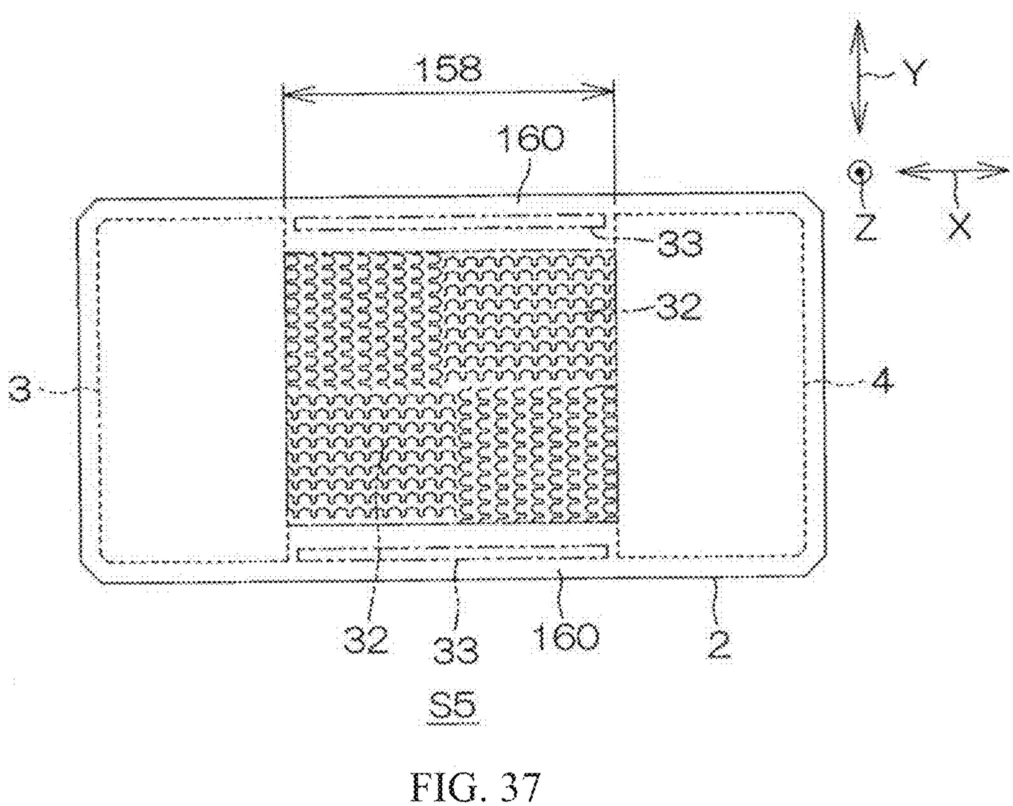
FIG. 37 is a schematic top view of a chip part of sample 5

Referring to FIG. 37, the chip part S5 of the sample 5 differs from the chip part 1 in that, the diode portion 33 is formed in the region 158 between the first external electrode 3 and the second external electrode 4. More specifically, in the region 158, a pair of diode regions 160 are formed on outer sides of the capacitor portion 32. The capacitor portion 32 is sandwiched between the pair of diode regions 160 in the second direction Y. The diodes portion 33 is formed in each of the diode regions 160. The diode portions 33 form strips extending in the first direction X.

Figure 38:
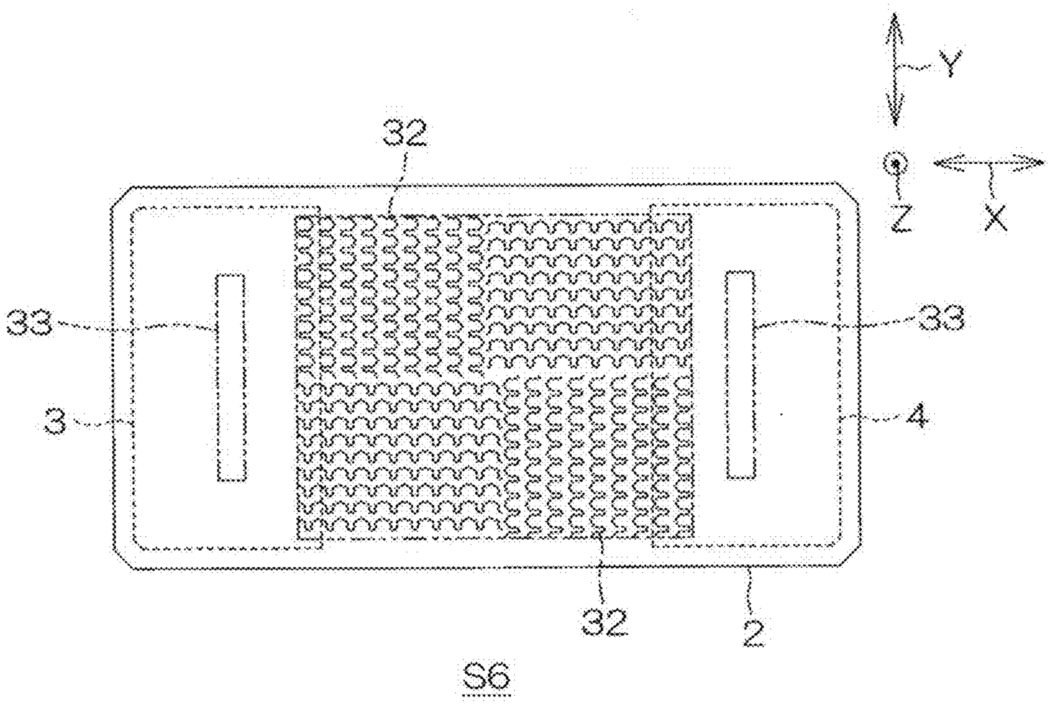
FIG. 38 is a schematic top view of a chip part of sample 6

Referring to FIG. 38, the position of the diode portion 33 of the chip part of the sample 6 is the same as that of the chip part 1. That is to say, a pair of diode portions 33 are respectively formed in the lower regions of the first external electrode 3 and the second external electrode 4.

Figure 39:
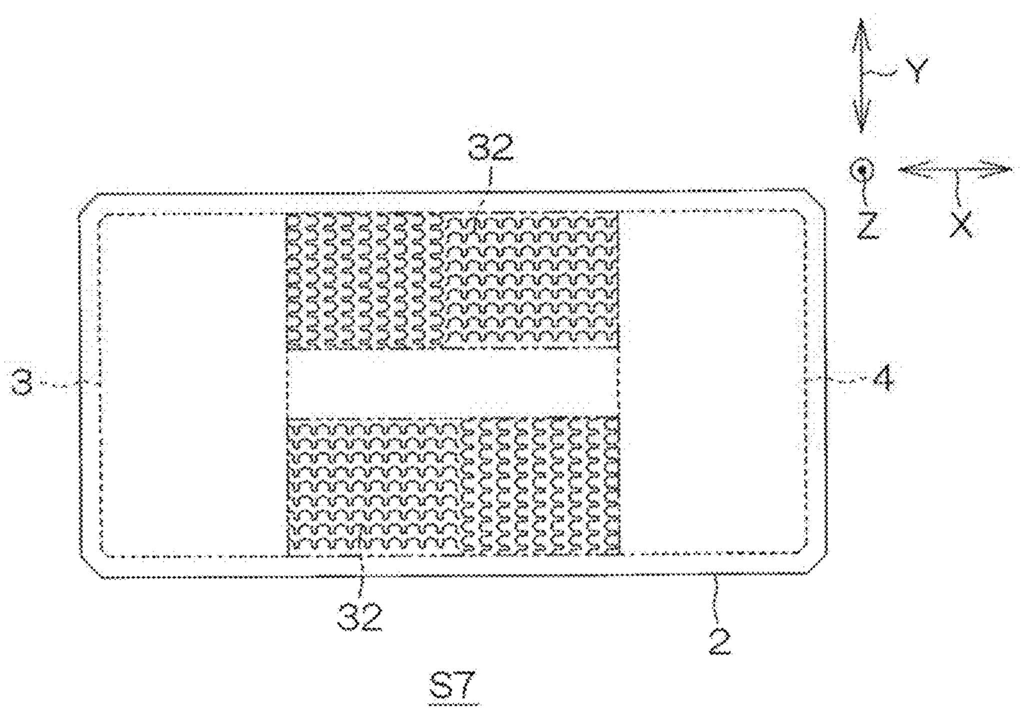
FIG. 39 is a schematic top view of a chip part of sample 7

Referring to FIG. 39, the chip part S7 of the sample 7 differs from the chip part 1 by excluding the diode portion 33. In short, the chip part S7 is a discrete capacitor component including only the capacitor portion 32 as a device.

Figure 40:
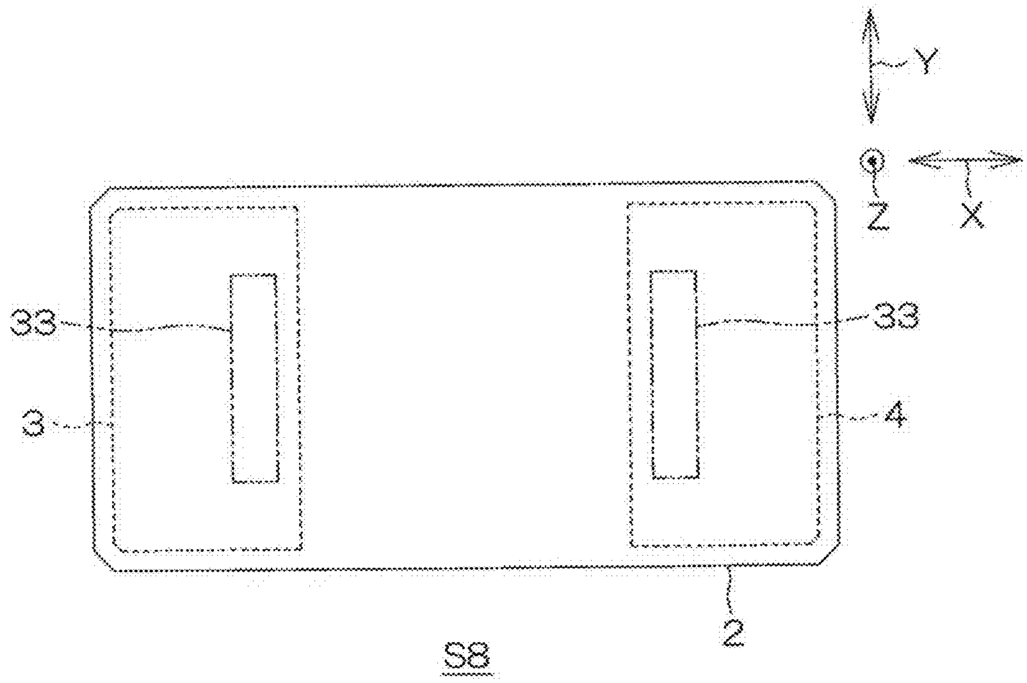
FIG. 40 is a schematic top view of a chip part of sample 8
Figure 41:
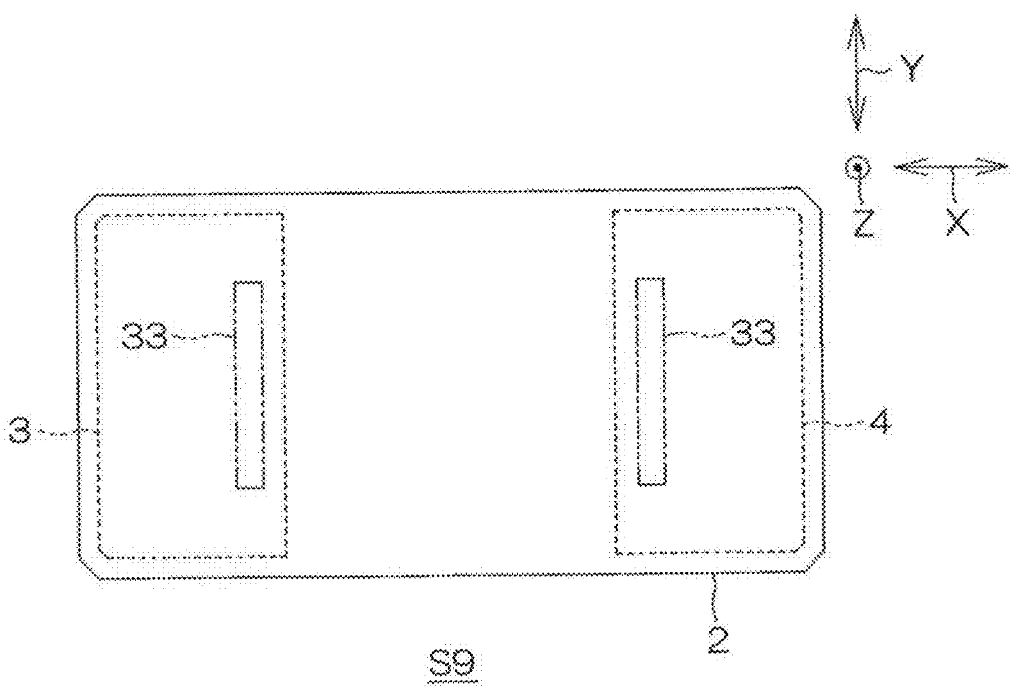
FIG. 41 is a schematic top view of a chip part of sample 9
Figure 42:
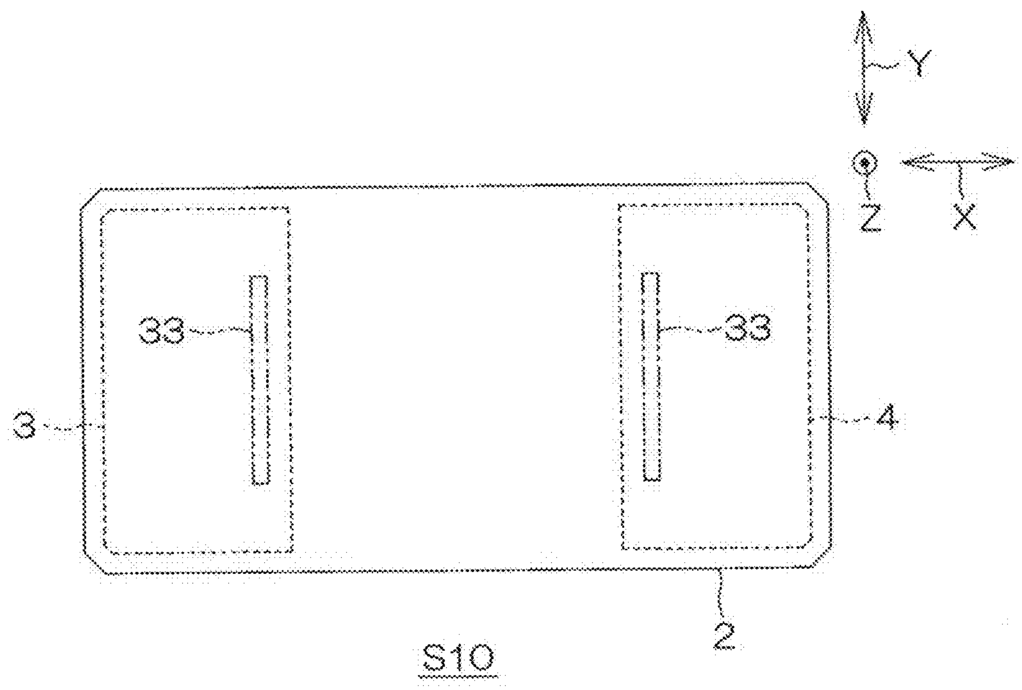
FIG. 42 is a schematic top view of a chip part of sample 10

FIG. 40 to FIG. 42, the chip parts S8 to S10 of the samples 8 to 10 all differ from the chip part 1 by excluding the capacitor portion 32. In short, the chip parts S8 to S10 are discrete diode components including only the diode portion 33 as devices. The chip parts S8 to S10 differ in respect of the areas of the diode portion 33 (the numbers of the diode portion). The area of the diode portion 33 of the chip part S8 is the largest (having the largest number of diode portion, and the area of the diode portion 33 of the chip part S9 is the second largest. The area of the diode portion 33 of the chip part S9 is the same as the area of the diode portion 33 of the chip part S6. On the other hand, the area of the diode portion 33 of the chip part S10 is smaller than the areas of the diode portions 33 of the chip parts S8 and S9.

Then, the breakdown voltages in kV of the chip parts S4 to S10 are simulated and calculated. The breakdown voltages of the chip parts S4 to S10 are as below.

Chip part S4 (inter-electrode diode)=3.5 kV
Chip part S5 (inter-electrode diode)=4 kV
Chip part S6 (under-electrode diode)=4.5 kV
Chip part S7 (no diode)=0.2 kV
Chip part S8 (no capacitor, large diode)=10.5 kV
Chip part S9 (no capacitor, medium diode)=7.5 kV
Chip part S10 (no capacitor, small diode)=5.5 kV It is known by comparing the chip parts S4 to S6 with the chip part S7, the breakdown voltage is increased by mounting the diode portion 33, and the ESD protection characteristics are enhanced. It is further known that, by configuring the diode portion 33 in the lower regions of the first external electrode 3 and the second external electrode 4 as in the chip part S6, ESD protection characteristics can be further enhanced.

On the other hand, comparing the chip part S6 with the chip parts S8 to S10, the results indicate that the ESD protection characteristics of the chip parts S8 to S10 as discrete diode components are more outstanding. However, it is clear from the comparison of the chip parts S8 to S10 that, ESD protection characteristics can be enhanced by expanding the area of the diode portion 33. The simulation results also indicate that, as the area of the diode portion 33 increases in an order of the chip part S10, the chip part S9 and the chip part S8, the breakdown voltage also increases. Thus, in the chip part S6, it is expected that same ESD protection characteristics as the discrete diode component can also be achieved by adjusting the area of the diode portion 33.

[Appearance of Chip Part 201 (Vertical)]

Figure 43:
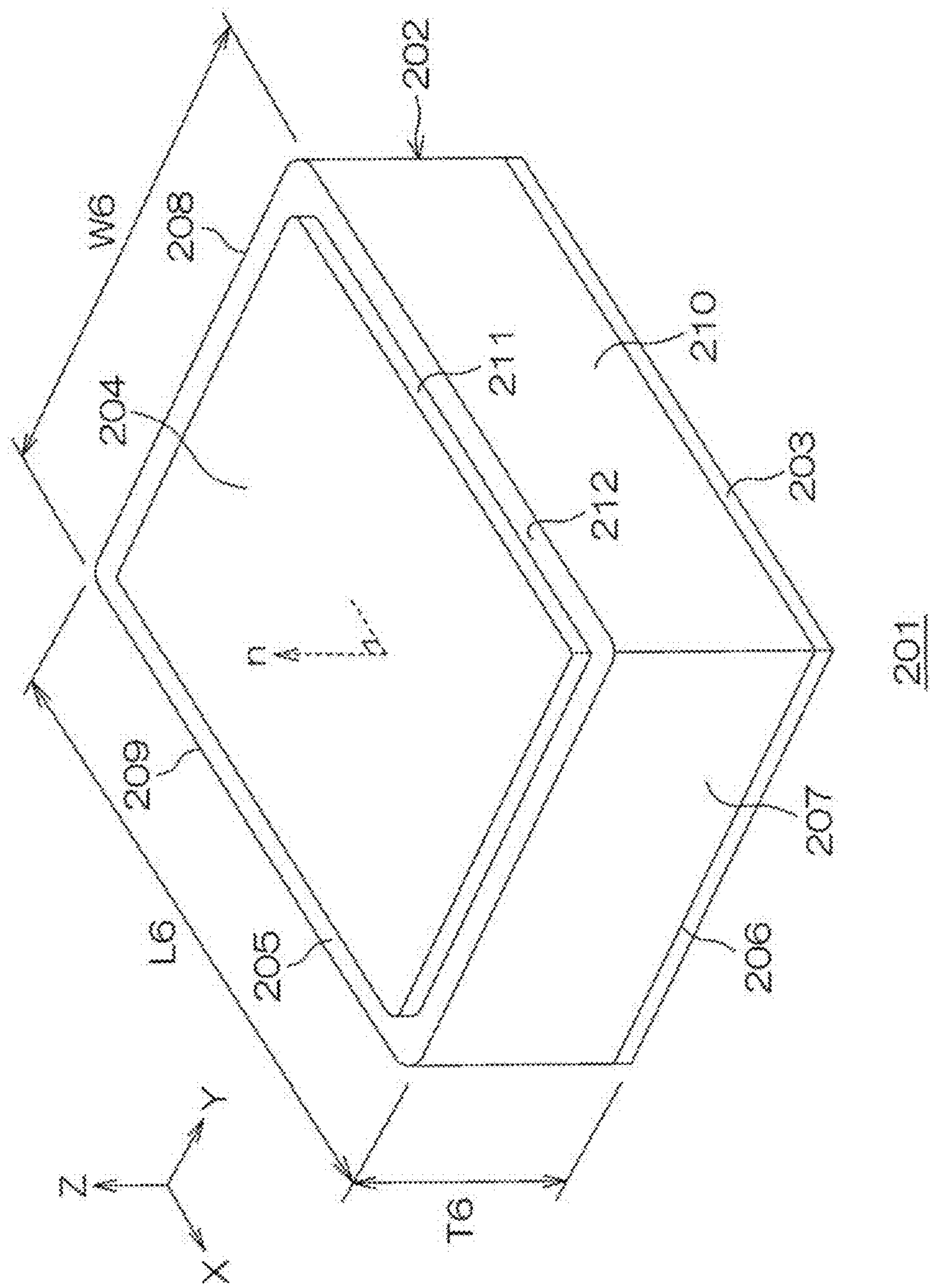
FIG. 43 is a perspective schematic diagram of a chip part according to an embodiment of the present disclosure
Figure 44:
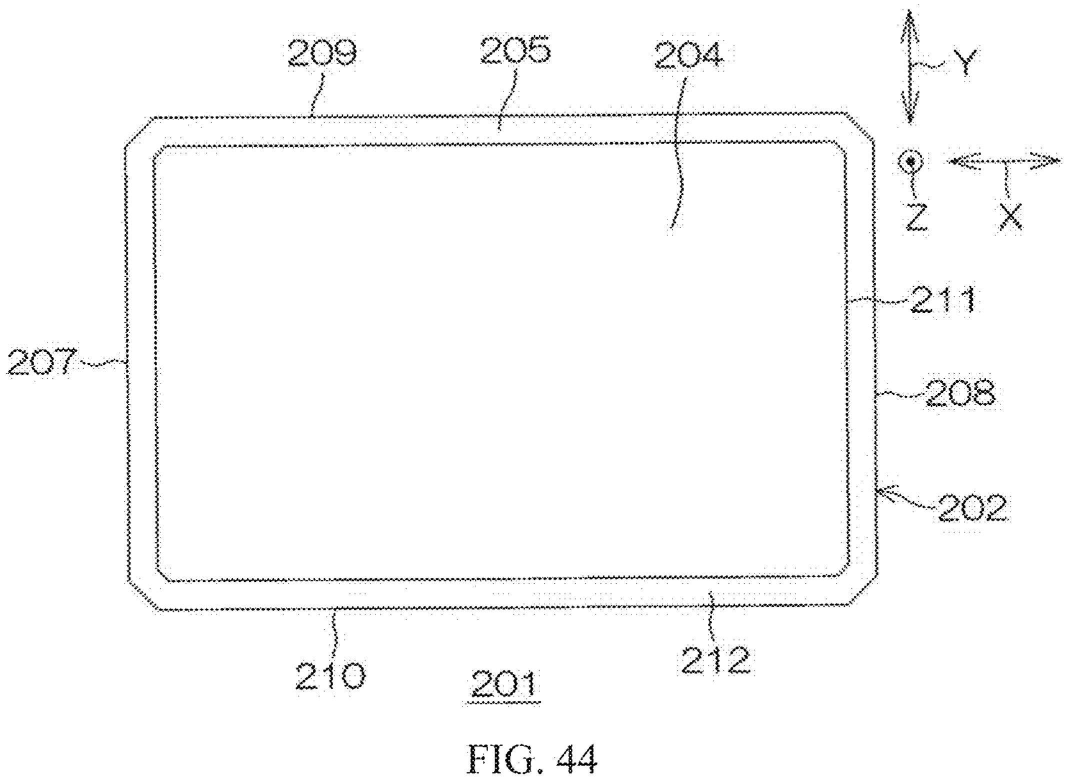
FIG. 44 is a schematic top view of the chip part
Figure 45:
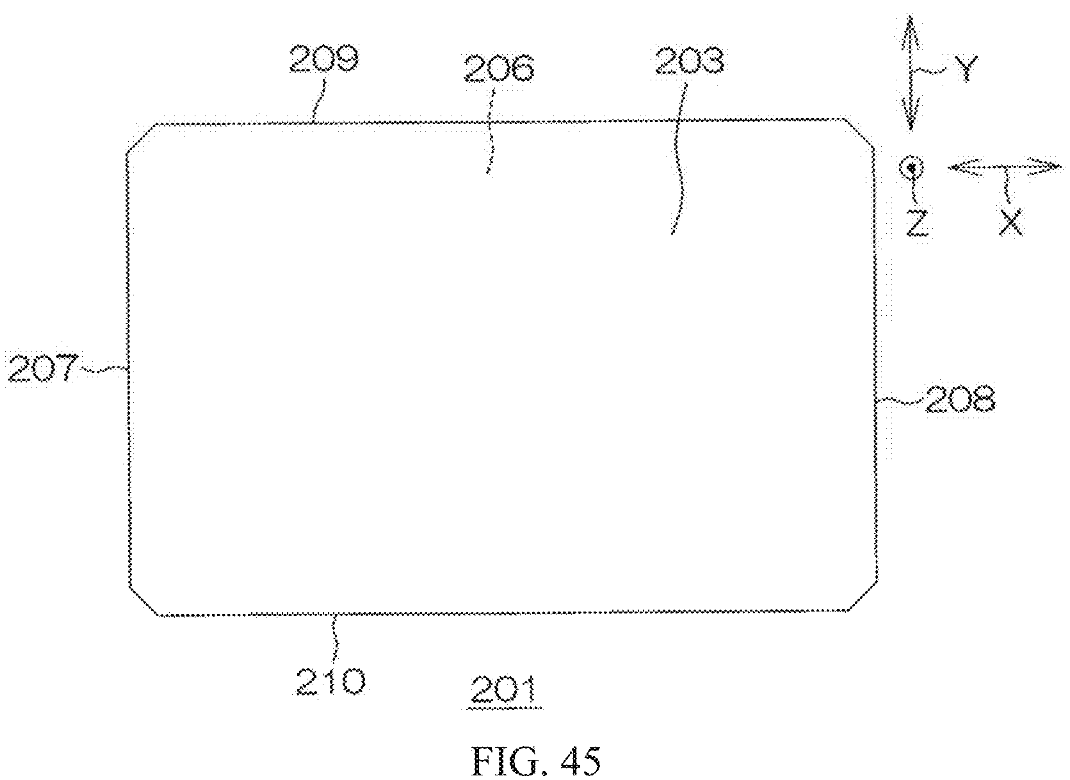
FIG. 45 is a schematic bottom view of the chip part

FIG. 43 shows a perspective schematic diagram of a chip part 201 according to an embodiment of the present disclosure. FIG. 44 shows a schematic top view of the chip part 201. FIG. 45 shows a schematic bottom view of the chip part 201. The structures corresponding to the structures described with reference to FIG. 1 to FIG. 42 are given the same numeral and symbols, and the repeated details are omitted below. In FIG. 43 to FIG. 45, the lengthwise direction of the chip part 201 having a cuboid shape is defined as a first direction X, the widthwise direction of the chip part 201 is defined as a second direction Y, and a thickness direction of the chip part 201 is defined as a third direction Z.

The chip part 201 is formed in a cuboid shape, and has a length L6 in the first direction X, a width W6 in the second direction Y and a thickness T6 in the third direction Z. The length L6 may be, for example, 0.4 mm or more and 2 mm or less. The width W6 may be, for example, 0.2 mm or more and 2 mm or less. The thickness T6 may be, for example, 0.1 mm or more and 0.5 mm or less.

The chip part 201 may also be a small-size electronic component using a chip designation (length L1 (mm)× width W1 (mm)), for example, referred to as a 1608 (1.6 mm×0.8 mm) chip, a 1005 (1.0 mm×0.5 mm) chip, 0603 (0.6 mm×0.3 mm) chip, 0402 (0.4 mm×0.2 mm) chip, or 03015 (0.3 mm×0.15 mm) chip.

The chip part 201 includes a substrate 202, a first external electrode 203 and a second external electrode 204.

The substrate 202 forms a base substrate of the chip part 201. The chip part 201 is formed by supporting a plurality of insulating films and metal films layered on one another on the substrate 202. The substrate 202 exhibits a cuboid shape having substantially the same dimensions as the chip part 201. The substrate 202 has a first main surface 205, a second main surface 206 and four side surfaces 207 to 210. The first main surface 205 is the so-called front side of the chip part 201, and the second main surface 206 is the obverse side of the chip part 201. The four side surfaces 207 to 210 surround the first main surface 205 when observed in a plan view and along a normal direction n of the first main surface 205 (to be referred to as the plan view below). The four side surfaces 207 to 210 may also include a pair of a first side surface 207 and a second side surface 208 opposite to each other in the first direction X, and a pair of a third side surface 209 and a fourth side surface 210 opposite to each other in the second direction Y. In other words, the side surfaces extending in parallel to each other in the second direction Y are the first side surface 207 and the second side surface 208, and the side surfaces extending in parallel to each other in the first direction X are the third side surface 209 and the fourth side surface 210. The first side surface 207, the second side surface 208, the third side surface 209 and the fourth side surface 210 may also be referred to as a first end surface, a second end surface, a third end surface and a fourth end surface, respectively.

The first external electrode 203 is disposed on the first main surface 206. The first external electrode 203 is formed covering an entirety of the first main surface 206. The second external electrode 204 is disposed on the first main surface 205. The second external electrode 204 is formed covering the entirety of the first main surface 205. The second external electrode 204 has an edge 211 formed to be spaced inward with respect to the four side surfaces 207 to 210. A region between the edge 211 of the second external electrode 204 and the side surfaces 207 to 210 may be an insulative space 212 that exposes an insulative portion on the first main surface 205 of the substrate 202. The edge 211 of the second external electrode 204 may also be alternatively referred to as an end surface of the second external electrode 204.

In this embodiment, the first external electrode 203 and the second external electrode 204 form two terminals of the chip part 201. The chip part 201 is a vertical chip part 201 having a capacitor structure 220 formed therein. The capacitor structure 220 has a layered structure of upper electrode 215—capacitive film 214—lower electrode 219 along a direction perpendicular to the thickness direction of the substrate 202. The vertical chip part 201 can be bonded on the substrate via the first external electrode 203, and bonded to the second external electrode 204 by a lead wire for further use. Thus, the chip part 201 may also be referred to as a vertical chip part. Moreover, the first external electrode 203 and the second external electrode 204 may also be referred to as a first terminal electrode and a second terminal electrode, respectively, or be referred to as a first external terminal and a second external terminal.

[Structure of the Capacitor Portion 213]

Figure 46:
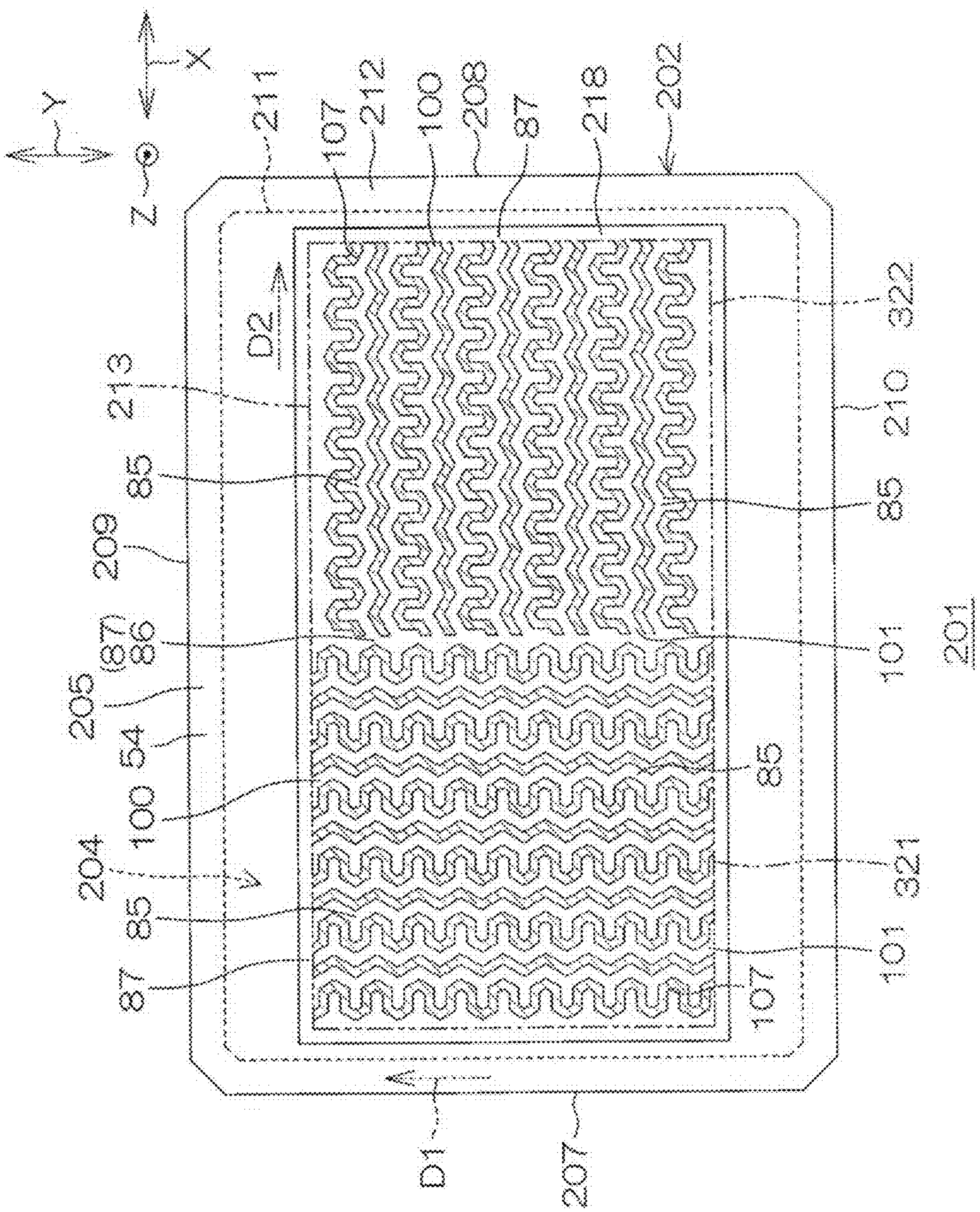
FIG. 46 is a schematic top view of the chip part
Figure 47:
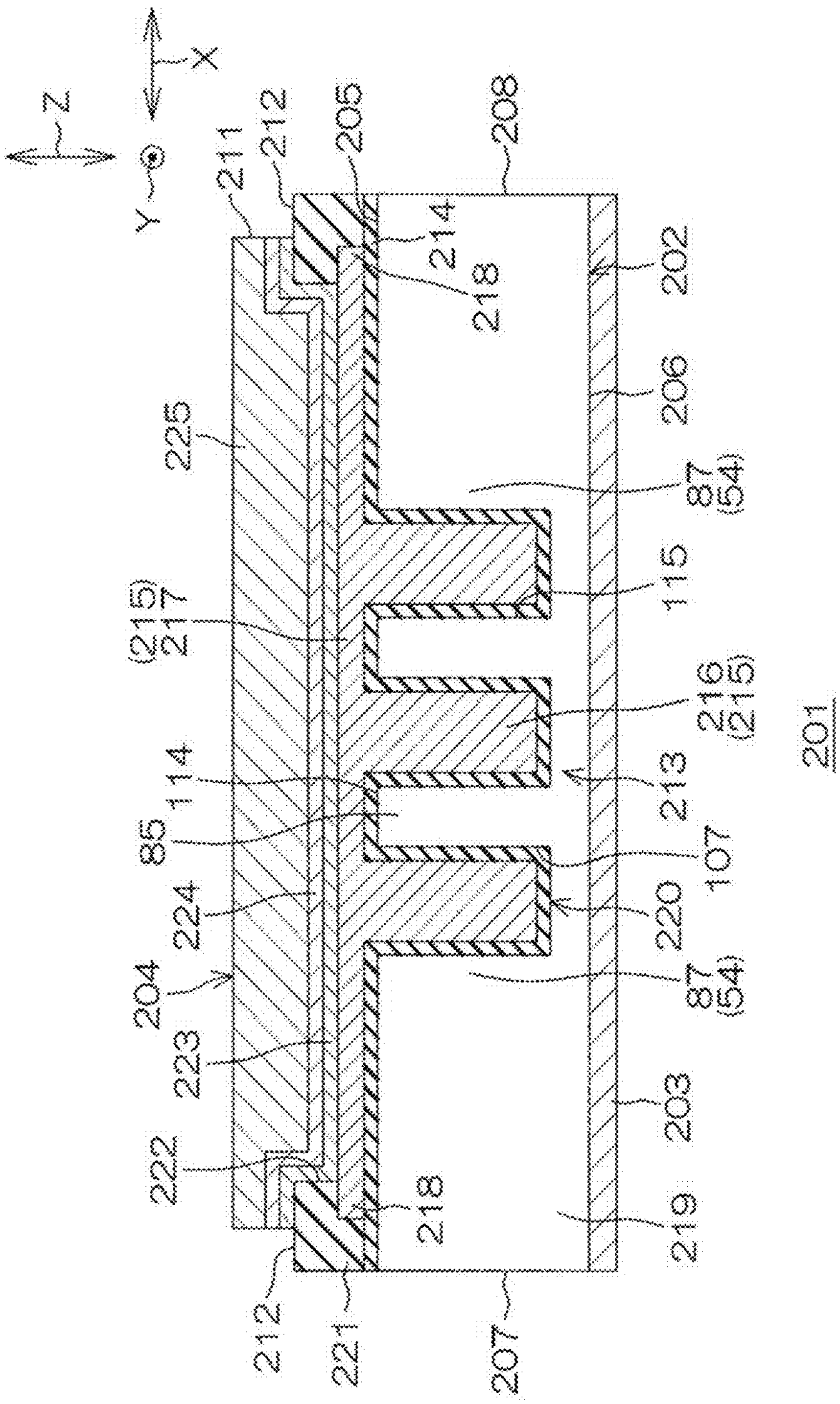
FIG. 47 is a schematic section diagram of the chip part

FIG. 46 shows a schematic top view of the chip part 201. FIG. 47 shows a schematic section diagram of the chip part 201. For clarity, in FIG. 46, the wall portions 85 are shaded by lines, and the second external electrode 204 is depicted in a perspective manner by dotted lines. Moreover, in FIG. 46, the required constituting elements and the reference symbols and numerals are extracted and shown. Moreover, FIG. 47 illustrative represents a diagram of the layered structure on the first main surface 205 and the second main surface 206 of the chip part 201, but does not represent a cross section along any specific section line in FIG. 46.

The substrate 202 is a semiconductor substrate such as a silicon substrate. In this embodiment, the substrate 202 is an n-type substrate. The thickness of the substrate 202 may be, for example, 200 μm or more and 600 μm or less. The specific resistance of the substrate 202 can also be set to about 5 mΩ·cm by introducing an n-type impurity.

The capacitor portion 213 is formed on the first main surface 205 of the substrate 202. The capacitor portion 213 is formed at the center of the first main surface 205, and is completely covered by the second external electrode 204. In the capacitor portion 213, by selectively removing a portion on the side of the first main surface 205 of the substrate 202, a plurality of wall portions 85 are formed by a portion of the substrate 202. Details of the shape of the wall portions 85 of the capacitor portion 213 and the capacitor portion 213 including a plurality of capacitor portions (for example, a first capacitor portion 321 and a second capacitor portion 322) having lengthwise directions different from each other are common as those in the description above, and are thus omitted herein.

Referring to FIG. 47, on the first main surface 205 of the substrate 202, a capacitive film 214 is formed covering the entire region of the first main surface 205 of the substrate 202. In addition to being formed on the first main surface 205 that is a flat surface of the substrate 202, the capacitive film 214 is also formed on the entire surface (upper surfaces 114 and side surfaces 115) of the wall portions 85. The capacitive film 214 has an end surface consistent with the side surfaces 207 to 210 of the substrate 202. The capacitive film 214 may be a $SiO_2$ film or a silicon nitride (SiN) film, and a layered film of the above. For example, the capacitive film 35 may also be a $SiO_2$/SiN layered film, or a $SiO_2$/SiN/$SiO_2$ layered film. Moreover, the capacitive film 214 may be an ON film or an ONO film, and a layered film of the above. Further, the capacitive film 214 may also be an insulating film including a high dielectric material (high-k material). A high dielectric material, in addition to aluminum oxide ($Al_2O_3$), tantalum pentoxide ($Ta_2O$), titanium pentoxide ($Ti_3O_5$) and hafnium oxide ($HfO_2$), the high dielectric material may further include, for example, perovskite compounds such as strontium titanate ($SrTiO_3$) and barium strontium titanate ($Ba_xSr_{1-x}$) $TiO_3$. Moreover, the thickness of the capacitive film 214 may be 100 Å or more and 1000 Å or less (10 nm or more and 100 nm or less).

The upper electrode 215 is embedded into the trench 107, and is formed along the first main surface 205 of the substrate 202. The upper electrode 215 is integrally embedded into an embedding portion 216 in the trench 107, and a flat portion 217 connected to an upper end of the embedding portion 216 and formed flat along the first surface 205 of the substrate 202. The flat portion 217 is formed to be drawn out to the peripheral portion 218 of the upper electrode 215 outside the capacitor portion 213. Moreover, the upper electrode 215 may be made of, for example, a semiconductor material such as polysilicon, or a metal material including Cu or Al. If the upper electrode 36 is made of a metal material, for example, Cu, Al, AlSi or AlCu may be included. Moreover, the thickness of the upper electrode 215 (the flat portion 217) may be 4000 Å or more and 10000 Å or less (400 nm or more and 1000 nm or less).

In the chip part 201, the substrate 202 including the semiconductor substrate containing impurities forms the lower electrode 219 in the capacitor portion 213. Accordingly, the capacitive film 214 is sandwiched between the lower electrode 219 (the substrate 202) and the upper electrode 215 to thereby form the capacitor structure 200.

A surface insulating film 221 is formed on the substrate 202. The surface insulating film 221 covers the upper electrode 215. The surface insulating film 221 may be, for example, a $SiO_2$ film or a SiN film. The thickness of the surface insulating layer 221 may be, for example, 10000 Å or more and 15000 Å or less (1 μm or more and 1.5 μm or less). A capacitor contact hole 222 that exposes a portion of the upper electrode 215 is formed on the surface insulating film 221.

The first external electrode 203 is connected to the second main surface 206 of the substrate 202. The first external electrode 203 is electrically connected to the lower electrode 219. The first external electrode 3 may be, for example, a Ni/PdAu layered film sequentially including a Ni film, a Pd film and an Au film from the substrate 202.

The second external electrode 204 is disposed on the surface insulating film 221. The second external electrode 204 is electrically connected to the upper electrode 215 in the capacitor contact hole 222. The second external electrode 204 may also include a layered film including a plurality of conductive layers. For example, the second external electrode 204 may also include a first layer 223, a second layer 224 and a third layer 225 sequentially layered from the substrate 202. The first layer 223 also be referred to as, for example, a barrier layer including Ti. The second layer 224 also be referred to as, for example, a spluttering layer including Au. The third layer 225 also be referred to as, for example, a coating layer including Au. When the second layer 224 and the third layer 225 are formed by the same material, there may be no boundary between the two. The third layer 225 may be thicker than the first layer 223 and the second layer 224.

[Manufacturing Method of the Chip Part 201]

FIG. 48A to FIG. 48G show diagrams of manufacturing steps of the chip part 201 in sequence, and correspond to the cross section in FIG. 47.

Figure 48A:
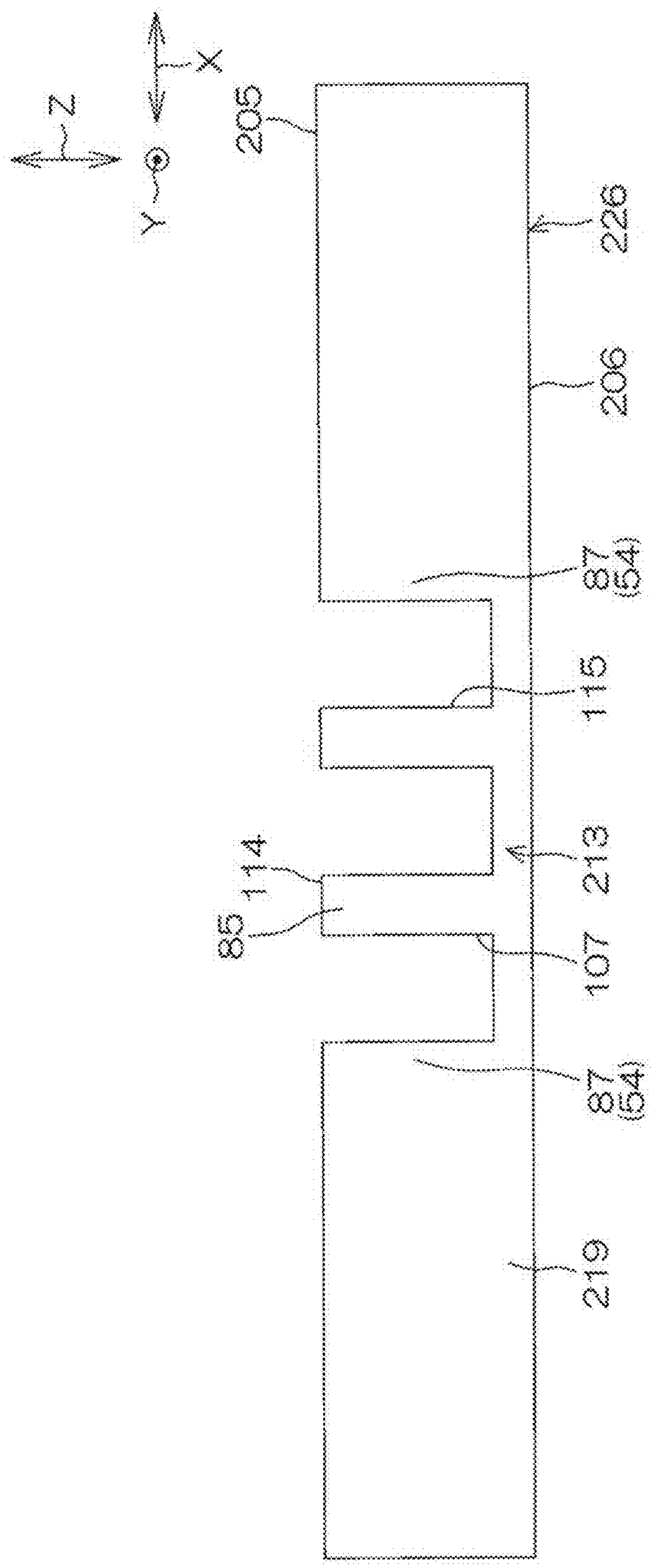
FIG. 48A is a schematic section diagram of a part of a manufacturing step of the chip part

To manufacture the chip part 201, first of all, referring to FIG. 48A, a wafer 226 to become a base of the substrate 202 is prepared. Then, for example, a hard mask (not shown) containing $SiO_2$ is formed by thermally oxidizing the first main surface 205 of the wafer 226. Next, an opening is formed at the hard mask, and etching is selectively performed on wafer 226 by using the hard mask from the side of the first main surface 205. Herein, the trench 107 is formed at a portion removed from the wafer 226, and the wall portions 85 and the support portion 87 (the substrate body portion 54) are formed on portions other than the trench 107. Dry etching is preferably used as a means of etching.

Figure 48B:
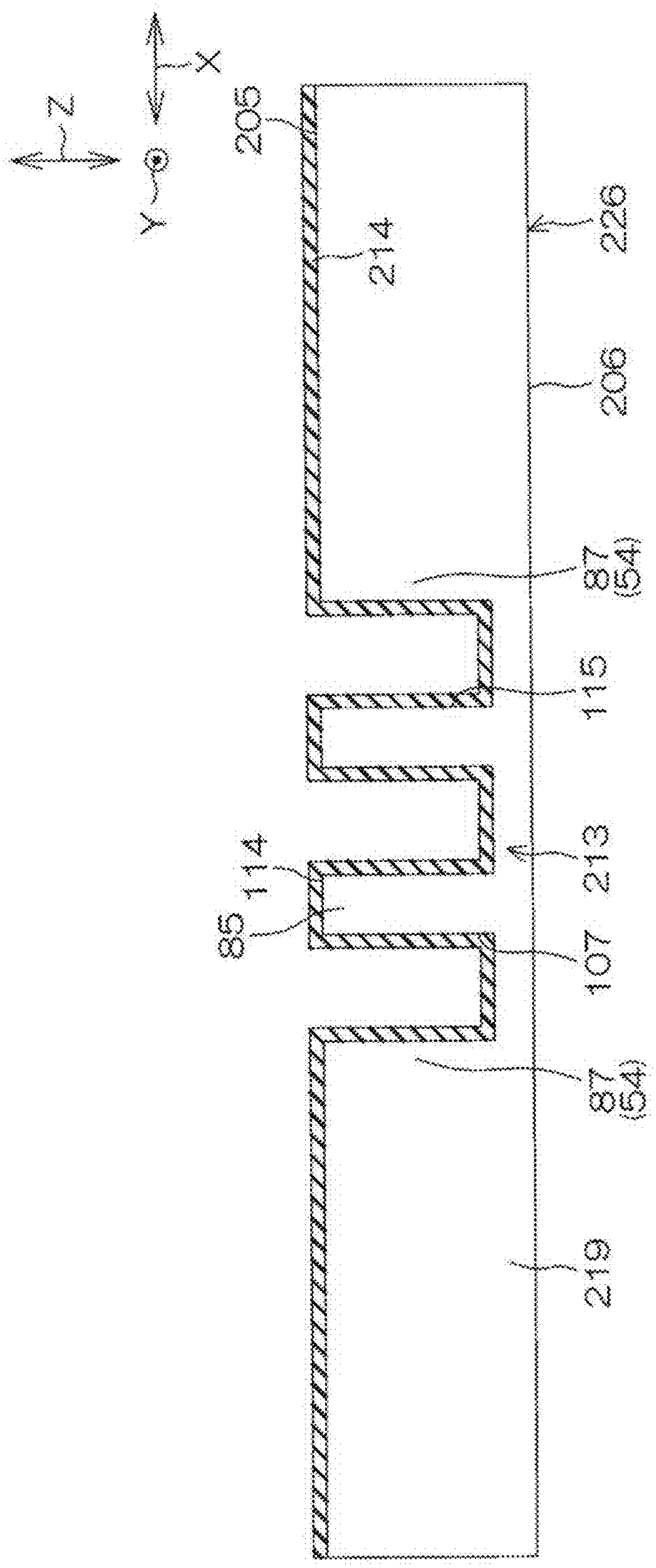
FIG. 48B is a diagram of a next step of FIG. 48A

Next, referring to FIG. 48B, the capacitive film 214 is formed on the first main surface 205 of the wafer 226, and the upper surfaces 114 and the side surfaces 115 of the wall portions 85. The capacitive film 214 may be formed by means of, for example, thermal oxidation, CVD or a combination thereof.

Figure 48C:
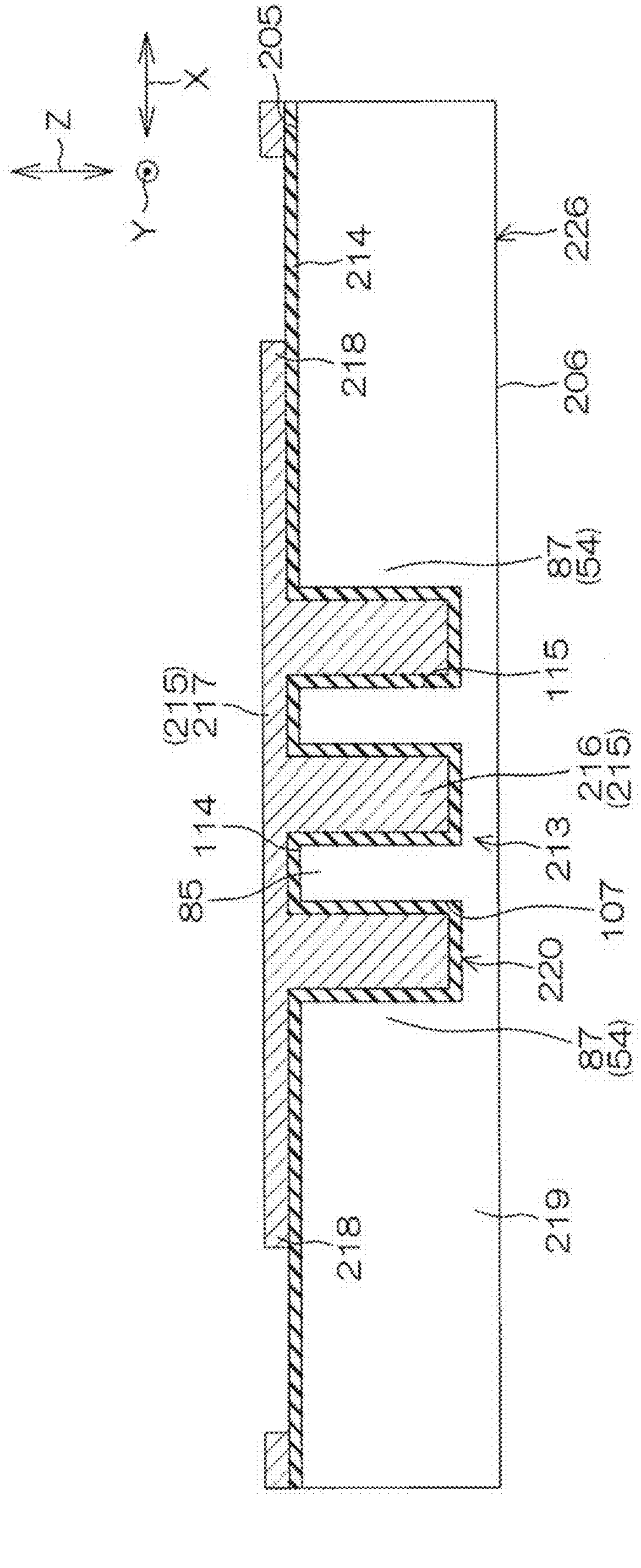
FIG. 48C is a diagram of a next step of FIG. 48B

Next, referring to FIG. 48C, by means of CVD, for example, a conductive film (not shown) that becomes a base of the upper electrode 215 is formed on the capacitive film 214. The capacitive film 136 is embedded into the trench 107, and is formed covering the entire surface of the first main surface 205 of the wafer 226. Then, the conductive film is patterned to form the upper electrode 215. Accordingly, the capacitor structure 220 including the lower electrode 219 (the substrate 202), the capacitive film 214 and the upper electrode 215 is formed.

Figure 48D:
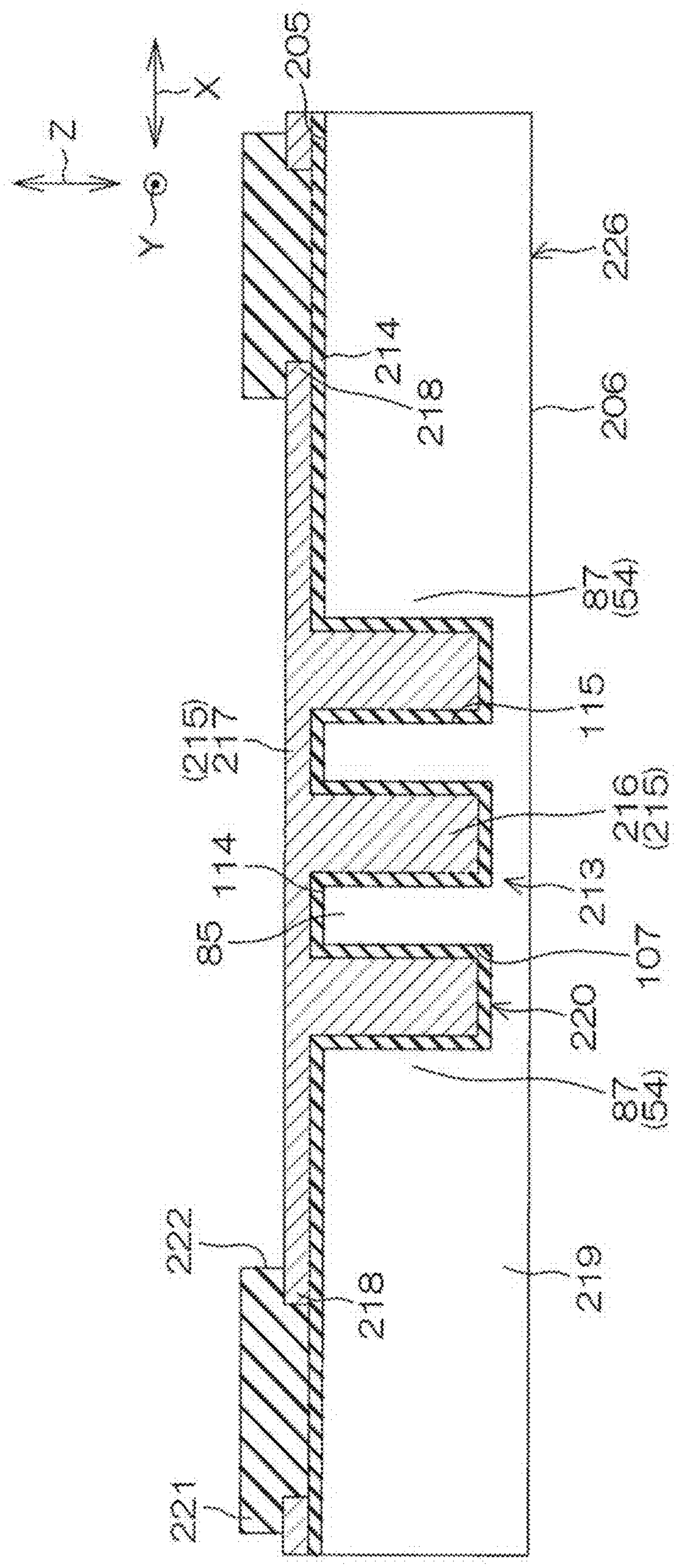
FIG. 48D is a diagram of a next step of FIG. 48C

Next, referring to FIG. 48D, by means of CVD, for example, the surface insulating film 221 is formed. Then, the surface insulating film 221 is patterned to form the capacitor contact hole 222.

Figure 48E:
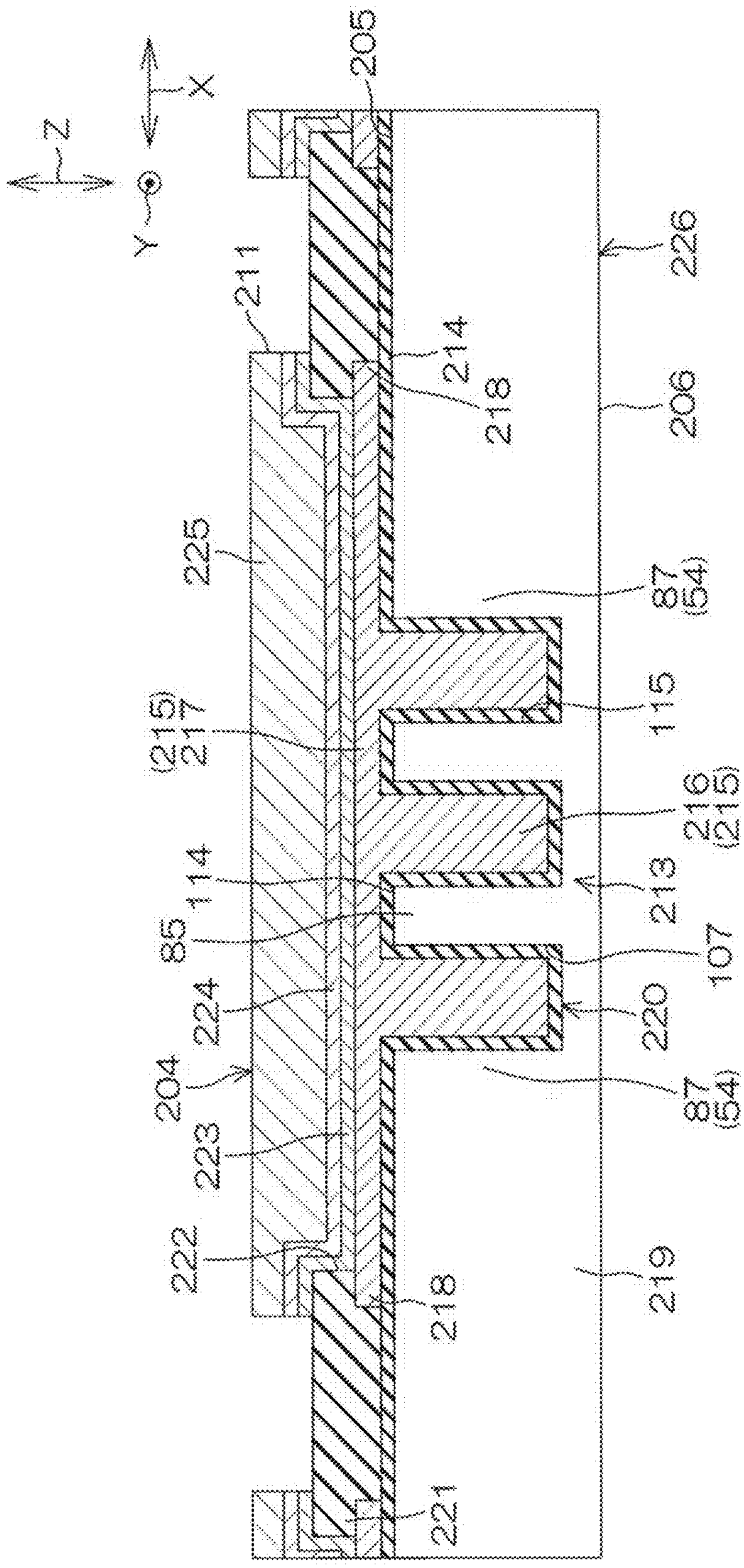
FIG. 48E is a diagram of a next step of FIG. 48D

Then, referring to FIG. 48E, the second external electrode 204 is formed. For example, after the first layer 223 and the second layer 224 are formed by sputtering, the third layer 225 is formed by coating and depositing from the second layer 224.

Figure 48F:
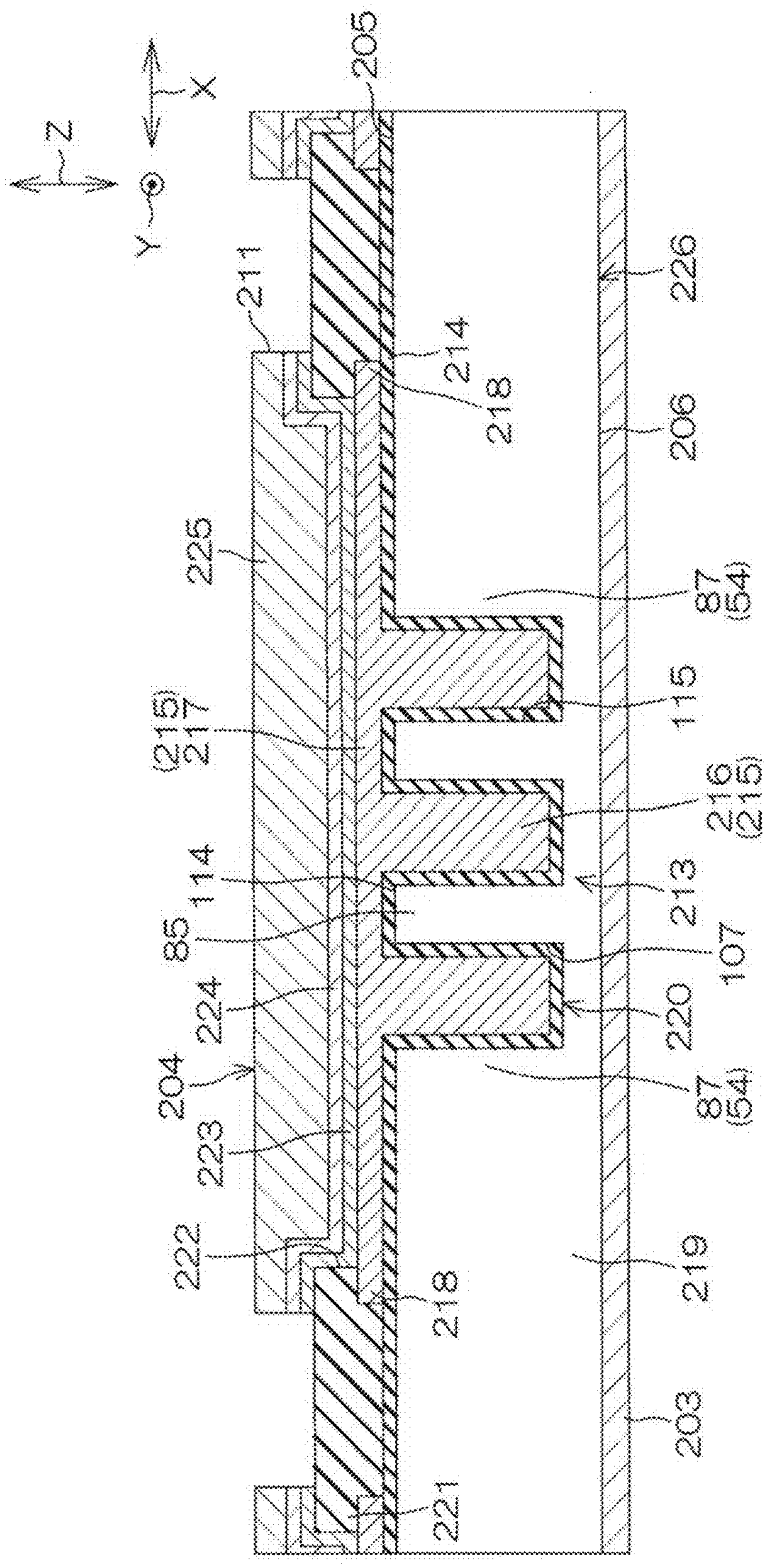
FIG. 48F is a diagram of a next step of FIG. 48E

Next, referring to FIG. 48F, by means of sputtering, for example, the first external electrode 203 is formed on the second main surface 206 of the substrate 202.

Figure 48G:
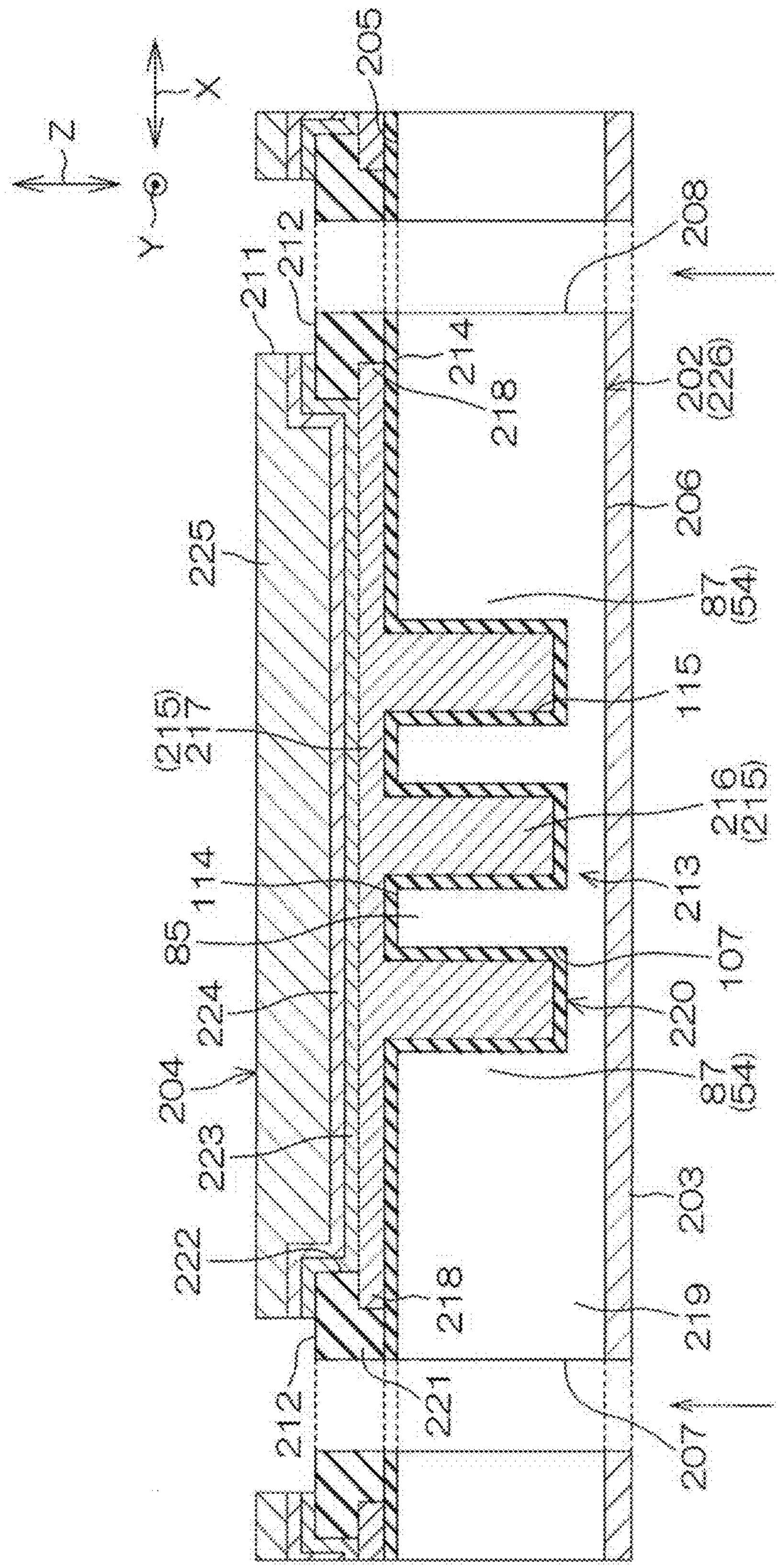
FIG. 48G is a diagram of a next step of FIG. 48F

Next, as shown in FIG. 48G, a cutting blade is inserted on the side of the second main surface 206 of the wafer 226 to cut (disconnect) the wafer 226. Accordingly, the chip parts 201 are obtained after the cutting.

According to the chip part 201, similar to the chip part 1, as shown in FIG. 8, the wall portions 85 formed at the substrate 2 are formed by a plurality of pillar units 90. Each of the plurality of pillar units 90 includes the central portion 91, and three protruding portions 92 extending from the central portion 91 to three different directions in the plan view. Accordingly, compared to when the wall portions 85 are formed by connecting pillars such as quadrilateral pillars, the surface area of the wall portions 85 can be increased. As a result, even if the plane size of the substrate 202 is smaller, it is ensured that the capacitor portion 32 has a larger capacitance, and therefore miniaturization of components and large capacitance of the capacitor structure 220 can both be satisfied.

In addition, the capacitor portion 213 includes the first capacitor portion 321 and the second capacitor portion 322 having lengthwise directions different from each other. Thus, the direction of stress generated in the substrate 202 (the wafer 226) due to forming of the wall portions 85 can be dispersed into a plurality of directions. As a result, warping of the substrate 202 (the wafer 226) can be inhibited to thereby enhance strength. In particular, in this embodiment, the first lengthwise direction D1 of the wall portions 85 of the first capacitor portion 321 and the second lengthwise direction D2 of the wall portions 85 of the second capacitor portion 322 are directions orthogonal to each other. Thus, the stress in the first capacitor portion 321 and the stress in the second capacitor portion 322 are applied in directions that cancel out each other, further inhibiting warping of the substrate 202 (the wafer 226). As a result, the chip part 201 having the capacitor structure 220 with mechanical strength and outstanding reliability can be provided.

Figure 49:
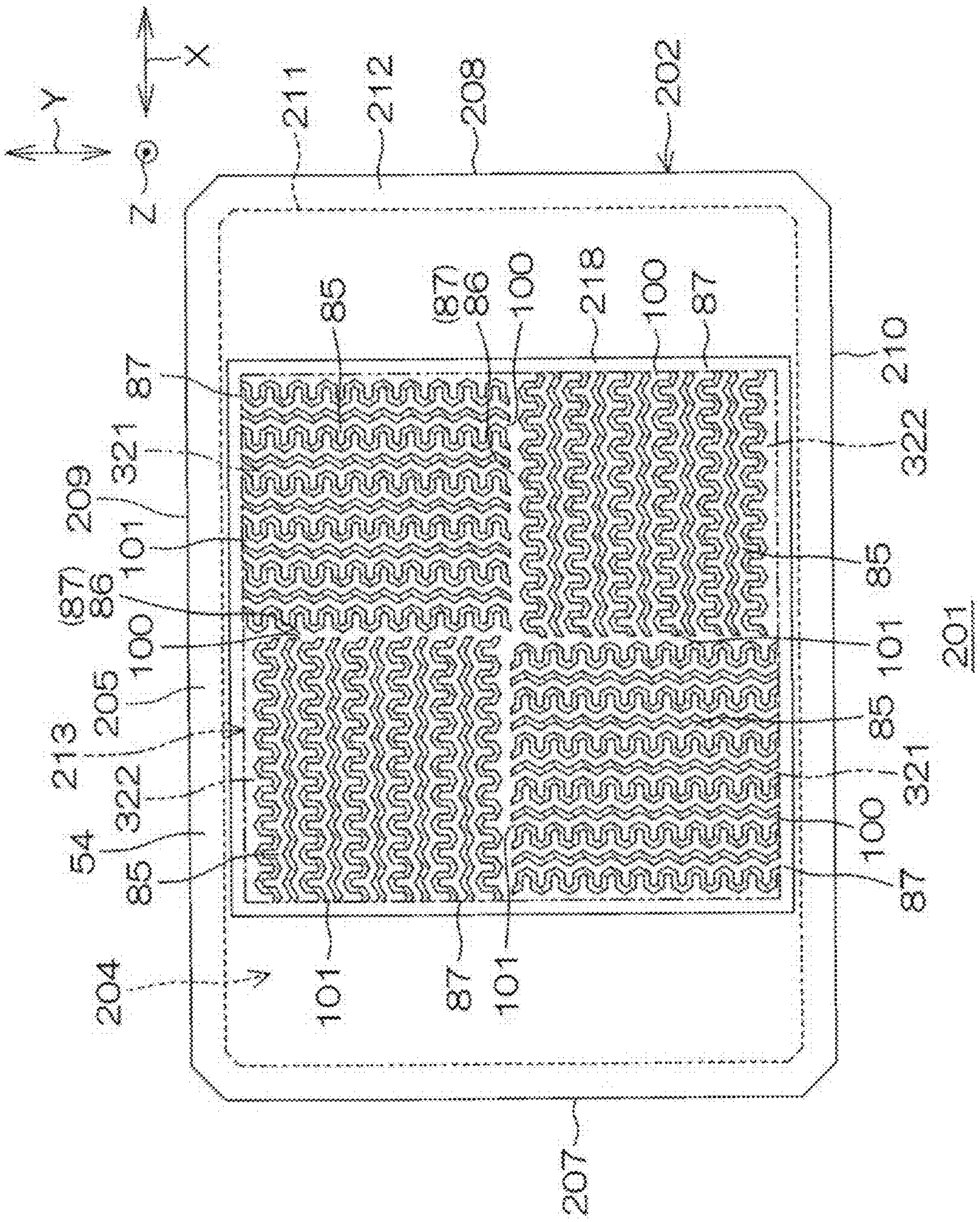
FIG. 49 is a diagram illustrating a variation example of the chip part.

Moreover, the chip part 201 may be implemented by variation examples the same as those of the chip part 1. An example of a variation example of the capacitor portion 213 is given below. Referring to FIG. 49, the capacitor portion 213 may also include a pair of first capacitor portions 321 and a pair of second capacitor portions 322. In this case, the pair of first capacitor portions 321 and the pair of second capacitor portions 322 may be alternately arranged in the plan view.

The embodiments of the present disclosure are described above; however, the present disclosure may also be implemented in other configurations.

For example, in the embodiments, although the capacitor structure 30 or 220 is a structure including the lower electrode 34 or 219 and the upper electrode 36 or 215 interposed by one capacitive film 35 or 219, it may also be a structure having two or more capacitive films and electrodes interposed by the capacitive films.

The embodiments of the present disclosure described above are examples in all aspects and are not to be interpreted in a restrictive manner, but are intended to encompass modifications in all aspects.

The features given in the notes below can be extracted from the detailed description and the drawings of the present application.

Note 1-1

A chip part (1) includes:

a substrate (2), having a first main surface (5) and a second main surface (6) opposite to the first main surface (5);

a capacitor portion (32), disposed on the first main surface (5) of the substrate (2) when viewed from a plan view and along a normal direction (n) of the first main surface (5), wherein the capacitor portion (32) includes a plurality of wall portions (85) having a lengthwise direction and separated from each other by a trench (107) formed on the first main surface (5);

a substrate body portion (54), disposed around the capacitor portion (32) by a portion of the substrate (2), and connected to one between an end portion (100) and another end portion (101) of each of the wall portions (85) in the lengthwise direction;

a lower electrode (34), disposed along top surfaces (114) and side surfaces (115) of the wall portions (85);

a capacitive film (35), disposed on the lower electrode (34) along the top surface (114) and the side surface (115) of the wall portion (85);

an upper electrode (36), disposed on the capacitive film (35);

wherein the wall portions (85) are formed by a plurality of pillar units (90);

each of the plurality of pillar units (90) includes a central portion (91) and three protruding portions (92) extending from the central portion (91) to three different directions in the plan view, and the plurality of wall portions (85) are formed by connecting the three protruding portions (92) of the adjacent pillar units (90); and the capacitor portion (32), in the plan view, includes a first capacitor portion (321) including the plurality of wall portions (85) having the lengthwise direction as a first lengthwise direction (D1), and a second capacitor portion (322) including the plurality of wall portions (85) having the lengthwise direction as a second lengthwise direction (D2) crossing the first lengthwise direction (D1).

According to the configuration, the wall portions (85) disposed at the substrate (2) are formed by the plurality of pillar units (90). Each of the plurality of pillar units (90) includes the central portion (91) and three protruding portions (92) extending from the central portion (91) to three different directions in the plan view. Accordingly, compared to when the wall portions (85) are formed by connecting pillars such as quadrilateral pillars, the surface area of the wall portions (85) can be increased. Moreover, the capacitor portion (32) is formed by imitating the surfaces of the wall portions (85). Thus, the capacitance of the capacitor portion (32) is not limited by the plane size of the substrate (2), and a large capacitance can be realized by increasing the height of the wall portions (85). That is to say, even if the plane size of the substrate (2) is smaller, it is ensured that the capacitor portion (32) has a larger capacitance.

In addition, if the wall portions (85) are formed by connecting the plurality of pillar units (90), the stability achieved is better than that the pillar units are separated from each other. Further, at least one between the end portion (100) and the end portion (101) of each wall portion (85) is connected to the substrate body portion (54) around the wall portion (85). Thus, the wall portions (85) can be cantilevered at least from the side, and thus can be reinforced to withstand lateral forces applied to the wall portions (85). As a result, even if the height of the wall portions (85) is increased, the stability of the wall portions (85) can still be maintained, thereby enhancing component reliability.

In addition, the capacitor portion (32) includes the first capacitor portion (321) and the second capacitor portion (322) having lengthwise directions different from each other. Thus, the direction of stress generated in the substrate (2) due to forming of the wall portions (85) can be dispersed into a plurality of directions. As a result, warping of the substrate (2) can be inhibited to thereby enhance strength. Therefore, the chip part (1) having a capacitor structure with mechanical strength and outstanding reliability can be provided.

Note 1-2

The chip part (1) according to note 1-1 includes:

a first external electrode (3), disposed on the first main surface (5) of the substrate (2) and connected to the lower electrode (34); and a second electrode (4), disposed on the first main surface (5) of the substrate (2) and separated from the first external electrode (3), and electrically connected to the upper electrode (36).

According to the configuration, the chip part (1) that can be used by means of flip chip bonding is provided.

Note 1-3

In the chip part (1) according to note 1-2, the capacitor portion (32) includes a first overlapping portion (55) overlapping the first external electrode (3) in the plan view, a second overlapping portion (56) overlapping the second external electrode (4) in the plan view, and a center portion (57) between the first external electrode (3) and the second external electrode (4).

According to the configuration, the capacitor portion (32) can be disposed in lower regions of the first external electrode (3) and the second external electrode (4) to increase the capacitance of the capacitor portion (32).

Note 1-4

In the chip part (1) according to note 1-3, the capacitor portion (32) includes one first capacitor portion (321) and one second capacitor portion (322). The first capacitor portion (321) and the second capacitor portion (322) are disposed adjacent to each other.

Note 1-5

In the chip part (1) according to note 1-4, the first capacitor portion (321) is disposed across the first overlapping portion (550 and the center portion (57), and the second capacitor portion (322) is disposed across the second overlapping portion (56) and the center portion (57).

Note 1-6

In the chip part (1) according to note 1-2 or note 1-3, the capacitor portion (32) includes a pair of the first capacitor portion (321) and a pair of the second capacitor portion (322). The pair of first capacitor portions (321) and the pair of second capacitor portions (322) are alternately arranged in the plan view.

Note 1-7

In the chip part (1) according to any of note 1-1 to note 1-6, the first lengthwise direction (D1) and the second lengthwise direction (D2) are directions orthogonal to each other.

According to the configuration, the first lengthwise direction (D1) of the wall portions (85) of the first capacitor portion (321) and the second lengthwise direction (D2) of the wall portions (85) of the second capacitor portion (322) are directions orthogonal to each other. Thus, the stress in the first capacitor portion (321) and the stress in the second capacitor portion (322) are applied in directions that cancel out each other, further inhibiting warping of the semiconductor substrate (2).

Note 1-8

In the chip part (1) according to any of note 1-2 to note 1-7, the lower electrode (34) includes a first contact region (63) disposed on an outer side of the capacitor portion (32)

and surrounding the capacitor portion (32). The upper electrode (36) includes a second contact region (69) overlapping the capacitor portion (32) in the plan view. The chip part (1) further includes a first electrode film (38) and a second electrode film (39). The first electrode film (38) is disposed on the first main surface (5) of the substrate (2) and electrically connecting the first contact region (63) to the first external electrode (3). The second electrode film (39) is disposed on the first main surface (5) of the substrate (2) and electrically connecting the second contact region (69) to the second external electrode (4).

According to the configuration, the first electrode film (38) is connected to the first contact region (63) surrounding the capacitor portion (32), and the second electrode film (39) is connected to the second contact region (69) overlapping the capacitor portion (32). Accordingly, the first contact region (63) and the second contact region (69) can be effectively arranged on the first main surface (5) of the substrate (2). As a result, the contact area between the first electrode film (38) and the first contact region (63) and the contact area between the second electrode film (39) and the second contact region (69) are respectively increased, hence providing the chip part (1) with outstanding electrical characteristics.

Note 1-9

In the chip part (1) according to note 1-8, the substrate (2) forms a quadrilateral surrounding the first main surface (5) in the plan view. The quadrilateral has a pair of a first side surface (7) and a second side surface (8) facing each other, and a pair of a third side surface (9) and a fourth side surface (10) facing each other. The first external electrode (3) is disposed on the first side surface (7), and the second external electrode (4) is disposed on the second side surface (8). The first electrode film (38) includes a first portion (45) and a pair of second portions (46). The first portion (45) overlaps the first external electrode (3) in the plan view and extends along the first side surface (7) of the substrate (2). The pair of second portions (46) extend from an end portion and another end portion of the first base portion (45) of the first electrode film (38) along the third side surface (9) and the fourth side surface (10) of the substrate (2), respectively. The second electrode film (39) includes a third portion (49) and a fourth portion (50). The third portion (49) overlaps the second external electrode (4) in the plan view. The fourth portion (50) extends from the third portion (49) of the second electrode film (39) toward the first external electrode (3) and disposed in a region between the pair of second portions (46) of the first electrode film (38).

Note 1-10

In the chip part (1) according to note 1-9, the first electrode film (38) includes a first capacitor contact portion (40). The first capacitor contact portion (4) is formed continuously along the first portion (45) of the first electrode film (38) and the pair of second portions (46) of the first electrode film (38) and is connected to the first contact region (63).

Note 1-11

In the chip part (1) according to note 1-9 to note 1-10, the second electrode film (39) includes a second capacitor contact portion (42). The second capacitor contact portion 942) is formed in a shape substantially covering an entirety of the capacitor portion (32) in the plan view and is connected to the second contact region (69).

Note 1-12

In the chip part (1) according to any of note 1-9 to note 1-11, the substrate (2) includes a semiconductor substrate (2). A base region (110) of a first conductivity type is formed on the first main surface (5) of the semiconductor substrate (2) and overlapping the first external electrode (3) and the second external electrode (4) in the plan view. The chip part (1) further includes a first diode (88) and a second diode (89). The first diode (88) includes an impurity region (111) of a second conductivity type formed in the base region (110) below the first external electrode (3) and connected to the first electrode film (38). The second diode (89) includes an impurity region (112) of the second conductivity type formed in the base region (110) below the second external electrode (4) and connected to the second electrode film (39).

According to the configuration, the chip part (1) is provided with an ESD protection function by using the first diode (88) and the second diode (89).

Note 1-13

In the chip part (1) according to note 1-12, the first diode (88) includes a plurality of diodes (88) arranged along the first side surface (7) of the substrate (2) in the plan view. The second diode (89) includes a plurality of diodes (89) arranged along the second side surface (8) of the substrate (2) in the plan view.

Note 1-14

In the chip part (1) according to any of note 1-8 to note 1-13, the capacitive film (35) includes a covering portion (68). The covered portion (68) is drawn out to further out of the capacitor portion (32), covers the first contact region (63) and surrounds the capacitor portion (32). The first contact region (63) and the covering portion (68), in the plan view, are drawn out to further out of an edge (72) of the upper electrode (36) and have a common edge (71) located outside the edge (72) of the upper electrode (36).

According to the configuration, the edge (71) of the lower electrode (34) and the edge (72) of the upper electrode (36) are be separated. The lower electrode (34) between the edge (72) of the upper electrode (36) and the edge (71) of the lower electrode (34) is covered by the capacitive film (35) (covering portion (68)). Thus, short-circuit between the lower electrode (34) and the upper electrode (36) can be prevented, thereby providing the chip part (1) having outstanding insulation reliability.

Note 1-15

A chip part (201) includes:

a semiconductor substrate (202), having a first main surface (205) and a second main surface (206) opposite to the first main surface (205); a capacitor portion (213), formed on the first main surface (205) of the semiconductor substrate (202) when viewed from a plan view and along a normal direction (n) of the first main surface (205), wherein the capacitor portion (213) includes a plurality of wall portions (85) having a lengthwise direction and separated from each other by a trench (107) formed on the first main surface (205);

a substrate body portion (54), disposed around the capacitor portion (213) by a portion of the substrate (202), and connected to one between one end portion (100) and one other end portion (101) of each of the wall portions (85) in the lengthwise direction;

a lower electrode (209), disposed by at least a portion of the semiconductor substrate (202) including the wall portions (85);

a capacitive film (214), disposed along top surfaces (114) and side surfaces (115) of the wall portions (85); and an upper electrode (215), disposed on the capacitive film (214), wherein the wall portions (85) are formed by a plurality of pillar units (90);

each of the plurality of pillar units (90) includes a central portion (91) and three protruding portions (92) extending from the central portion (91) to three different directions in the plan view, and the plurality of wall portions (85) are formed by connecting the three protruding portions (92) of the adjacent pillar units (90); and the capacitor portion (213), in the plan view, includes a first capacitor portion (321) including the plurality of wall portions (85) having the lengthwise direction as a first lengthwise direction (D1), and a second capacitor portion (322) including the plurality of wall portions (85) having the lengthwise direction as a second lengthwise direction (D2) crossing the first lengthwise direction (D1).

According to the configuration, the wall portions (85) disposed at the semiconductor substrate (202) are formed by the plurality of pillar units (90). Each of the plurality of pillar units (90) includes the central portion (91), and three protruding portions (92) extending from the central portion (91) to three different directions in the plan view. Accordingly, compared to when the wall portions (85) are formed by connecting pillars such as quadrilateral pillars, the surface area of the wall portions (85) can be increased. Moreover, the capacitor portion (213) is formed by imitating the surfaces of the wall portions (85). Thus, the capacitance of the capacitor portion (213) is not limited by the plane size of the semiconductor substrate (202), and a large capacitance can be realized by increasing the height of the wall portions (85). That is to say, even if the plane size of the semiconductor substrate (202) is smaller, it is ensured that the capacitor portion (213) has a larger capacitance.

In addition, if the wall portions (85) are formed by connecting the plurality of pillar units (90), the stability achieved is better than that of pillar units separated from each other. Further, at least one between the one end portion (100) and the one other end portion (101) of each wall portion (85) is connected to the substrate body portion (54) around the wall portion (85). Thus, the wall portions (85) can be cantilevered at least from the side and therefore can be reinforced to withstand lateral forces applied to the wall portions (85). As a result, even if the height of the wall portions (85) is increased, the stability of the wall portions (85) can still be maintained, thereby enhancing component reliability.

In addition, the capacitor portion (213) includes the first capacitor portion (321) and the second capacitor portion (322) having lengthwise directions different from each other. Thus, the direction of stress generated in the semiconductor substrate (202) due to forming of the wall portions (85) can be dispersed into a plurality of directions. As a result, warping of the semiconductor substrate (202) can be inhibited to thereby enhance strength. Therefore, the chip part (201) having a capacitor structure with mechanical strength and outstanding reliability can be provided.

Note 1-16

The chip part (201) according to note 1-15 includes:

a first external electrode (203), disposed on the first main surface (206) of the semiconductor substrate (202) and connected to the lower electrode (219); and a second electrode (204), disposed on the first main surface (205) of the semiconductor substrate (202) and electrically connected to the upper electrode (215).

According to the configuration, for example, the chip part (201) can be bonded on the semiconductor substrate (202) and bonded to the second external electrode (204) by a lead wire for further use.

Note 1-17

In the chip part (201) according to note 1-16, the second external electrode (204) is formed in a shape substantially covering an entirety of the capacitor portion (213) in the plan view.

Note 1-18

In the chip part (201) according to note 1-16 or note 1-17, the capacitor portion (213) includes one of the first capacitor portion (321) and one of the second capacitor portion (322), and the first capacitor portion (321) and the second capacitor portion (322) are disposed adjacent to each other.

Note 1-19

In the chip part (201) according to note 1-16 or note 1-17, the capacitor portion (213) includes a pair of the first capacitor portion (321) and a pair of the second capacitor portion (322), and the pair of first capacitor portions (321) and the pair of second capacitor portions (322) are alternately arranged in the plan view.

Note 1-20

In the chip part (201) according to any of note 1-15 to note 1-19, the first lengthwise direction (D1) and the second lengthwise direction (D2) are directions orthogonal to each other.

According to the configuration, the first lengthwise direction (D1) of the wall portions (85) of the first capacitor portion (321) and the second lengthwise direction (D2) of the wall portions (85) of the second capacitor portion (322) are directions orthogonal to each other. Thus, the stress in the first capacitor portion (321) and the stress in the second capacitor portion (322) are applied in directions that cancel out each other, further inhibiting warping of the semiconductor substrate (202).

Note 2-1

A chip part (1) includes:

a substrate (2), having a first main surface (5) and a second main surface (6) opposite to the first main surface (5);

a first external electrode (3) and a second external electrode (4), disposed on the first main surface (5) of the semiconductor substrate (2) and separated from each other;

a capacitor portion (32), disposed on the first main surface (5) of the substrate (2) when viewed from a plan view and along a normal direction (n) of the first main surface (5), and at least disposed between the first external electrode (3) and the second external electrode (4), wherein the capacitor portion (32) includes a plurality of wall portions (85) having a lengthwise direction and separated from each other by a trench (107) formed on the first main surface (5);

a frame portion (54), disposed around the capacitor portion (32) by a portion of the substrate (2), and surrounding the capacitor portion (32);

a lower electrode (34), disposed along top surfaces (114) and side surfaces (115) of the wall portions (85), and including a drawer portion (63) drawn out to the first main surface (5) in the frame portion (54);

a capacitive film (35), disposed on the lower electrode (34) along the top surfaces (114) and the side surfaces (115) of the wall portions (85);

an upper electrode (36), disposed on the capacitive film (35);

a first electrode film (39), electrically connecting the first external electrode (3) to the lower electrode (34); and a second electrode film (39), electrically connecting the second external electrode (4) to the upper electrode (36);

wherein the drawer portion (63) includes a first portion (64) disposed in a region between the first external electrode (3) and the second external electrode (4), the first electrode film (38) includes a first lower contact portion (74) connected to the first portion (64), the wall portions (85) are formed by a plurality of pillar units (90), each of the plurality of pillar units (90) includes a central portion (91) and three protruding portions (92) extending from the central portion (91) to three different directions in the plan view, and the plurality of wall portions (85) are formed by connecting the three protruding portions (92) of the adjacent pillar units (90).

According to the configuration, the wall portions (85) disposed at the substrate (2) are formed by the plurality of pillar units (90). Each of the plurality of pillar units (90) includes the central portion (91), and three protruding portions (92) extending from the central portion (91) to three different directions in the plan view. Accordingly, compared to when the wall portions (85) are formed by connecting pillars such as quadrilateral pillars, the surface area of the wall portions (85) can be increased. Moreover, the capacitor portion (32) is formed by imitating the surfaces of the wall portions (85). Thus, the capacitance of the capacitor portion (32) is not limited by the plane size of the substrate (2), and a large capacitance can be realized by increasing the height of the wall portions (85). That is to say, even if the plane size of the substrate (2) is smaller, it is ensured that the capacitor portion (32) has a larger capacitance.

In addition, the first electrode film (38) is connected to the first portion (64) of the lower electrode (34) drawn to the region between the first external electrode (3) and the second external electrode (4). Thus, the first lower contact portion (74) can be effectively disposed in the region between the first external electrode (3) and the second external electrode (4). As a result, the contact area between the first electrode film (38) and the lower electrode (34) is increased, hence providing the chip part (1) with outstanding electrical characteristics.

Note 2-2

In the chip part (1) according to note 2-1, the drawer portion (63) includes a second portion (65) disposed in a lower region of the first external electrode (3). The first electrode film (38) includes a second lower contact portion (75) connected to the second portion (65).

According to the configuration, the contact area can be further included by the connecting the second lower contact portion (75) to the first electrode film (38) and the lower electrode (34).

Note 2-3

In the chip part (1) according to note 2-2, the substrate (2) forms a quadrilateral surrounding the first main surface (5) in the plan view. The quadrilateral has a pair of a first side surface (7) and a second side surface (8) facing each other and a pair of a third side surface (9) and a fourth side surface (10) facing each other. The first external electrode (3) is disposed on the first side surface (7), and the second external electrode (4) is disposed on the second side surface (8). The first portion (64) includes a pair of first portions (64) drawn from the capacitor portion (32) to two sides toward the third side surface (9) and the fourth side surface (10). The first lower contact portion (74) includes a pair of strip-shaped first lower contact portions (74) disposed on each of the pair of first portions (64) and extending along the third side surface (9) and the fourth side surface (10). The second lower contact portion (75) includes a strip-shaped second lower contact portion (75) extending along the first side surface (7).

According to the configuration, the first electrode film (38) can be connected to the lower electrode (34) on at least three sides around the capacitor portion (32).

Note 2-4

In the chip part (1) according to note 2-3, the pair of lower contact portions (74) are integrally formed with the second lower contact portion (75), and continuously extend from one end portion (76) and one other end portion (77) in a lengthwise direction of the second lower contact portion (75) toward the second external electrode (4).

Note 2-5

In the chip part (1) according to any of note 2-2 to note 2-4, the second electrode film (39) includes: a second base (49), overlapping the second external electrode (4) in the plan view and connected to the second external electrode (4); and a second extending portion (50), having a step (53) with respect to a periphery (52) of the second base portion (49) and extending from the second base portion (49) toward the first external electrode (3); the first electrode film (38) includes: a first base portion (45), overlapping the first external electrode (3) in the plan view and connected to the first external electrode (3) and the second lower contact portion (75), and a first extending portion (46), extending from the first base portion (45) into the step (53) and connected to the first lower contact portion (74).

Note 2-6

In the chip part (I) according to any of note 2-2 to note 2-5, the drawer portion (63) includes a third portion (66) disposed on a side opposite to the first external electrode, the first electrode film (38) includes a third lower contact portion (149) connected to the third portion (66), and the first electrode film (38) is connected to the lower electrode (34) by an loop-like contact portion (74), the loop-like contact portion (74) is integrally formed by the first lower contact portion (74), the second lower contact portion (75) and the third lower contact portion (149) to surround an entirety of the capacitor portion (32).

According to the configuration, the first electrode film (38) can be connected to the lower electrode (34) at the entire periphery of the capacitor portion (32).

Note 2-7

The chip part (1) according to note 2-6 further includes:

a grid portion (151), dividing the capacitor portion (32) into a plurality of parts in an inner region of the frame portion (54) in the plan view;

wherein the lower electrode (34) further includes a second drawer portion (156) drawn out to the first main surface (5) in the grid portion (151), and the first electrode film (38) further includes a grid contact portion (157) connected to the second drawer portion (156) and integrally formed with the annular contact portion (74).

According to the configuration, in addition to connecting the first electrode film (38) to the lower electrode (34) at the entire periphery of the capacitor portion (32), the first electrode film (38) can also be connected to the lower electrode (34) at the grid portion (151).

Note 2-8

The chip part (1) according to any of note 2-2 to note 2-5 further includes a linear portion (144) extending linearly from the lower region of the first external electrode (3) toward the second external electrode (4) in the plan view, wherein the lower electrode (34) further includes a third drawer portion (147) drawn out to the first main surface (5) at the linear portion (144), and the first electrode film (38) further includes a linear contact portion (148) connected to the third drawer portion (147) and integrally formed with the second lower contact portion (75).

According to the configuration, in addition to connecting the first electrode film (38) to the lower electrode (34) on at least three sides around the capacitor portion (32), the first electrode film (38) can also be connected to the lower electrode (34) at the linear portion (144).

Note 2-9

In the chip part (1) according to any of note 2-1 to note 2-8, the upper electrode (36) includes a flat portion (117) disposed along the first main surface (5) of the substrate (2) outside the trench (107) and having a shape covering the capacitor portion (32) in the plan view, and the second electrode film (39) includes an upper contact portion (42) connected to the flat portion (117).

Note 2-10

In the chip part (1) according to note 2-9, the upper contact portion (42) is formed in a shape substantially covering an entirety of the capacitor portion (32) in the plan view.

According to the configuration, the upper contact portion (42) substantially covers the entirety of the capacitor portion (32), and thus the contact area between the second electrode film (39) and the upper electrode (36) can be increased.

Note 2-11

A chip part (1) includes:

a substrate (2), having a first main surface (5) and a second main surface (6) opposite to the first main surface (5), wherein when viewed from a plan view and along a normal direction (n) of the first main surface (5), the substrate (2) forms a quadrilateral surrounding the first main surface (5), the quadrilateral has a pair of a first side surface (7) and a second side surface (8) facing each other in a first direction (X) and a pair of a third side surface (9) and a fourth side surface (10) facing each other in a second direction (Y) crossing the first direction (X);

a first external electrode (3) and a second external electrode (4), disposed on the first main surface (5) of the substrate (2) and separated from each other in the first direction (X);

a capacitor portion (32), disposed on the first main surface (5) in the plan view, wherein the capacitor portion (32) includes a plurality of wall portions (85) having a lengthwise direction and separated from each other by a trench (107) formed on the first main surface (5), and the capacitor portion (32) is disposed at least between the first external electrode (3) and the second external electrode (4);

a lower electrode (34), including a first body portion (62) disposed along top surfaces (114) and side surfaces (115) of the plurality of wall portions (85), and a first peripheral portion (63) integrally drawn out around the capacitor portion (32) from the first body portion (62);

a capacitive film (35), disposed on the lower electrode (34) along the top surfaces (114) and the side surfaces (115) of the wall portions (85);

an upper electrode (36), disposed on the capacitive film (35);

a first electrode film (38), including a first base portion (45) disposed below the first external electrode (3), and a pair of first extending portions (46) branching from the first base portion (45) and extending on both sides of the capacitor portion (32) in the first direction (X), wherein the first base portion (45) and the pair of first extending portions (46) are connected to the first peripheral portion (63); and a second electrode film (39), including a second base portion (49) disposed below the second external electrode (4), and a second extending portion (50) extending from the second base portion (49) to a region between the pair of first extending portions (46), wherein at least the second extending portion (50) is connected to the upper electrode (36);

wherein the wall portions (85) are formed by a plurality of pillar units (90), each of the plurality of pillar units (90) includes a central portion (91) and three protruding portions (92) extending from the central portion (91) to three different directions in the plan view, and the plurality of wall portions (85) are formed by connecting the three protruding portions (92) of the adjacent pillar units (90).

According to the configuration, the wall portions (85) disposed at the substrate (2) are formed by the plurality of pillar units (90). Each of the plurality of pillar units (90) includes the central portion (91), and three protruding portions (92) extending from the central portion (91) to three different directions in the plan view. Accordingly, compared to when the wall portions (85) are formed by connecting pillars such as quadrilateral pillars, the surface area of the wall portions (85) can be increased. Moreover, the capacitor portion (32) is formed by imitating the surfaces of the wall portions (85). Thus, the capacitance of the capacitor portion (32) is not limited by the plane size of the substrate (2), and a large capacitance can be realized by increasing the height of the wall portions (85). That is to say, even if the plane size of the substrate (2) is smaller, it is ensured that the capacitor portion (32) has a larger capacitance.

In addition, the first electrode film (38) is connected to the first peripheral portion (63) of the lower electrode (34). Thus, the first lower contact portion (74) can be effectively arranged around the capacitor portion (32), and the first electrode film (38) can be connected to the lower electrode (34) on at least three sides around the capacitor portion (32). As a result, the contact area between the first electrode film (38) and the lower electrode (34) is increased, hence providing the chip part (1) with outstanding electrical characteristics.

Note 2-12

In the chip part (1) according to note 2-11, the upper electrode (36) includes a flat portion (117) disposed along the first main surface (5) of the substrate (2) outside the trench (107) and having a shape covering the capacitor portion (32) in the plan view, and the second extending portion (50) of the second electrode film (39) is connected to the flat portion (117).

Note 2-13

In the chip part (1) according to note 2-12, the second extending portion (50) of the second electrode film (39) is substantially disposed over an entire region (48) between the pair of first extending portions (46) in the plan view.

According to the configuration, the second electrode film (39) can be connected to the upper electrode (36) in the region substantially covering the entirety of the capacitor portion (32), and thus the contact area between the second electrode film (39) and the upper electrode (36) is increased.

Note 2-14

In the chip part (1) according to note 2-11 to note 2-13, the capacitive film (35) includes a second body portion (67) disposed in the capacitor portion (32), and a second peripheral portion (68) integrally drawn out from the second body portion (67) to the first peripheral portion (63), and a first capacitor contact hole (37) is formed in the second peripheral portion (68) to connect the first electrode film (38) and the lower electrode (34).

Note 2-15

In the chip part (1) according to note 2-14, the first peripheral portion (63) of the lower electrode (34) and the second peripheral portion (68) of the capacitive film (35) are drawn out to outside of an edge (72) of the upper electrode (36) in the plan view, and have a common edge (71) located outside the edge (72) of the upper electrode (36).

According to the configuration, the edge (71) of the lower electrode (34) and the edge (72) of the upper electrode (36) can be separated, and the lower electrode (34) between the edge (72) of the upper electrode (36) and the edge (71) of the lower electrode (34) is covered by the capacitive film (35). Thus, short-circuit between the lower electrode (34) and the upper electrode (36) can be prevented, thereby providing the chip part (1) having outstanding insulation reliability.

Note 2-16

In the chip part (1) according to any of note 2-11 to 2-15, the capacitor portion (32) includes a first overlapping portion (55) overlapping the first external electrode (3) in the plan view, a second overlapping portion (56) overlapping the second external electrode (4) in the plan view, and a center portion (57) between the first external electrode (3) and the second external electrode (4).

According to the configuration, the capacitor portion (32) can be disposed in lower regions of the first external electrode (3) and the second external electrode (4) to increase the capacitance of the capacitor portion (32).

Note 2-17

In the chip part (1) according to any of note 2-11 to note 2-16, the substrate (2) includes a semiconductor substrate (2). A base region (110) of a first conductivity type is formed on the first main surface (5) of the semiconductor substrate (2) and overlapping the first external electrode (3) and the second external electrode (4) in the plan view. The chip part (1) further includes a first diode (88) and a second diode (89). The first diode (88) includes an impurity region (111) of a second conductivity type formed in the base region (110) below the first external electrode (3) and connected to the first electrode film (38). The second diode (89) includes an impurity region (112) of the second conductivity type formed in the base region (110) below the second external electrode (4) and connected to the second electrode film (39).

According to the configuration, the chip part (1) is provided with an ESD protection function by using the first diode (88) and the second diode (89).

Note 2-18

In the chip part (1) according to note 2-17, the first diode (88) is included in a plurality diodes (88) arranged along the second direction (Y) in the plan view, and the second diode (89) is included a the plurality diodes (89) arranged along the second direction (Y) in the plan view.

Note 2-19

In the chip part (1) according to any of note 2-1 to note 2-18, the capacitor portion (32), in the plan view, includes a first capacitor portion (321) including the plurality of wall portions (85) having the lengthwise direction as a first lengthwise direction (D1), and a second capacitor portion (322) including the plurality of wall portions (85) having the lengthwise direction as a second lengthwise direction (D2) crossing the first lengthwise direction (D1).

According to the configuration, the capacitor portion (32) includes the first capacitor portion (321) and the second capacitor portion (322) having lengthwise directions different from each other. Thus, the direction of stress generated in the substrate (2) due to forming of the wall portions (85) can be dispersed into a plurality of directions. As a result, warping of the substrate (2) can be inhibited to thereby enhance strength. Therefore, the chip part (1) having a capacitor structure with mechanical strength and outstanding reliability can be provided.

Note 2-20

In the chip part (1) according to note 2-19, the first lengthwise direction (D1) and the second lengthwise direction (D2) are directions orthogonal to each other, and the chip part (1) includes one of the first capacitor portion (321) and one of the second capacitor portion (322), and the first capacitor portion (321) and the second capacitor portion (322) are disposed adjacent to each other.

According to the configuration, the first lengthwise direction (D1) of the wall portions (85) of the first capacitor portion (321) and the second lengthwise direction (D2) of the wall portions (85) of the second capacitor portion (322) are directions orthogonal to each other. Thus, the stress in the first capacitor portion (321) and the stress in the second capacitor portion (322) are applied in directions that cancel out each other, further inhibiting warping of the semiconductor substrate (2).

Note 3-1

A chip part (1) includes:
- a substrate (2), having a first main surface (5) and a second main surface (6) opposite to the first main surface (5);
- a first external electrode (3) and a second external electrode (4), disposed on the first main surface (5) of the substrate (2) and separated from each other;
- a capacitor portion (32), disposed on the first main surface (5) of the substrate (2) when viewed from a plan view and along a normal direction (n) of the first main surface (5), and at least disposed between the first external electrode (3) and the second external electrode (4), wherein the capacitor portion (32) includes a plurality of wall portions (85) having a lengthwise direction and separated from each other by a trench (107) formed on the first main surface (5);
- a lower electrode (34), including a first body portion (62) disposed along top surfaces (114) and side surfaces (115) of the plurality of wall portions (85), and a first peripheral portion (63) integrally drawn out around the capacitor portion (32) from the first body portion (62);
- the capacitive film (35), disposed along top surfaces (114) and side surfaces (115) of the wall portions (85), including a second body portion (67) disposed in the capacitor portion (32), and a second peripheral portion (68) integrally drawn out from the second body portion (67) to the first peripheral portion (63);
- an upper electrode (36), disposed on the capacitive film (35);
- a first electrode film (39), electrically connecting the first external electrode (3) to the lower electrode (34); and
- a second electrode film (39), electrically connecting the second external electrode (4) to the upper electrode (36);
- wherein the first peripheral portion (63) and the second peripheral portion (68) are drawn out to further out of an edge (72) of the upper electrode (36) in the plan view, and have a common edge (71) located further out of the edge (72) of the upper electrode (36); and
- the wall portions (85) are formed by a plurality of pillar units (90), each of the plurality of pillar units (90) includes a central portion (91) and three protruding portions (92) extending from the central portion (91) to three different directions in the plan view, and the plurality of wall portions (85) are formed by connecting the three protruding portions (92) of the adjacent pillar units (90).

According to the configuration, the wall portions (85) disposed at the substrate (2) are formed by the plurality of pillar units (90). Each of the plurality of pillar units (90) includes the central portion (91), and three protruding portions (92) extending from the central portion (91) to three different directions in the plan view. Accordingly, compared to when the wall portions (85) are formed by connecting pillars such as quadrilateral pillars, the surface area of the wall portions (85) can be increased. Moreover, the capacitor portion (32) is formed by imitating the surfaces of the wall portions (85). Thus, the capacitance of the capacitor portion (32) is not limited by the plane size of the substrate (2), and a large capacitance can be realized by increasing the height of the wall portions (85). That is to say, even if the plane size of the substrate (2) is smaller, it is ensured that the capacitor portion (32) has a larger capacitance.

In addition, the edge (71) of the lower electrode (34) and the edge (72) of the upper electrode (36) can be separated, and the lower electrode (34) between the edge (72) of the upper electrode (36) and the edge (71) of the lower electrode (34) is covered by the capacitive film (35). Thus, short-circuit between the lower electrode (34) and the upper electrode (36) can be prevented, thereby providing the chip part (1) having outstanding insulation reliability.

Note 3-2

In the chip part (1) according to note 3-1, the second peripheral portion (68) of the capacitive film (35) is formed in an annular shape and surrounds the capacitor portion (32) in the plan view.

Note 3-3

In the chip part (1) according to note 1-1 to note 1-2, the first electrode film (38) includes a lower contact portion (40) formed as an annular shape and surrounding the capacitor portion (32), partially open on one side of the second external electrode (4) in the plan view and connected to the first peripheral portion (63) of the lower electrode (34); and the second electrode film (39) includes an upper contact portion (42) connected to the upper electrode (36) in an inner region of the lower contact portion (40).

According to the configuration, the first electrode film (38) has the lower contact portion (40) around the capacitive portion (32), and the second electrode film (39) has the upper contact portion (42) in the inner region of the lower contact portion (40). Thus, the lower contact region (40) and the upper contact region (42) can be effectively arranged on the first main surface (5) of the substrate (2). As a result, the area of the lower contact portion (40) and the area of the upper contact portion (42) are respectively increased, hence providing the chip part (1) with outstanding electrical characteristics.

Note 3-4

In the chip part (1) according to any of note 3-1 to note 3-3, a functional component (88, 89) other than a capacitor is disposed in at least one overlapping region of the first external electrode (3) and the second external electrode (4) on the first main surface (5) of the substrate (2) in the plan view, and the functional component is electrically connected to the first external electrode (3) and the second electrode (4) as two terminals.

Note 3-5

In the chip part (1) according to note 3-4, the substrate (2) includes a semiconductor substrate (2). The functional component (88, 89) includes a diode (88, 89) having a base region (110) of a first conductivity type formed on the first main surface (5) of the semiconductor substrate (2). An impurity region of a second conductivity type is formed in the base region (110).

According to the configuration, the chip part (1) is provided with an ESD protection function by using the diode (88, 89).

Note 3-6

In the chip part (1) according to note 3-5, the diode (88, 89) includes a first diode (88) overlapping the first external electrode (3) in the plan view and a second diode (89) overlapping the second external electrode (4) in the plan view, and the first diode (88) and the second diode (89) form a bidirectional diode connected by the common base region (110).

Note 3-7

In the chip part (1) according to any of note 3-4 to 3-6, the capacitor portion (32) includes a first overlapping portion (55) overlapping the first external electrode (3) in the plan view, a second overlapping portion (56) overlapping the second external electrode (4) in the plan view and a center portion (57) between the first external electrode (3) and the second external electrode (4). The functional component (88, 89) is disposed at a position away from the capacitor portion (32) in a direction opposite to the first external electrode (3) and the second external electrode (4).

According to the configuration, the capacitor portion (32) can be disposed in the lower regions of the first external electrode (3) and the second external electrode (4), thereby increasing the capacitance of the capacitor portion (32). In addition, by separating the capacitor portion (32) and the functional component (88, 89), electrical and mechanical influences between the capacitor portion (32) and the functional component (88, 89) can be alleviated.

Note 3-8

In the chip part (1) according to any of note 3-1 to 3-3, the substrate (2) includes a semiconductor substrate (2) formed as a quadrilateral first conductivity type semiconductor substrate (2) surrounding the first main surface (5) in the plan view. The quadrilateral first conductivity type semiconductor substrate (2) having a pair of a first side surface (7) and a second side surface (8) facing each other and a pair of a third side surface (9) and a fourth side surface (10) facing each other. The first external electrode (3) is disposed on the first side surface (7), and the second external electrode (4) is disposed on the second side surface (8). The first electrode film (38) includes a lower contact portion (40) connected to the first peripheral portion (63) in a lower region of the first external electrode (3), and the second electrode film (39) includes an upper contact portion (42) connected to the upper electrode (36). The chip part (1) includes a first diode (88) and a second diode (89). The first diode (88) includes an impurity region (111) of a second conductivity type and formed in the semiconductor substrate (2) between the lower contact portion (40) and the first side surface (7) in the plan view. The second diode (89) includes an impurity region (112) of the second conductivity type and formed in the semiconductor substrate (2) between the upper contact portion (42) and the second side surface (8) in the plan view. The first electrode film (38) includes a first diode contact portion (41) connected to the first diode (88), and the second electrode film (39) includes a second diode contact portion (43) connected to the second diode (89).

Note 3-9

In the chip part (1) according to note 3-8, the first diode (88) includes a plurality of first diodes (88) arranged along the first side surface (7) of the semiconductor substrate (2).

Note 3-10

In the chip part (1) according to note 3-8 or note 3-9, the second diode (89) includes a plurality of second diodes (89) arranged along the second side surface (8) of the semiconductor substrate (2).

Note 3-11

In the chip part (1) according to any of note 3-8 to note 3-10, the first external electrode (3) forms a rectangle having a lengthwise direction along a direction of the first side surface (7) and having a first long side (15), a second long side (16), a first short side (17) and a second short side (18) in the plan view, the first long side (15) is a long side close to the first side surface (7) and an opposite long side is the second long side; the first diode (88) is disposed overlapping a first outer peripheral edge portion (58) along the first long side (15) of the first external electrode (3).

Note 3-12

In the chip part (1) according to 3-11, the second external electrode (3) forms a rectangle having a lengthwise direction along a direction of the second side surface (8) of the semiconductor substrate (2) and having a third long side (20), a fourth long side (21), a third short side (22) and a fourth short side (23) in the plan view. The third long side (20) is a long side close to the second side surface (8) and an opposite long side is the fourth long side (21). The second diode (89) is disposed overlapping a second outer peripheral edge portion (60) along the third long side (20) of the second external electrode (4).

Note 3-13

In the chip part (1) according to note 3-12, the first external electrode (3) includes a first inner peripheral portion (59) along the second long side (16) and on a side opposite to the first outer peripheral portion (58), the second external electrode (4) includes a second inner peripheral portion (61) along the fourth long side (21) and on a side opposite to the second outer peripheral portion (60), and the capacitor portion (32) includes the first peripheral portion (55) overlapping the first inner peripheral portion (59) and the second peripheral portion (56) overlapping the second inner peripheral portion (61) in the plan view.

Note 3-14

In the chip part (1) according to any of note 3-8 to note 3-13, the first electrode film (38) includes: a first base portion (45), disposed below the first external electrode (3) and including the first diode contact portion (41); and a pair of first extending portions (46), branched and extending from the first base portion (45) along two sides of the capacitor portion (32) in directions of the third side surface (9) and the fourth side surface (10).

According to the configuration, the first electrode film (38) can be connected to the lower electrode (34) on at least three sides around the capacitor portion (32).

Note 3-15

In the chip part (1) according to note 3-14, the second electrode film (39) includes: a second base portion (49), disposed below the second external electrode (39) and including the second diode contact portion (43); and a second extending portion (50), extending from the second base portion (49) to a region (48) between the pair of first extending portions (43) and including the upper contact portion (42).

Note 3-16

In the chip part (1) according to note 3-14 or note 3-15, the lower contact portion (40) includes: a pair of strip-shaped first lower contact portions (74), disposed on each of the pair of first extending portions (46), and extending along the third side surface (9) and the fourth side surface (10); and a strip-shaped second lower contact portion (75), extending at the first base portion (45) along the first side surface (7).

Note 3-17

In the chip part (1) according to note 3-16, the pair of lower contact portions (74) are integrally formed with the second lower contact portion (75), and continuously extend from one end portion (76) and another end portion (77) in a lengthwise direction of the second lower contact portion (75) toward the second external electrode (4).

Note 3-18

In the chip part (1) according to any of note 3-8 to note 3-17, the upper contact portion (42) is disposed to avoid a region overlapping with the first external electrode (3) in the plan view.

Note 3-19

In the chip part (1) according to any of note 3-1 to note 3-18, the capacitor portion (32), in the plan view, includes: a first capacitor portion (321), including the plurality of wall portions (85) having the lengthwise direction as a first lengthwise direction (D1); and a second capacitor portion (322), including the plurality of wall portions (85) having the lengthwise direction as a second lengthwise direction (D2) crossing the first lengthwise direction (D1).

According to the configuration, the capacitor portion (32) includes the first capacitor portion (321) and the second capacitor portion (322) having lengthwise directions different from each other. Thus, the direction of stress generated in the substrate (2) due to forming of the wall portions (85) can be dispersed into a plurality of directions. As a result, warping of the substrate (2) can be inhibited to thereby enhance strength. Therefore, the chip part (1) having a capacitor structure with mechanical strength and outstanding reliability can be provided.

Note 3-20

In the chip part (1) according to note 3-19, the first lengthwise direction (D1) and the second lengthwise direction (D2) are directions orthogonal to each other, and the chip part (1) includes one of the first capacitor portion (321) and one of the second capacitor portion (322) disposed adjacent to each other.

According to the configuration, the first lengthwise direction (D1) of the wall portions (85) of the first capacitor portion (321) and the second lengthwise direction (D2) of the wall portions (85) of the second capacitor portion (322) are directions orthogonal to each other. Thus, the stress in the first capacitor portion (321) and the stress in the second capacitor portion (322) are applied in directions that cancel out each other, further inhibiting warping of the semiconductor substrate (2).

The invention claimed is:

1. A chip part, comprising:

a substrate, having a first main surface and a second main surface opposite to the first main surface;

a first external electrode and a second external electrode, disposed on the first main surface of the substrate and separated from each other;

a capacitor portion, disposed on the first main surface of the substrate when viewed from a plan view and along a normal direction of the first main surface, wherein the capacitor portion includes a plurality of wall portions having a lengthwise direction and separated from each other by a trench formed on the first main surface, and the capacitor portion is disposed at least between the first external electrode and the second external electrode;

a frame portion, disposed around the capacitor portion by a portion of the substrate, wherein the frame portion surrounds the capacitor portion;

a lower electrode, disposed along top and side surfaces of the plurality of wall portions and including a drawer portion drawn out to the first main surface in the frame portion;

a capacitive film, disposed on the lower electrode along the top and side surfaces of the plurality of wall portions;

an upper electrode, disposed on the capacitive film;

a first electrode film, electrically connecting the first external electrode to the lower electrode; and a second electrode film, electrically connecting the second external electrode to the upper electrode, wherein the drawer portion includes a first portion disposed in a region between the first external electrode and the second external electrode, the first electrode film includes a first lower contact portion connected to the first portion, the plurality of wall portions are formed by a plurality of pillar units, each of the plurality of pillar units includes a central portion and three protruding portions extending from the central portion to three different directions in the plan view, and the plurality of wall portions are formed by connecting the three protruding portions of adjacent pillar units.

2. The chip part of claim 1, wherein
the drawer portion includes a second portion disposed in a lower region of the first external electrode, and
the first electrode film includes a second lower contact portion connected to the second portion.
3. The chip part of claim 2, wherein
the substrate forms a quadrilateral surrounding the first main surface in the plan view, the quadrilateral has a pair of a first side surface and a second side surface facing each other, and a pair of a third side surface and a fourth side surface facing each other,
the first external electrode is disposed on the first side surface,
the second external electrode is disposed on the second side surface,
the first portion includes a pair of first portions drawn out from the capacitor portion to both sides toward the third side surface and the fourth side surface,
the first lower contact portion includes a pair of strip-shaped first lower contact portions respectively disposed on each of the pair of first portions and extending along the third side surface and the fourth side surface, and
the second lower contact portion includes a strip-shaped second lower contact portion extending along the first side surface.
4. The chip part of claim 3, wherein the pair of first lower contact portions are integrally formed with the second lower contact portion and continuously extending from one lengthwise end and another lengthwise end of the second lower contact portion toward the second external electrode.
5. The chip part of claim 2, wherein
the second electrode film includes:
a second base portion, overlapping the second external electrode in the plan view and connected to the second external electrode; and
a second extending portion, having a step with respect to a periphery of the second base portion and extending from the second base portion toward the first external electrode, and
the first electrode film includes:
a first base portion, overlapping the first external electrode in the plan view and connected to the first external electrode and the second lower contact portion; and
a first extending portion, extending from the first base portion into the step and connected to the first lower contact portion.
6. The chip part of claim 2, wherein
the drawer portion includes a third portion disposed on a side opposite to the first external electrode,
the first electrode film includes a third lower contact portion connected to the third portion, and
the first electrode film is connected to the lower electrode by an annular contact portion, wherein the annular contact portion is integrally formed by the first lower contact portion, the second lower contact portion and the third lower contact portion to surround the entire capacitor portion.
7. The chip part of claim 6, further comprising:
a grid portion, dividing the capacitor portion into a plurality of parts in an inner region of the frame portion in the plan view, wherein
the lower electrode further includes a second drawer portion drawn out to the first main surface in the grid portion, and
the first electrode film further includes a grid contact portion connected to the second drawer portion and integrally formed with the annular contact portion.
8. The chip part of claim 2, further comprising:
a linear portion, extending linearly from the lower region of the first external electrode toward the second external electrode in the plan view,
the lower electrode further includes a third drawer portion drawn out to the first main surface at the linear portion, and
the first electrode film further includes a linear contact portion connected to the third drawer portion and integrally formed with the second lower contact portion.
9. The chip part of claim 1, wherein
the upper electrode includes a flat portion disposed along the first main surface of the substrate outside the trench and having a shape covering the capacitor portion in the plan view, and
the second electrode film includes an upper contact portion connected to the flat portion.
10. The chip part of claim 9, wherein the upper contact portion is formed in a shape substantially covering an entirety of the capacitor portion in the plan view.
11. A chip part, comprising:
a substrate, having a first main surface and a second main surface opposite to the first main surface, wherein when viewed from a plan view and along a normal direction of the first main surface, the substrate forms a quadrilateral surrounding the first main surface, the quadrilateral has a pair of a first side surface and a second side surface facing each other in a first direction and a pair of a third side surface and a fourth side surface facing each other in a second direction crossing the first direction;
a first external electrode and a second external electrode, disposed on the first main surface of the substrate and separated from each other in the first direction;
a capacitor portion, disposed on the first main surface in the plan view, wherein
the capacitor portion includes a plurality of wall portions having a lengthwise direction and separated from each other by a trench formed on the first main surface, and
the capacitor portion is disposed at least between the first external electrode and the second external electrode;
a lower electrode, including:
a first body portion, disposed along top and side surfaces of the plurality of wall portions; and
a first peripheral portion, integrally drawn out around the capacitor portion from the first body portion
a capacitive film, disposed on the lower electrode along the top and side surfaces of the plurality of wall portions;
an upper electrode, disposed on the capacitive film;
a first electrode film, including:
a first base portion, disposed below the first external electrode; and
a pair of first extending portions, branching from the first base portion and extending on both sides of the capacitor portion in the first direction, wherein the first base portion and the pair of first extending portions are connected to the first peripheral portion; and a second electrode film, including:

a second base portion, disposed below the second external electrode; and a second extending portion, extending from the second base portion to a region between the pair of first extending portions, wherein at least the second extending portion is connected to the upper electrode, wherein the plurality of wall portions are formed from a plurality of pillar units, each of the plurality of pillar units includes a central portion and three protruding portions extending from the central portion to three different directions in the plan view, and the plurality of wall portions are formed by connecting the three protruding portions of adjacent pillar units.

12. The chip part of claim 11, wherein the upper electrode includes a flat portion disposed along the first main surface of the substrate outside the trench and has a shape covering the capacitor portion in the plan view, and the second extending portion of the second electrode film is connected to the flat portion.

13. The chip part of claim 12, wherein the second extending portion of the second electrode film is substantially formed over an entire region between the pair of first extending portions in the plan view.

14. The chip part of claim 11, wherein the capacitive film includes:

a second body portion, disposed in the capacitor portion; and a second peripheral portion, integrally drawn out from the second body portion to the first peripheral portion, and a first capacitor contact hole is formed in the second peripheral portion for connecting the first electrode film and the lower electrode.

15. The chip part of claim 14, wherein the first peripheral portion of the lower electrode and the second peripheral portion of the capacitive film are drawn out to an edge of the upper electrode in the plan view and have a common edge located outside the edge of the upper electrode.

16. The chip part of claim 11, wherein the capacitor section includes:

a first overlapping portion, overlapping the first external electrode in the plan view;

a second overlapping portion, overlapping the second external electrode in the plan view; and a center portion, between the first external electrode and the second external electrode.

17. The chip part of claim 11, wherein the substrate includes a semiconductor substrate, a base region of first conductivity type is formed on the first main surface of the semiconductor substrate and overlapping the first external electrode and the second external electrode in the plan view, and the chip part further includes:

a first diode, including an impurity region of second conductivity type formed in the base region below the first external electrode and connected to the first electrode film; and a second diode, including another impurity region of second conductivity type formed in the base region below the second external electrode and connected to the second electrode film.

18. The chip part of claim 17, wherein the first diode includes a plurality of diodes arranged along the second direction in the plan view, and The second diode includes a plurality of diodes arranged along the second direction in the plan view.

19. The chip part of claim 1, wherein the capacitor portion, in the plan view, includes:

a first capacitor portion, including the plurality of wall portions having the lengthwise direction as a first lengthwise direction;

a second capacitor portion, including the plurality of wall portions having the lengthwise direction as a second lengthwise direction crossing the first lengthwise direction.

20. The chip part of claim 19, wherein the first lengthwise direction and the second lengthwise direction are orthogonal to each other, and the chip part includes the first capacitor portion and the second capacitor portion disposed adjacent to each other.

* * * * *